United States Patent
Shibui et al.

(10) Patent No.: US 9,575,410 B2
(45) Date of Patent: Feb. 21, 2017

(54) PHOTOSENSITIVE RESIN COMPOSITION, METHOD FOR PRODUCING HARDENED RELIEF PATTERN, SEMICONDUCTOR DEVICE AND DISPLAY DEVICE

(71) Applicant: ASAHI KASEI E-MATERIALS CORPORATION, Tokyo (JP)

(72) Inventors: Satoshi Shibui, Tokyo (JP); Tatsuya Hirata, Tokyo (JP); Takahiro Sasaki, Tokyo (JP); Taisuke Yamada, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 50 days.

(21) Appl. No.: 14/363,557

(22) PCT Filed: Dec. 6, 2012

(86) PCT No.: PCT/JP2012/081691
§ 371 (c)(1),
(2) Date: Jun. 6, 2014

(87) PCT Pub. No.: WO2013/085004
PCT Pub. Date: Jun. 13, 2013

(65) Prior Publication Data
US 2014/0349222 A1    Nov. 27, 2014

(30) Foreign Application Priority Data

Dec. 9, 2011 (JP) .................................. 2011-270661
Dec. 28, 2011 (JP) .................................. 2011-290126
Mar. 14, 2012 (JP) .................................. 2012-057990

(51) Int. Cl.
| | | |
|---|---|---|
| *G03F 7/038* | (2006.01) | |
| *G03F 7/039* | (2006.01) | |
| *G03F 7/004* | (2006.01) | |
| *C08L 65/00* | (2006.01) | |
| *G03F 7/023* | (2006.01) | |
| *C08G 8/22* | (2006.01) | |
| *C08G 16/02* | (2006.01) | |
| *C08L 61/12* | (2006.01) | |
| *G03F 7/022* | (2006.01) | |
| *C08G 61/12* | (2006.01) | |
| *G03F 7/30* | (2006.01) | |
| *C08G 61/02* | (2006.01) | |

(52) U.S. Cl.
CPC .............. *G03F 7/0384* (2013.01); *C08G 8/22* (2013.01); *C08G 16/0225* (2013.01); *C08G 61/127* (2013.01); *C08G 61/128* (2013.01); *C08L 61/12* (2013.01); *C08L 65/00* (2013.01); *G03F 7/0045* (2013.01); *G03F 7/022* (2013.01); *G03F 7/023* (2013.01); *G03F 7/0236* (2013.01); *G03F 7/0233* (2013.01); *G03F 7/0236* (2013.01); *G03F 7/038* (2013.01); *G03F 7/039* (2013.01); *G03F 7/0382* (2013.01); *G03F 7/0392* (2013.01); *G03F 7/30* (2013.01); *C08G 61/02* (2013.01); *C08G 2261/3424* (2013.01)

(58) Field of Classification Search
CPC ...... G03F 7/0045; G03F 7/038; G03F 7/0382; G03F 7/039; G03F 7/0392; G03F 7/022; G03F 7/023; G03F 7/0233; G03F 7/0236; G03F 7/30; G03F 7/0384; C08L 65/00; C08L 61/12; C08G 16/0225; C08G 61/02; C08G 61/127; C08G 8/22; C08G 2261/3424; C08G 61/128
USPC ........................ 430/18, 270.1, 325, 326, 330
See application file for complete search history.

(56) References Cited

U.S. PATENT DOCUMENTS

| | | |
|---|---|---|
| 4,642,282 A | 2/1987 | Stahlhofen |
| 2003/0054284 A1 | 3/2003 | Suzuki et al. |
| 2004/0096771 A1 | 5/2004 | Kashiwagi et al. |
| 2004/0126696 A1 | 7/2004 | Inomata |
| 2007/0172755 A1 | 7/2007 | Nakamura et al. |
| 2007/0190454 A1 | 8/2007 | Lee et al. |
| 2011/0081613 A1 | 4/2011 | Takeda et al. |

FOREIGN PATENT DOCUMENTS

| | | |
|---|---|---|
| JP | 60-021046 A | 2/1985 |
| JP | 2001-524695 A | 12/2001 |
| JP | 2002-169277 A | 6/2002 |
| JP | 2002-189290 A | 7/2002 |

(Continued)

OTHER PUBLICATIONS

International Search Report issued with respect to application PCT/JP2012/081691, mail date is Mar. 5, 2013.

(Continued)

*Primary Examiner* — John A McPherson
(74) *Attorney, Agent, or Firm* — Greenblum & Bernstein, P.L.C.

(57) ABSTRACT

Provided is a photosensitive resin composition which comprises: (A-1) a resin containing a structure represented by general formula (1); and (B) a photo-acid generating agent. In general formula (1), X, $R_1$ to $R_7$, $m_1$ to $m_4$, $n_1$, $n_2$, Y and W are each as defined in the description.

(1)

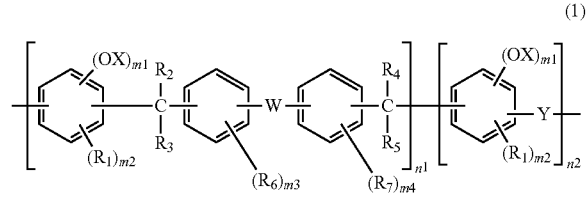

12 Claims, 9 Drawing Sheets

(56) References Cited

FOREIGN PATENT DOCUMENTS

| JP | 2003-215789 A | 7/2003 |
|---|---|---|
| JP | 3839840 B2 | 11/2006 |
| JP | 2008-292677 A | 12/2006 |
| JP | 2008-189708 A | 8/2008 |
| JP | 2009-222923 A | 2/2009 |
| JP | 2010-197887 A | 9/2010 |
| JP | 2012-172122 A | 9/2012 |
| TW | 200731008 A | 8/2007 |
| WO | 99/27418 A1 | 6/1999 |
| WO | 2007/007827 A1 | 1/2007 |

OTHER PUBLICATIONS

Written opinion of international searching authority issued with respect to application PCT/JP2012/081691, mail date is Mar. 5, 2013.

PHOTOSENSITIVE RESIN COMPOSITION, METHOD FOR PRODUCING HARDENED RELIEF PATTERN, SEMICONDUCTOR DEVICE AND DISPLAY DEVICE

TECHNICAL FIELD

The present invention relates to a photosensitive resin composition for use in the relief pattern formation, for example, of an insulating material in an electronic component and of a passivation film, a buffer coat film, an interlayer insulating film, etc., in a semiconductor device, a method for producing a cured relief pattern by using the composition, a semiconductor device, and a display device.

BACKGROUND ART

Conventionally, a polyimide resin or benzoxazole resin excellent in all of heat resistance, electric properties, mechanical properties, etc., is widely used for the surface protective film and interlayer insulating film employed in a semiconductor device. These resins exhibit low solubility in various solvents and therefore, are generally used as a composition after the resin in the form of a precursor prepared by ring-opening the cyclic structure is dissolved in a solvent. Accordingly, a step of ring-closing the precursor is required when using the resin. This ring-closing step is usually carried out by heat curing under heating at 300° C. or more.

However, in recent years, a semiconductor device inferior in the heat resistance compared with conventional products is being developed and in turn, lowering the heat curing temperature is required of the material for forming a surface protective film or an interlayer insulating film, as a result, the demand for heat curing at 300° C. or less, or furthermore, heat curing at 250° C. or less is increasing.

To meet such a requirement, Patent Document 1 has proposed a photosensitive resin composition excellent in the photosensitive performance, containing, as the base resin, a phenolic hydroxyl group-containing alkali-soluble resin that is widely used as the base resin in the resist field, and furthermore, containing a quinone diazide compound and a curing agent, and it is disclosed that this photosensitive resin composition is heat-cured by heating at a temperature of 100 to 250° C. for 30 minutes to 10 hours.

Patent Document 2 also proposes a photosensitive resin composition containing a novolak resin that uses a phenol compound having a benzene nucleus containing two or more hydroxyl groups and has a weight average molecular weight of 1,000 to 20,000, and a photosensitizing agent.

In addition, Patent Document 3 has proposed a reactive resin composition using a resin having, in the skeleton, a condensation product of a biphenyl compound with phenols, and using a photopolymerization initiator and/or a photoacid generator, which is a material excellent in electrical properties and usable for forming a liquid crystal alignment-controlling bump and/or a spacer or forming a liquid crystal alignment-controlling bump and a spacer at the same time, and it is disclosed that this reactive resin composition is heat-cured by heating at a temperature of 150 to 400° C. for 10 to 120 minutes.

RELATED ART

Patent Document

Patent Document 1: Japanese Unexamined Patent Publication (Kokai) No. 2003-215789

Patent Document 2: Japanese Patent No. 3,839,840
Patent Document 3: Japanese Unexamined Patent Publication (Kokai) No. 2008-292677

SUMMARY OF THE INVENTION

Problems to be Solved by the Invention

In the case of applying a resin as a surface protective film or an interlayer insulating film to a semiconductor device, elongation is an important film property. However, the film obtained by curing the composition described in Patent Document 1 has a problem of low elongation. Patent Document 2 is also silent on relief pattern formation with a film having a thickness necessary for a semiconductor protective film. In addition, the photosensitive resin composition described in Patent Document 2 has a problem that the elongation of cured film is low, the residual film ratio during heat curing is low and the cured pattern profile is bad.

Similarly to Patent Document 1, the film obtained by curing the composition of Patent Document 3 has been found to have a problem of low elongation.

Accordingly, an object of the present invention is to provide a photosensitive resin composition having sufficient alkali solubility, being curable at a temperature of 300° C. or less, ensuring excellent elongation of the cured film, enabling pattern formation with a thick film (about 10 m), allowing a high residual film ratio during curing, and giving a good cured relief pattern profile, a cured relief pattern forming method of forming a pattern by using the photosensitive resin, and a semiconductor device and a display device each having the cured relief pattern.

Means to Solve the Problems

As a result of intensive studies and many experiments by taking into account the problems in the conventional techniques, the present inventors have found that the above-described object can be solved by using a photosensitive resin composition comprising a copolymer having specific two kinds of repeating unit structures, or a resin mixture of resins consisting of these specific repeating unit structures; and a photoacid generator, and has accomplished the present invention, i.e., the present invention is as follows.

[1]
A photosensitive resin composition comprising (A-1) a resin containing a structure represented by following formula (1) and (B) a photoacid generator:

[Chem. 1]

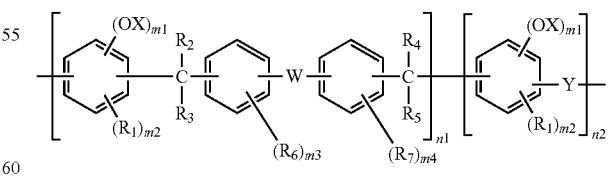

{in formula (1), each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group; each $m_1$ is independently an integer of 1 to 3, each $m_2$ is independently an integer of 0 to 2, and $2 \leq (m_1+m_2) \leq 4$; each of $m_3$ and $m_4$ is independently an integer of 0 to 4; each of $n_1$ and $n_2$ is independently an integer of 1 to 500, and $n_1/(n_1+n_2)$ is from 0.05 to 0.95 when $m_1$ is 2 or 3, and is from 0.35 to 0.95 when $m_1$ is 1; each $R_1$ is independently a monovalent group selected from the group consisting of a hydrocarbon group having a carbon number of 1 to 10, an alkoxy group having a carbon number of 1 to 10, a nitro group, a cyano group, and a group represented by following formula (5) or (6); when $m_2$ is 2, the plurality of $R_1$ may be the same as or different from each other; each of $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; each of $R_6$ and $R_7$ is independently a halogen atom, a hydroxyl group or a monovalent organic group; when $m_3$ is an integer of 2 to 4, the plurality of $R_6$ may be the same as or different from each other; when $m_4$ is an integer of 2 to 4, the plurality of $R_7$ may be the same as or different from each other; Y is a divalent organic group represented by following formula (3) or (4); W is a divalent group selected from the group consisting of a single bond, a chain aliphatic group having a carbon number of 1 to 10, a chain aliphatic group having a carbon number of 1 to 10, in which some hydrogen atoms or all hydrogen atoms are substituted with a fluorine atom, an alicyclic group having a carbon number of 3 to 20, an alicyclic group having a carbon number of 3 to 20, in which some hydrogen atoms or all hydrogen atoms are substituted with a fluorine atom, an alkylene oxide group having from 1 to 20 repeating units, and groups represented by following formula (2):

[Chem. 2]

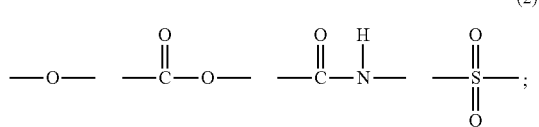
(2)

and the polymer structure may be a random structure or a block structure};

$$—CR_8R_9— \quad (3)$$

(in formula (3), each of $R_8$ and $R_9$ is independently a hydrogen atom, a monovalent organic group having a carbon number of 1 to 11, or a group containing a carboxyl group, a sulfonic acid group or a phenolic hydroxyl group);

[Chem. 3]

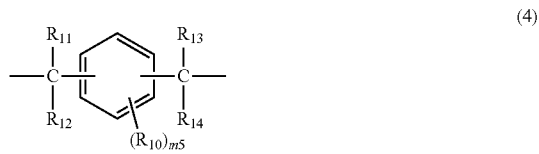
(4)

{in formula (4), each of $R_{11}$ to $R_{14}$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; $m_5$ is an integer of 1 to 4; when $m_5$ is 1, $R_{10}$ is a hydroxyl group, a carboxyl group or a sulfonic acid group, and when $m_5$ is an integer of 2 to 4, at least one $R_{10}$ is a hydroxyl group and the remaining $R_{10}$ are a halogen atom, a hydroxyl group, a monovalent organic group, a carboxyl group or a sulfonic acid group; and all $R_{10}$ may be the same or different};

[Chem. 4]

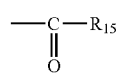
(5)

{in formula (5), $R_{15}$ is a monovalent group selected from the group consisting of a hydroxyl group, an aliphatic group having a carbon number of 1 to 12, an alicyclic group having a carbon number of 3 to 12, an aromatic group having a carbon number of 6 to 18, —$NH_2$, and groups represented by —NH—$R_{19}$, —N($R_{19}$)$_2$ and —O—$R_{19}$ (wherein $R_{19}$ is a monovalent group selected from an aliphatic group having a carbon number of 1 to 12, an alicyclic group having a carbon number of 3 to 12, and an aromatic group having a carbon number of 6 to 18)};

[Chem. 5]

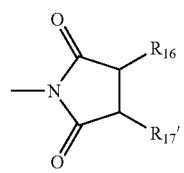
(6)

{in formula (6), each of $R_{16}$ and $R_{17}'$ is independently a monovalent group selected from the group consisting of a hydrogen atom, an aliphatic group having a carbon number of 1 to 12, an alicyclic group having a carbon number of 3 to 12, and an aromatic group having a carbon number of 6 to 18, and $R_{16}$ and $R_{17}'$ may form a ring}.

[2]

The photosensitive resin composition according to [1], wherein in formula (1), all X are a hydrogen atom.

[3]

A photosensitive resin composition comprising:

(A-2) a resin mixture including a resin containing a structure represented by following formula (7) and a resin containing a structure represented by following formula (8), and (B) a photoacid generator, wherein the weight ratio of the resin containing a structure represented by formula (7): the resin containing a structure represented by formula (8) is from 5:95 to 95:5:

[Chem. 6]

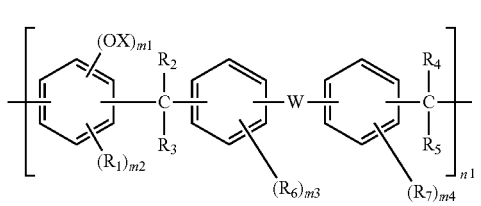
(7)

[Chem. 7]

(8)

{in formulae (7) and (8), each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group; each $m_1$ is independently an integer of 1 to 3, provided that the plurality of $m_1$ are not 1 at the same time, each $m_2$ is independently an integer of 0 to 2, and $2 \le (m_1+m_2) \le 4$; each of $m_3$ and $m_4$ is independently an integer of 0 to 4; each of $n_1$ and $n_2$ is independently an integer of 1 to 500; each $R_1$ is independently a monovalent group selected from the group consisting of a hydrocarbon group having a carbon number of 1 to 10, an alkoxy group having a carbon number of 1 to 10, a nitro group, a cyano group, and a group represented by following formula (5) or (6); when $m_2$ is 2, the plurality of $R_1$ may be the same as or different from each other; each of $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; each of $R_6$ and $R_7$ is independently a halogen atom, a hydroxyl group or a monovalent organic group; when $m_3$ is an integer of 2 to 4, the plurality of $R_6$ may be the same as or different from each other; when $m_4$ is an integer of 2 to 4, the plurality of $R_7$ may be the same as or different from each other; Y is a divalent organic group represented by following formula (3) or (4); W is a divalent group selected from the group consisting of a single bond, a chain aliphatic group having a carbon number of 1 to 10, a chain aliphatic group having a carbon number of 1 to 10, in which some hydrogen atoms or all hydrogen atoms are substituted with a fluorine atom, an alicyclic group having a carbon number of 3 to 20, an alicyclic group having a carbon number of 3 to 20, in which some hydrogen atoms or all hydrogen atoms are substituted with a fluorine atom, an alkylene oxide group having from 1 to 20 repeating units, and groups represented by following formula (2):

[Chem. 8]

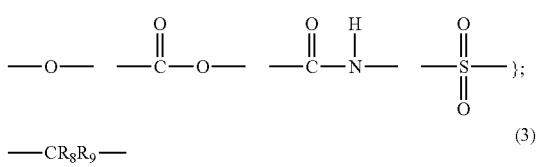
(2)

—$CR_8R_9$—    (3)

(in formula (3), each of $R_8$ and $R_9$ is independently a hydrogen atom, a monovalent organic group having a carbon number of 1 to 11, or a group containing a carboxyl group, a sulfonic acid group or a phenolic hydroxyl group);

[Chem. 9]

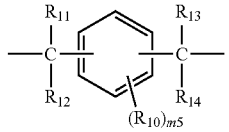
(4)

{in formula (4), each of $R_{11}$ to $R_{14}$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; $m_5$ is an integer of 1 to 4; when $m_5$ is 1, $R_{10}$ is a hydroxyl group; when $n_5$ is an integer of 2 to 4, at least one $R_{10}$ is a hydroxyl group and the remaining $R_{10}$ are a halogen atom, a hydroxyl group, or a monovalent organic group; and all of $R_{10}$ may be the same or different};

[Chem. 10]

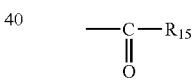
(5)

{in formula (5), $R_{15}$ is a monovalent group selected from the group consisting of a hydroxyl group, an aliphatic group having a carbon number of 1 to 12, an alicyclic group having a carbon number of 3 to 12, an aromatic group having a carbon number of 6 to 18, —$NH_2$, and groups represented by —NH—$R_{19}$, —N($R_{19}$)$_2$ and —O—$R_{19}$ (wherein $R_{19}$ is a monovalent group selected from an aliphatic group having a carbon number of 1 to 12, an alicyclic group having a carbon number of 3 to 12, and an aromatic group having a carbon number of 6 to 18)};

[Chem. 11]

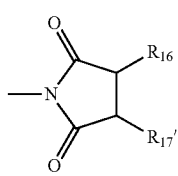
(6)

{in formula (6), each of $R_{16}$ and $R_{17}'$ is independently a monovalent group selected from the group consisting of a hydrogen atom, an aliphatic group having a carbon number of 1 to 12, an alicyclic group having a carbon number of 3 to 12, and an aromatic group having a carbon number of 6 to 18, and $R_{16}$ and $R_{17}'$ may form a ring}.

[4]

The photosensitive resin composition according to [3], wherein in formulae (7) and (8), all X are a hydrogen atom.

[5]

The photosensitive resin composition according to [3] or [4], wherein the resin containing a structure represented by formula (7) contains a structure represented by following formula (9) and the resin containing a structure represented by formula (8) contains a structure represented by following formula (10):

[Chem. 12]

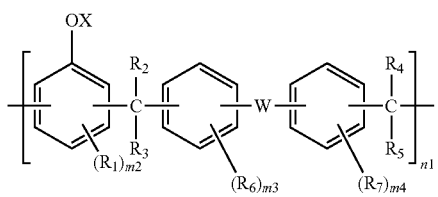
(9)

[Chem. 13]

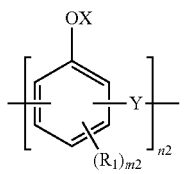
(10)

{in formulae (9) and (10), each $m_2$ is independently an integer of 0 to 2, provided that the plurality of $m_2$ are not 0 at the same time; each $R_1$ is independently a monovalent group selected from the group consisting of a nitro group, a cyano group, and a group represented by formula (5) or (6); when $m_2$ is 2, the plurality of $R_1$ may be the same as or different from each other; and $R_2$ to $R_7$, X, Y, W, $m_3$, $m_4$, $n_1$ and $n_2$ are as defined in formulae (7) and (8) above}.

[6]

The photosensitive resin composition according to [5], wherein in formulae (9) and (10), all X are a hydrogen atom.

[7]

The photosensitive resin composition according to [1] or [2], wherein Y in formula (1) is a resin containing a structure represented by following formula (11) or (12):

(11)

(wherein $R_8$ is a hydrogen atom or a monovalent organic group having a carbon number of 1 to 11);

[Chem. 14]

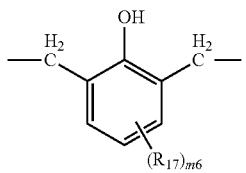
(12)

(in formula (12), $R_{17}$ is a hydrocarbon group having a carbon number of 1 to 10 or an alkoxy group having a carbon number of 1 to 10, $m_6$ is an integer of 0 to 3, and when $m_6$ is 2 or 3, the plurality of $R_{17}$ may be the same or different).

[8]

The photosensitive resin composition according to [3] or [4], wherein Y in formula (8) is a resin containing a structure represented by following formula (11) or (12):

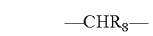
(11)

(in formula (11), $R_8$ is a hydrogen atom or a monovalent organic group having a carbon number of 1 to 11);

[Chem. 15]

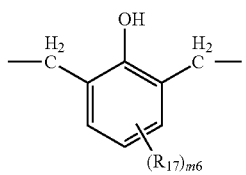
(12)

(in formula (12), $R_{17}$ is a hydrocarbon group having a carbon number of 1 to 10 or an alkoxy group having a carbon number of 1 to 10, $m_6$ is an integer of 0 to 3, and when $m_6$ is 2 or 3, the plurality of $R_{17}$ may be the same or different).

[9]

The photosensitive resin composition according to [5] or [6], wherein Y in formula (10) is a resin containing a structure represented by formula (11) or (12).

[10]

The photosensitive resin composition according to any one of [1], [2] and [7], wherein $R_1$ in formula (1) is at least one member selected from the group consisting of a hydrocarbon group having a carbon number of 1 to 10, an alkoxy group having a carbon number of 1 to 10, and a group represented by formula (5), W in formula (1) is a single bond, and $R_{15}$ in formula (5) is a monovalent group selected from the group consisting of a hydroxyl group, —$NH_2$, and groups represented by —NH—$R_{19}$, —N($R_{19}$)$_2$ and —O—$R_{19}$ (wherein $R_{19}$ is a monovalent group selected from an aliphatic group having a carbon number of 1 to 12, an alicyclic group having a carbon number of 3 to 12, and an aromatic group having a carbon number of 6 to 18).

[11]

The photosensitive resin composition according to any one of [3], [4] and [8], wherein $R_1$ in formulae (7) and (8) is at least one member selected from the group consisting of a hydrocarbon group having a carbon number of 1 to 10, an alkoxy group having a carbon number of 1 to 10, and a group represented by formula (5), W in formula (7) is a single bond, and $R_{15}$ in formula (5) is a monovalent group selected from the group consisting of a hydroxyl group, —$NH_2$, and groups represented by —NH—$R_{19}$, —N($R_{19}$)$_2$ and —O—$R_{19}$ (wherein $R_{19}$ is a monovalent group selected from an aliphatic group having a carbon number of 1 to 12, an alicyclic group having a carbon number of 3 to 12, and an aromatic group having a carbon number of 6 to 18).

[12]

The photosensitive resin composition according to any one of [1], [2], [7] and [10], wherein resin (A-1) is a resin containing a structure represented by following formula (13):

[Chem. 16]

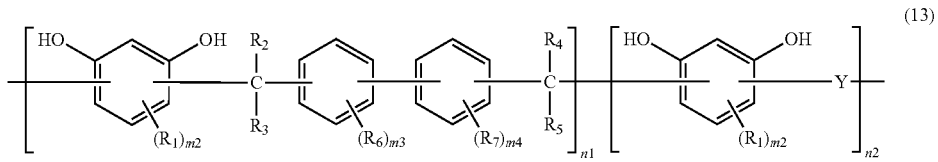

(13)

{in formula (13), each $m_2$ is independently an integer of 0 to 2; each of $m_3$ and $m_4$ is independently an integer of 0 to 4; each of $n_1$ and $n_2$ is independently an integer of 1 to 500, and $n_1/(n_1+n_2)$ is from 0.35 to 0.8; each $R_1$ is independently a monovalent group having a carbon number of 1 to 10 selected from a hydrocarbon group and an alkoxy group; when $m_2$ is 2, the plurality of $R_1$ may be the same as or different from each other; each of $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; each of $R_6$ and $R_7$ is independently a halogen atom, a hydroxyl group or a monovalent organic group; when $m_3$ is 2 to 4, the plurality of $R_6$ may be the same as or different from each other; when $m_4$ is an integer of 2 to 4, the plurality of $R_7$ may be the same as or different from each other; Y is a methylene group or a structure represented by following formula (14); and the polymer structure may be a random structure or a block structure}:

[Chem. 17]

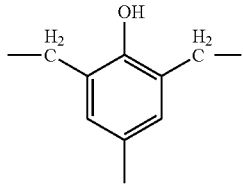

(14)

[13]

The photosensitive resin composition according to any one of [3], [4], [8] and [11], wherein the resin mixture (A-2) is a resin mixture including a resin containing a structure represented by following formula (15) and a resin containing a structure represented by following formula (8a) and the weight ratio of the resin containing a structure represented by formula (15): the resin containing a structure represented by formula (8a) is from 35:65 to 80:20:

[Chem. 18]

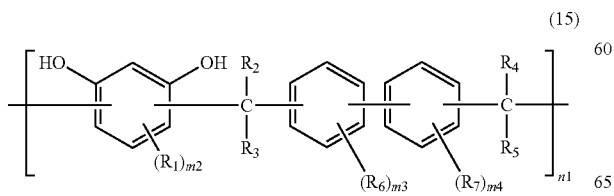

(15)

-continued

[Chem. 19]

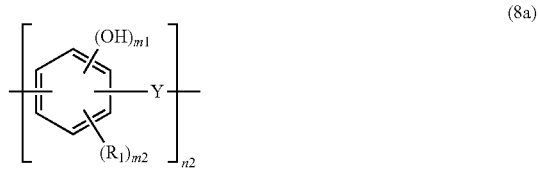

(8a)

{in formulae (15) and (8a), $m_1$ is from 1 to 3; each $m_2$ is independently an integer of 0 to 2; each of $m_3$ and $m_4$ is independently an integer of 0 to 4; each of $n_1$ and $n_2$ is independently an integer of 1 to 500; each $R_1$ is independently a monovalent group having a carbon number of 1 to 10 selected from a hydrocarbon group and an alkoxy group; when $m_2$ is 2, the plurality of $R_1$ may be the same as or different from each other; each $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; each of $R_6$ and $R_7$ is independently a halogen atom, a hydroxyl group or a monovalent organic group; when $m_3$ is from 2 to 4, the plurality of $R_6$ may be the same as or different from each other; when $m_4$ is an integer of 2 to 4, the plurality of $R_7$ may be the same as or different from each other; and Y is a methylene group or a structure represented by following formula (16)}:

[Chem. 20]

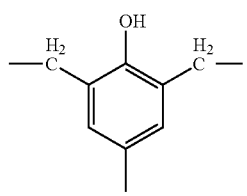

(16)

[14]
A phenolic resin containing a structure represented by following formula (17):

[Chem. 21]

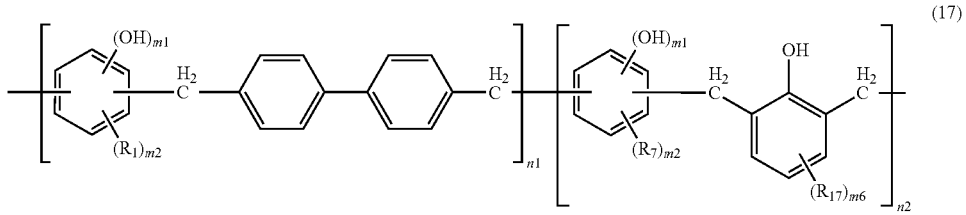

{in formula (17), each of $R_1$ and $R_{17}$ is independently a monovalent group having a carbon number of 1 to 10 selected from a hydrocarbon group and an alkoxy group; $m_1$ is an integer of 2 or 3, each of $m_2$ and $m_6$ is independently an integer of 0 to 2, and $2 \leq m_1 + m_2 \leq 4$; each of $n_1$ and $n_2$ is independently an integer of 1 to 500 and satisfies $0.05 \leq n_1/(n_1+n_2) \leq 1$; when $m_2$ is 2, the plurality of $R_1$ may be the same or different; and the polymer structure may be a random structure or a block structure).

[15]
A phenolic resin containing a structure represented by following formula (18):

[Chem. 22]

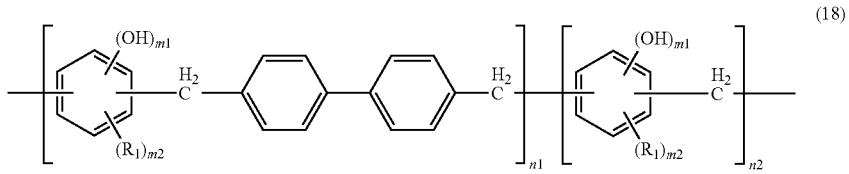

{in formula (18), each $R_1$ is independently a monovalent group having a carbon number of 1 to 10 selected from a hydrocarbon group and an alkoxy group; $m_1$ is an integer of 2 or 3, $m_2$ is an integer of 0 to 2, each of $n_1$ and $n_2$ is independently an integer of 1 to 500, and these members satisfy $2 \leq m_2 \leq 4$ and $0.35 \leq n_1/(n_1+n_2) \leq 0.95$; when $m_2$ is 2, the plurality of $R_1$ may be the same or different; and the polymer structure may be a random structure or a block structure}.

[16]
A photosensitive resin composition comprising the phenolic resin according to [14] or [15] and (B) a photoacid generator.

[17]
The photosensitive resin composition according to any one of [1] to [13] and [16], wherein photoacid generator (B) is a compound having a naphthoquinonediazide structure.

[18]
A photosensitive resin composition comprising (A-1) a resin containing a structure represented by following formula (19) and (B) a photoacid generator:

[Chem. 23]

{in formula (19), each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group; each $m_1$ is independently an integer of 1 to 3, each $m_2$ is independently an integer of 1 to 2, and $2 \leq (m_1+m_2) \leq 4$; each of $n_1$ and $n_2$ is independently an integer of 1 to 500, and $n_1/(n_1+n_2)$ is from 0.05 to 1; each $R_1$ is independently a monovalent group selected from the group consisting of a nitro group, a cyano group, and a group represented by following formula (5) or (6); when $m_2$ is 2, the plurality of $R_1$ may be the same as or different from each other; $m_7$ is an integer of 0 to 2; $R_{18}$ is a hydroxyl group or a methyl group; when $m_7$ is 2, the plurality of $R_{18}$ may be the same as or different from each other; z is an integer of 0 or 1; Y is a methylene group or a structure represented by following formula (16); and the polymer structure may be a random structure or a block structure};

[Chem. 24]

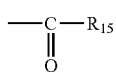

(5)

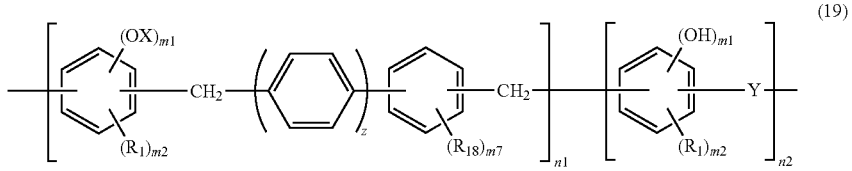

{in formula (5), $R_{15}$ is a monovalent group selected from the group consisting of a hydroxyl group, an aliphatic group having a carbon number of 1 to 12, an alicyclic group having a carbon number of 3 to 12, an aromatic group having a carbon number of 6 to 18, —$NH_2$, and groups represented by —NH—$R_{19}$, —N($R_{19}$)$_2$ and —O—$R_{19}$ (wherein $R_{19}$ is a monovalent group selected from an aliphatic group having a carbon number of 1 to 12, an alicyclic group having a carbon number of 3 to 12, and an aromatic group having a carbon number of 6 to 18)};

[Chem. 25]

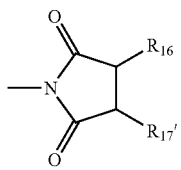

(6)

{in formula (6), each of $R_{16}$ and $R_{17}'$ is independently a monovalent group selected from a hydrogen atom, an aliphatic group having a carbon number of 1 to 12, an alicyclic group having a carbon number of 3 to 12, and an aromatic group having a carbon number of 6 to 18, and $R_{16}$ and $R_{17}'$ may form a ring};

[Chem. 26]

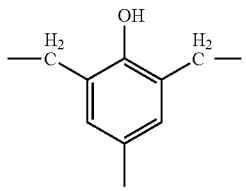

(16)

[19]
The photosensitive resin composition according to any one of [1] to [13] and [16] to [18], further comprising (C) a crosslinking agent.

[20]
The photosensitive resin composition according to any one of [1] to [13] and [16] to [19], further comprising (D) a thermal acid generator.

[21]
A method for producing a cured relief pattern, comprising the following steps:
(1) a step of forming, on a substrate, a photosensitive resin layer containing the photosensitive resin composition according to any one of [1] to [13] and [16] to [20],
(2) a step of exposing the photosensitive resin layer to light,
(3) a step of removing the exposed area or unexposed area with a developer to obtain a relief pattern, and
(4) a step of heat-treating the relief pattern.

[22]
A cured relief pattern produced by the method according to [21].

[23]
A semiconductor device comprising a semiconductor element and a cured film provided on the top of the semiconductor element, wherein the cured film is the cured relief pattern according to [22].

[24]
A display device comprising a display element and a cured film provided on the top of the display element, wherein the cured film is the cured relief pattern according to [22].

[25]
An alkali-soluble resin composition comprising an alkali-soluble resin and a solvent, wherein a cured film obtained by coating the alkali-soluble resin composition and curing the coated resin composition at 200° C. satisfies all of following a) to c):
a) the stress at a film thickness of 7 μm is from 5 to 18 MPa,
b) the maximum value of tensile elongation of the film having a film thickness of 10 μm is from 20 to 100%, and
c) the glass transition temperature at a film thickness of 10 μm is from 180 to 300° C.

[26]
A cured product obtained by coating a substrate with a photosensitive resin layer consisting of a positive-type photosensitive resin composition containing a phenolic resin, a photoacid generator and a solvent and subjecting the layer to exposure, development and curing, wherein in a cross-sectional profile consisting of a space moiety of 5 to 100 μm and a land moiety of 1 to 10 mm, the cross-sectional angle defined by an interior angle relative to the base material surface when a tangential line is drawn at a height of half the cured film thickness is from 40 to 90°.

Effects of the Invention

According to the present invention, a photosensitive resin composition having sufficient alkali solubility, being curable at a temperature of 300° C. or less, ensuring excellent elongation of the cured film, enabling pattern formation with a thick film (about 10 μm), allowing a high residual film ratio during curing, and giving a good cured relief pattern profile, and a semiconductor device and a display device each having a cured relief pattern produced using the photosensitive resin composition, can be provided.

MODE FOR CARRYING OUT THE INVENTION

Figure 1:
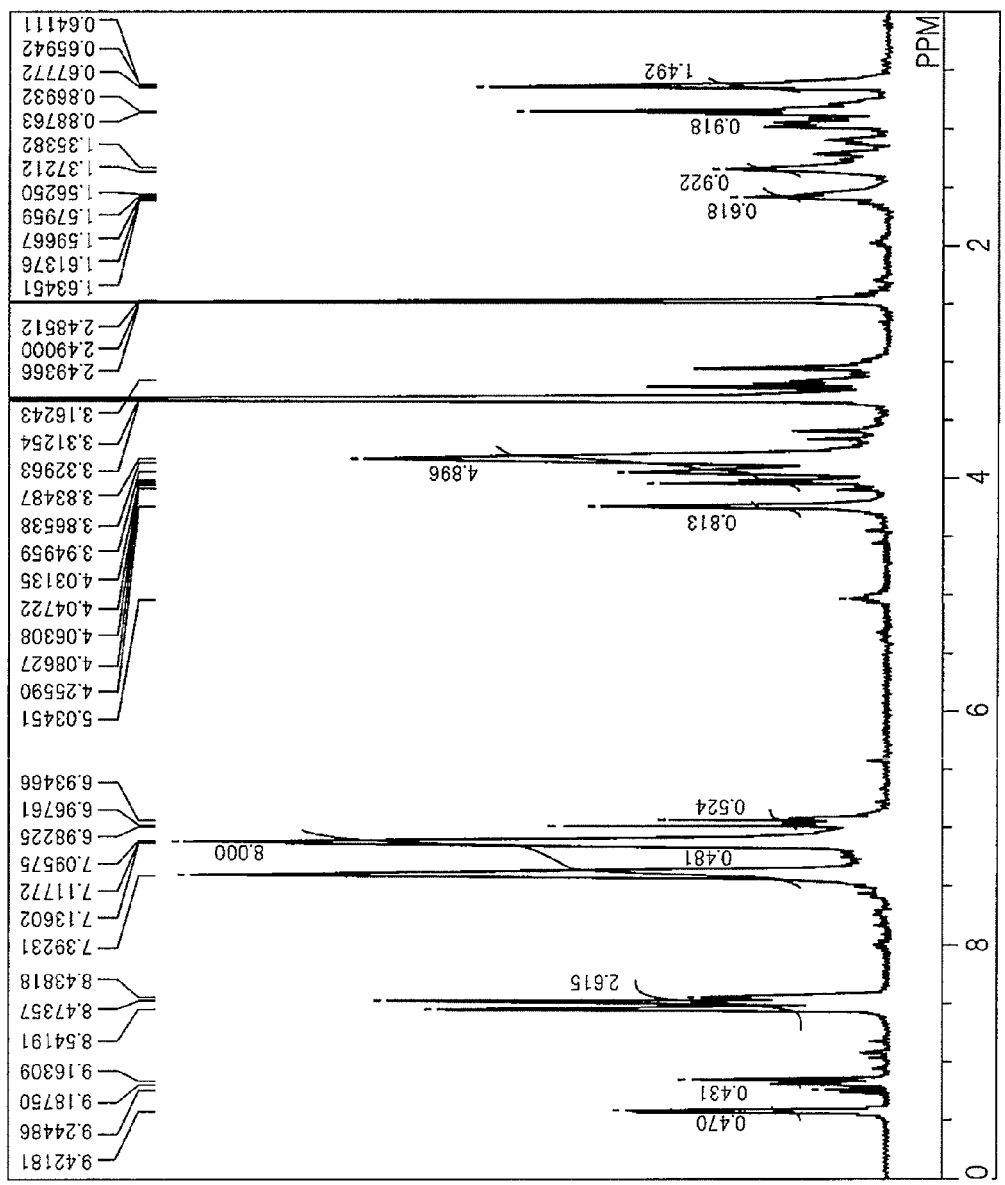
FIG. 1 A $^1$H NMR spectrum of Resin P1-1 described in Examples.

The best mode for carrying out the present invention (hereinafter, simply referred to as "embodiment") is described in detail below. The present invention is not limited to the following embodiment and can be implemented by making various modifications within the scope of the gist thereof.
<Photosensitive Resin Composition>

In the embodiment, the photosensitive resin composition comprises (A-1) a resin or (A-2) a resin mixture, (B) a photoacid generator, (C) a crosslinking agent as desired, (D) a thermal acid generator as desired, and other components as desired. Respective components constituting the photosensitive resin composition are described in detail below. Incidentally, throughout the description of the present invention, as to the structure indicated by the same symbol in the formula, when a plurality of the structures are present in a molecule, they may be the same or different.

[Resin (A-1)]

In the embodiment, resin (A-1) is a resin having a structure represented by following formula (1):

[Chem. 27]

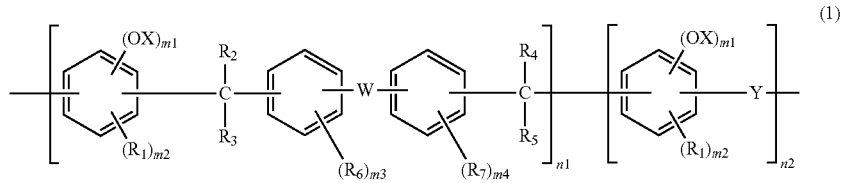

{in formula (1), each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group; each $m_1$ is independently an integer of 1 to 3, each $m_2$ is independently an integer of 0 to 2, and $2 \le (m_1+m_2) \le 4$; each of $m_3$ and $m_4$ is independently an integer of 0 to 4; each of $n_1$ and $n_2$ is independently an integer of 1 to 500, and $n_1/(n_1+n_2)$ is from 0.05 to 0.95 when $m_1$ is 2 or 3, and is from 0.35 to 0.95 when $m_1$ is 1; each $R_1$ is independently a monovalent group selected from the group consisting of a hydrocarbon group having a carbon number of 1 to 10, an alkoxy group having a carbon number of 1 to 10, a nitro group, a cyano group, a group represented by following formula (5), and a group represented by following formula (6); when $m_2$ is 2, the plurality of $R_1$ may be the same as or different from each other; each of $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; each of $R_6$ and $R_7$ is independently a halogen atom, a hydroxyl group or a monovalent organic group; when $m_3$ is an integer of 2 to 4, the plurality of $R_6$ may be the same as or different from each other; when $m_4$ is an integer of 2 to 4, the plurality of $R_7$ may be the same as or different from each other; Y is a divalent organic group represented by following formula (3) or (4); W is a divalent group selected from the group consisting of a single bond, a chain aliphatic group having a carbon number of 1 to 10, a chain aliphatic group having a carbon number of 1 to 10, in which some hydrogen atoms or all hydrogen atoms are substituted with a fluorine atom, an alicyclic group having a carbon number of 3 to 20, an alicyclic group having a carbon number of 3 to 20, in which some hydrogen atoms or all hydrogen atoms are substituted with a fluorine atom, an alkylene oxide group having from 1 to 20 repeating units, and groups represented by following formula (2):

[Chem. 28]

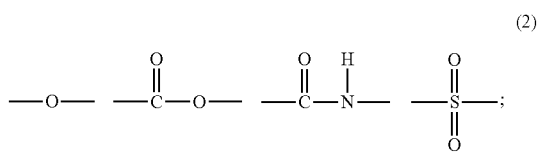

and the polymer structure may be a random structure or a block structure};

$$-CR_8R_9- \quad (3)$$

(in formula (3), each of $R_8$ and $R_9$ is independently a hydrogen atom, a monovalent organic group having a carbon number of 1 to 11, or a group containing a carboxyl group, a sulfonic acid group or a phenolic hydroxyl group);

[Chem. 29]

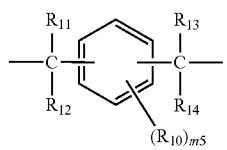

{in formula (4), each of $R_{11}$ to $R_{14}$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; $m_5$ is an integer of 1 to 4; when $m_5$ is 1, $R_{12}$ is a hydroxyl group, a carboxyl group or a sulfonic acid group, and when $n_5$ is an integer of 2 to 4, at least one $R_{12}$ is a hydroxyl group and the remaining $R_{12}$ are a halogen atom, a hydroxyl group, a monovalent organic group, a carboxyl group or a sulfonic acid group; and all $R_{10}$ may be the same or different};

[Chem. 30]

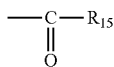

(5)

{in formula (5), $R_{15}$ is a monovalent group selected from the group consisting of a hydroxyl group, an aliphatic group having a carbon number of 1 to 12, an alicyclic group having a carbon number of 3 to 12, an aromatic group having a carbon number of 6 to 18, —$NH_2$, and groups represented by —NH—$R_{19}$, —$N(R_{19})_2$ and —O—$R_{19}$ (wherein $R_{19}$ is a monovalent group selected from an aliphatic group having a carbon number of 1 to 12, an alicyclic group having a carbon number of 3 to 12, and an aromatic group having a carbon number of 6 to 18)};

[Chem. 31]

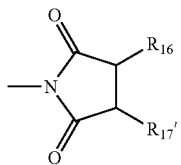

(6)

{in formula (6), each of $R_{16}$ and $R_{17}'$ is independently a monovalent group selected from the group consisting of a hydrogen atom, an aliphatic group having a carbon number of 1 to 12, an alicyclic group having a carbon number of 3 to 12, and an aromatic group having a carbon number of 6 to 18, and $R_{16}$ and $R_{17}'$ may form a ring}.

In formula (1), each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group. Among others, in view of sensitivity, X is preferably a hydrogen atom, a tert-butoxycarbonyl group, a tert-butoxycarbonylmethyl group, a tetrahydropyranyl group, or a tetrahydrofuranyl group, and in view of heat resistance, more preferably a hydrogen atom.

In formula (1), each $m_1$ is independently an integer of 1 to 3. In view of alkali solubility and the profile of cured relief pattern, $m_1$ is preferably 2 or 3, and in view of lithography, $m_1$ is more preferably 2. In order to facilitate interaction of phenolic resin (A-1) with photoacid generator (B), when $m_1$ is 2, the bonding-position relationship between hydroxyl groups in formula (1) is preferably the meta-position.

In formula (1), $R_1$ is not limited as long as each $R_1$ is independently a monovalent group having a carbon number of 1 to 10 selected from a hydrocarbon group and an alkoxy group, a nitro group, a cyano group, a group represented by following formula (5), and/or a group represented by following formula (6).

In the case where $R_1$ is a monovalent group having a carbon number of 1 to 10 selected from a hydrocarbon group and an alkoxy group, in view of heat resistance, $R_1$ is preferably a hydrocarbon group or alkoxy group having a carbon number of 1 to 5, more preferably a hydrocarbon group having a carbon number of 1 to 3.

In the case where $R_1$ is an electron-withdrawing group, such as nitro group, cyano group, a group represented by formula (5), and a group represented by formula (6), the acidity of the phenolic hydroxyl group rises, and the photosensitive resin composition formed gives a coating film excellent in alkali solubility. In the description of the present invention, the electron-withdrawing group indicates an atomic group of which power to attract an electron from a target by a resonance effect or an inductive effect is higher than that of a hydrogen atom. In addition, even when the phenolic resin is increased in the molecular weight, alkali solubility necessary for development is maintained, and increasing the molecular weight is advantageous in terms of increasing the elongation of a cured film.

In addition, when the phenolic resin has an electron-withdrawing group as $R_1$, a cured relief pattern profile is improved. Although not wishing to be bound by a mechanism, this is presumed to be caused because $R_1$ is a group having polarity and exhibits a strong interaction with the phenolic hydroxyl group in the resin. The softening point of the resin rises due to the interaction, so that when the relief pattern after development is heated to form a cured relief pattern, the pattern profile can be kept in a good state without losing the shape of relief pattern.

In the case where $m_2$ is 2, the plurality of $R_1$ may be the same as or different from each other.

When $m_1$ is 1, $m_2$ is preferably from 1 to 2, and $R_1$ is preferably an electron-withdrawing group.

Among the groups described above, in view of less production of a by-product during the polymer synthesis, $R_1$ is more preferably a monovalent group represented by following formula (5):

[Chem. 32]

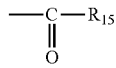

(5)

{in formula (5), $R_{15}$ is a monovalent group selected from the group consisting of a hydroxyl group, —$NH_2$, and groups represented by —NH—$R_{19}$, —$N(R_{19})_2$ and —O—$R_{19}$ (wherein $R_{19}$ is a monovalent group selected from an aliphatic group having a carbon number of 1 to 12, an alicyclic group having a carbon number of 3 to 12, and an aromatic group having a carbon number of 6 to 18)}.

Furthermore, from the standpoint that the alkali solubility is easily controlled, $R_{15}$ is more preferably a group represented by —O—$R_{19}$.

In formula (1), $R_2$ to $R_5$ are not limited as long as each is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom. Among others, in view of sensitivity of the photosensitive resin composition formed, each of $R_2$ to $R_5$ is independently, preferably a hydrogen atom or a monovalent aliphatic group having a carbon number of 1 to 3, and in view of heat resistance, it is more preferred that all of $R_2$ to $R_5$ are a hydrogen atom.

In formula (1), each of $R_6$ and $R_7$ is independently a halogen atom, a hydroxyl group or a monovalent organic group. Among others, in view of heat resistance, each of $R_6$ and $R_7$ is preferably a hydroxyl group or an aliphatic group having a carbon number of 1 to 3.

In formula (1), each of $m_3$ and $m_4$ is independently an integer of 0 to 4. In view of heat resistance, it is preferable that $m_3$ and $m_4$ are 0.

W in formula (1) is described below.

W is a divalent group selected from the group consisting of a single bond, a chain aliphatic group having a carbon number of 1 to 10, a chain aliphatic group having a carbon number of 1 to 10, in which some hydrogen atoms or all hydrogen atoms are substituted with a fluorine atom, an alicyclic group having a carbon number of 3 to 20, an alicyclic group having a carbon number of 3 to 20, in which some hydrogen atoms or all hydrogen atoms are substituted with a fluorine atom, an alkylene oxide group having from 1 to 20 repeating units, and groups represented by following formula (2):

[Chem. 33]

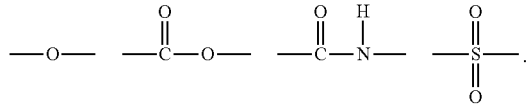

(2)

In view of heat resistance of the resin, W is preferably a single bond or a divalent group represented by formula (2), more preferably a single bond.

In formula (1), Y is not limited as long as it is a structure represented by formula (3) or (4).

In formula (3), $R_8$ and $R_9$ are not limited as long as they are a hydrogen atom or a monovalent organic group having a carbon number of 1 to 11, and in view of heat resistance of the cured film, they are preferably a group selected from a hydrogen atom, a hydrocarbon group having a carbon number of 1 to 3, a monovalent organic group having a carbon number of 1 to 11 and containing a polymerizable group, such as double bond, and a monovalent organic group having a carbon number of 1 to 11 and containing a polar group, such as hydroxyl group or carboxyl group.

Furthermore, in view of sensitivity of the photosensitive resin composition formed, $R_8$ and $R_9$ are more preferably a group selected from a hydrogen atom and a hydrocarbon group having a carbon number of 1 to 3.

In formula (4), each of $R_{11}$ to $R_{14}$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom.

In view of heat resistance, $R_{11}$ to $R_{14}$ are preferably a monovalent aliphatic group having a carbon number of 1 to 3, or a hydrogen atom, and in view of sensitivity of the photosensitive resin composition formed, they are more preferably a hydrogen atom.

In formula (4), $m_5$ is an integer of 1 to 4, and when $m_5$ is 1, $R_{12}$ is not limited as long as it is a hydroxyl group, a carboxyl group or a sulfonic acid group.

When $m_5$ is an integer of 2 to 4, at least one $R_{12}$ is a hydroxyl group and the remaining $R_{12}$ are a halogen atom, a hydroxyl group, a monovalent organic group, a carboxyl group or a sulfonic acid group. All of $R_{10}$ may be the same or different.

Among others, in view of heat resistance, the divalent organic group represented by formula (4) preferably has a structure represented by following formula (20), and in view of sensitivity, and more preferably has a structure represented by following formula (12):

[Chem. 34]

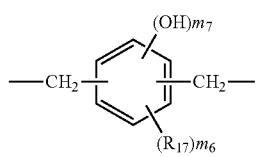

(20)

[Chem. 35]

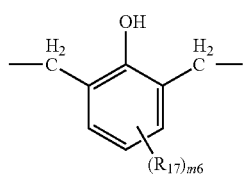

(12)

(in formulae (20) and (12), $R_{17}$ is a hydrocarbon group having a carbon number of 1 to 10 or an alkoxy group having a carbon number of 1 to 10; $m_6$ is an integer of 0 to 3, and when $m_6$ is 2 or 3, the plurality of $R_{17}$ may be the same or different; and $m_7$ is an integer of 1 to 3; provided that $m_6$ and $m_7$ satisfy $1 \leq (m_6+m_7) \leq 4$).

Each of $n_1$ and $n_2$ in formula (1) indicates the total number of repeating units in the polymer main chain and is an integer of 1 to 500. In view of toughness of the film cured, $n_1$ and $n_2$ are preferably 1 or more, and in view of solubility in an aqueous alkali solution, are preferably 500 or less. The lower limit of $n_1$ and $n_2$ is preferably 2, more preferably 3, and the upper limit of $n_1$ and $n_2$ is preferably 450, more preferably 400, still more preferably 350.

By adjusting the ratio between $n_1$ and $n_2$, a photosensitive resin composition having more preferable film properties and more improved alkali solubility can be prepared. As the value of $n_1/(n_1+n_2)$ is larger, the film properties after curing are better and the heat resistance is more excellent, whereas as the value of $n_1/(n_1+n_2)$ is smaller, the alkali solubility is more improved and the pattern profile after curing is more excellent. Although not wishing to be bound by a mechanism, these results are presumed to occur because as the value of $n_1/(n_1+n_2)$ in formula (1) is larger, the average distance between crosslinking points of the phenolic resin as a heat-curable resin is longer. Accordingly, when $m_1$ is 2 or 3, the value of $n_1/(n_1+n_2)$ is preferably $n_1/(n_1+n_2)=0.05$ to 0.95 in view of film properties after curing, more preferably $n_1/(n_1+n_2)=0.35$ to 0.9 in view of film properties after curing and alkali solubility, still more preferably $n_1/(n_1+n_2)=0.4$ to 0.8 in view of film properties after curing, pattern profile and alkali solubility. Although not wishing to be bound by a mechanism, it is believed that by forming the resin as a copolymer, the amount of a low molecular weight component having a novolak structure probably greatly contributing to weight loss during heat curing is reduced, and the residual film ratio during heat curing is increased.

In addition, when $m_1$ is 1, $n_1/(n_1+n_2)$ is from 0.35 to 0.9. Among others, in view of film properties after curing, pattern profile and alkali solubility, $n_1/(n_1+n_2)$ is preferably from 0.4 to 0.8. In addition, when $m_1$ is 1, in view of pattern profile and alkali solubility, it is preferable that $m_2$ is 1 or 2 and $R_1$ is an electron-withdrawing group.

The structure of resin (A-1) may be a block structure or a random structure, and is preferably a block structure in light of adhesiveness to a substrate.

Among others, in view of elongation and heat resistance, the structure of resin (A-1) is preferably a structure represented by following formula (13):

[Chem. 36]

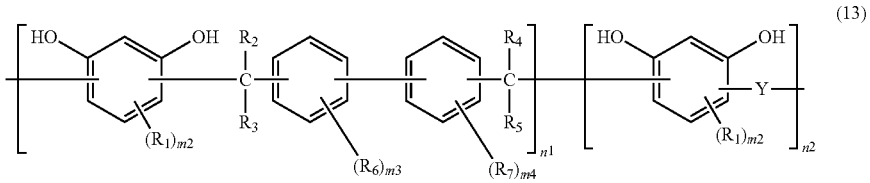

(13)

{in formula (13), each $m_2$ is independently an integer of 0 to 2; each of $m_3$ and $m_4$ is independently an integer of 0 to 4; each of $n_1$ and $n_2$ is independently an integer of 1 to 500, and $n_1/(n_1+n_2)$ is from 0.35 to 0.8; each $R_1$ is independently a monovalent group having a carbon number of 1 to 10 selected from a hydrocarbon group and an alkoxy group; when $m_2$ is 2, the plurality of $R_1$ may be the same as or different from each other; each of $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; each of $R_6$ and $R_7$ is independently a halogen atom, a hydroxyl group or a monovalent organic group; when $m_3$ is from 2 to 4, the plurality of $R_6$ may be the same as or different from each other; when $m_4$ is an integer of 2 to 4, the plurality of $R_7$ may be the same as or different from each other; Y is a methylene group or a structure represented by following formula (14); and the polymer structure may be a random structure or a block structure};

[Chem. 37]

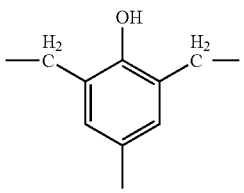

(14)

[Resin Mixture (A-2)]

In the embodiment, resin mixture (A-2) is a resin mixture including a resin containing a structure represented by following formula (7) and a resin containing a structure represented by following formula (8):

[Chem. 38]

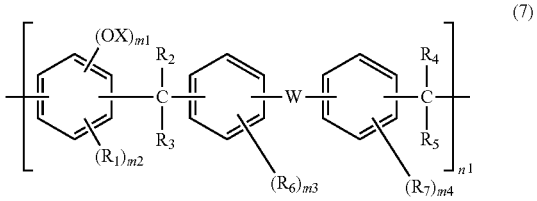

(7)

-continued

[Chem. 39]

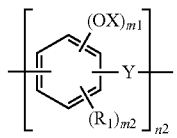

(8)

{in formulae (7) and (8), each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group; each $m_1$ is independently an integer of 1 to 3, provided that the plurality of $m_1$ are not 1 at the same time, each $m_2$ is independently an integer of 0 to 2, and $2 \le (m_1+m_2) \le 4$; each of $m_3$ and $m_4$ is independently an integer of 0 to 4; each of $n_1$ and $n_2$ is independently an integer of 1 to 500; each $R_1$ is independently a monovalent group selected from the group consisting of a hydrocarbon group having a carbon number of 1 to 10, an alkoxy group having a carbon number of 1 to 10, a nitro group, a cyano group, and a group represented by following formula (5) or (6); when $m_2$ is 2, the plurality of $R_1$ may be the same as or different from each other; each of $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; each of $R_6$ and $R_7$ is independently a halogen atom, a hydroxyl group or a monovalent organic group; when $m_3$ is an integer of 2 to 4, the plurality of $R_6$ may be the same as or different from each other; when $m_4$ is an integer of 2 to 4, the plurality of $R_7$ may be the same as or different from each other; Y is a divalent organic group represented by following formula (3) or (4); W is a divalent group selected from the group consisting of a single bond, a chain aliphatic group having a carbon number of 1 to 10, a chain aliphatic group having a carbon number of 1 to 10, in which some hydrogen atoms or all hydrogen atoms are substituted with a fluorine atom, an alicyclic group having a carbon number of 3 to 20, an alicyclic group having a carbon number of 3 to 20, in which some hydrogen atoms or all hydrogen atoms are substituted with a fluorine atom, an alkylene oxide group having from 1 to 20 repeating units, and groups represented by following formula (2):

[Chem. 40]

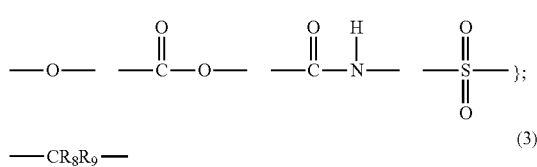
(2)

—CR$_8$R$_9$— (3)

(wherein each of R$_8$ and R$_9$ is independently a hydrogen atom, a monovalent organic group having a carbon number of 1 to 11, or a group containing a carboxyl group, a sulfonic acid group or a phenolic hydroxyl group);

[Chem. 41]

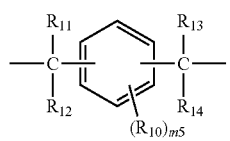
(4)

{in formula (4), each of R$_{11}$ to R$_{19}$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; m$_5$ is an integer of 1 to 4; when m$_5$ is 1, R$_{10}$ is a hydroxyl group; when n$_5$ is an integer of 2 to 4, at least one R$_{10}$ is a hydroxyl group and the remaining R$_{10}$ are a halogen atom, a hydroxyl group, or a monovalent organic group; and all R$_{10}$ may be the same or different};

[Chem. 42]

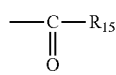
(5)

{in formula (5), R$_{15}$ is a monovalent group selected from the group consisting of a hydroxyl group, an aliphatic group having a carbon number of 1 to 12, an alicyclic group having a carbon number of 3 to 12, an aromatic group having a carbon number of 6 to 18, —NH$_2$, and groups represented by —NH—R$_n$, —N(R$_{19}$)$_2$ and —O—R$_{19}$ (wherein R$_{19}$ is a monovalent group selected from an aliphatic group having a carbon number of 1 to 12, an alicyclic group having a carbon number of 3 to 12, and an aromatic group having a carbon number of 6 to 18)};

[Chem. 43]

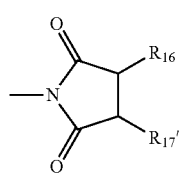
(6)

{in formula (6), each of R$_{16}$ and R$_{17}$' is independently a monovalent group selected from the group consisting of a hydrogen atom, an aliphatic group having a carbon number of 1 to 12, an alicyclic group having a carbon number of 3 to 12, and an aromatic group having a carbon number of 6 to 18, and R$_{16}$ and R$_{17}$' may form a ring}.

In formulae (7) and (8), each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group. Among others, in view of sensitivity, X is preferably a hydrogen atom, a tert-butoxycarbonyl group, a tert-butoxycarbonylmethyl group, a tetrahydropyranyl group or a tetrahydrofuranyl group, and in view of heat resistance, and is more preferably a hydrogen atom.

In formulae (7) and (8), each m$_1$ is independently an integer of 1 to 3, provided that the plurality of m$_1$ are not 1 at the same time. In view of alkali solubility and profile of the relief pattern cured, m$_1$ is preferably 2 or 3, and in view of lithography, m$_1$ is more preferably 2. In order to facilitate interaction of the phenolic resin with photoacid generator (B), when m$_1$ is 2, the bonding-position relationship between hydroxyl groups in formula (1) is preferably the meta-position.

Preferable ranges or embodiments of m$_2$ to m$_4$, R$_1$ to R$_5$ and W in formulae (7) and (8) are the same as in formula (1).

In resin mixture (A-2), the weight ratio between the resin containing a structure represented by formula (7) and the resin containing a structure represented by formula (8) is preferably from 5:95 to 95:5, more preferably from 35:65 to 90:10 in light of film properties after curing and alkali solubility, still more preferably from 40:60 to 80:20 in light of film properties after curing, pattern profile and alkali solubility.

In view of heat resistance and lithography performance, the resin mixture containing structures represented by formulae (7) and (8) is preferably a resin mixture containing structures represented by following formula (15) and following formula (8a):

[Chem. 44]

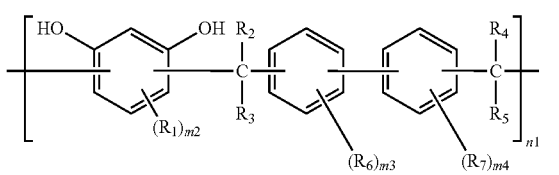
(15)

[Chem. 45]

(8a)

{in formulae (15) and (8a), m$_1$ is from 1 to 3; each m$_2$ is independently an integer of 0 to 2; each of m$_3$ and m$_4$ is independently an integer of 0 to 4; each of n$_1$ and n$_2$ is independently an integer of 1 to 500; each $R_1$ is independently a monovalent group having a carbon number of 1 to 10 selected from a hydrocarbon group and an alkoxy group; when $m_2$ is 2, the plurality of $R_1$ may be the same as or different from each other; each $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; each of $R_6$ and $R_7$ is independently a halogen atom, a hydroxyl group or a monovalent organic group; when $m_3$ is from 2 to 4, the plurality of $R_6$ may be the same as or different from each other; when $m_4$ is an integer of 2 to 4, the plurality of $R_7$ may be the same as or different from each other; Y is a methylene group or a structure represented by following formula (16); and the weight ratio of the resins containing structures represented by formulae (15) and (8a) is from 35:65 to 80:20}:

[Chem. 46]

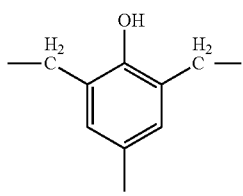

(16)

In the embodiment, resin mixture (A-2) is a resin mixture including a resin containing a structure represented by following formula (9) and a resin containing a structure represented by following formula (10):

[Chem. 47]

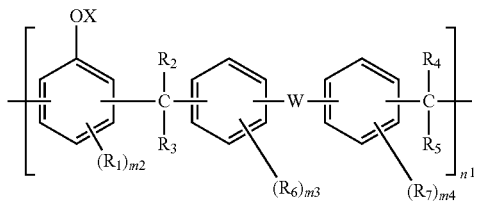

(9)

[Chem. 48]

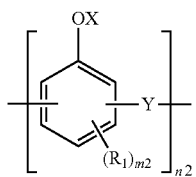

(10)

{in formulae (9) and (10), each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group; each $m_2$ is independently an integer of 0 to 2, provided that the plurality of $m_2$ are not 0 at the same time; each of $n_1$ and $n_2$ is independently an integer of 1 to 500; each $R_1$ is independently a monovalent group selected from the group consisting of a nitro group, a cyano group, a group represented by formula (5), and a group represented by formula (6); when $m_2$ is 2, the plurality of $R_1$ may be the same as or different from each other; each of $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; each of $R_6$ and $R_7$ is independently a halogen atom, a hydroxyl group or a monovalent organic group; when $m_3$ is an integer of 2 to 4, the plurality of $R_6$ may be the same as or different from each other; when $m_4$ is an integer of 2 to 4, the plurality of $R_7$ may be the same as or different from each other; Y is a divalent organic group represented by formula (3) or (4); W is a divalent group selected from the group consisting of a single bond, a chain aliphatic group having a carbon number of 1 to 10, a chain aliphatic group having a carbon number of 1 to 10, in which some hydrogen atoms or all hydrogen atoms are substituted with a fluorine atom, an alicyclic group having a carbon number of 3 to 20, an alicyclic group having a carbon number of 3 to 20, in which some hydrogen atoms or all hydrogen atoms are substituted with a fluorine atom, an alkylene oxide group having from 1 to 20 repeating units, and groups represented by following formula (2):

[Chem. 49]

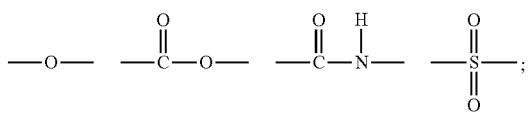

(2)

and the weight ratio between the resin containing the structure represented by formula (9) and the resin containing the structure represented by formula (10) is from 5:95 to 95:5}.

In formulae (9) and (10), each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group. In view of sensitivity, X is preferably a hydrogen atom, a tert-butoxycarbonyl group, a tert-butoxycarbonylmethyl group, a tetrahydropyranyl group, or a tetrahydrofuranyl group, and in view of heat resistance, more preferably a hydrogen atom.

In formulae (9) and (10), the value of $m_2$ is preferably 1 in light of reactivity during the polymer synthesis.

Preferable ranges or embodiments of $m_3$, $m_4$, $R_1$ to $R_7$, W and Y in formula (9) and (10) are the same as in formula (1).

The weight ratio between the resin containing a structure represented by formula (9) and the resin containing a structure represented by formula (10) is from 5:95 to 95:5, preferably from 35:65 to 90:10 in light of film properties after curing and alkali solubility, more preferably from 40:60 to 80:20 in light of film properties after curing, pattern profile and alkali solubility.

The resin containing a structure represented by formula (1), (7), (8), (9), (10), (13) or (15) is not limited as long as it has the structure represented by the formula above in the resin structure. The structure of the resin may be a phenolic resin structure alone or a copolymer with a resin, such as alkali-soluble polyimide, polyimide precursor, polybenzoxazole precursor, polyhydroxystyrene, etc. In view of transparency of the resin, the structure is preferably a phenolic resin alone.

In the embodiment of the present invention, the resin containing a structure represented by following formula (17) or (18) can be also provided by itself or in the form of a photosensitive resin composition:

[Chem. 50]

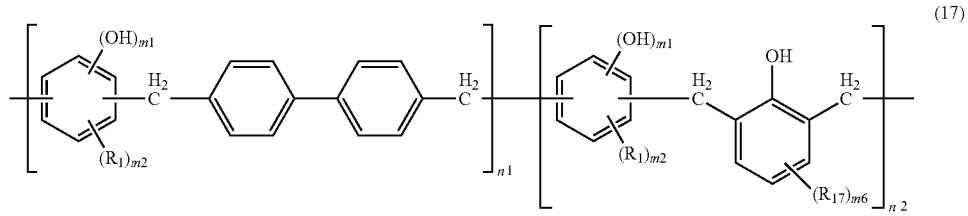

(17)

{in formula (17), each of $R_1$ and $R_{17}$ is independently a monovalent group having a carbon number of 1 to 10 selected from a hydrocarbon group and an alkoxy group; $m_1$ is an integer of 2 or 3; each of $m_2$ and $m_6$ is independently an integer of 0 to 2, and $2 \leq m_1+m_2 \leq 4$; each of $n_1$ and $n_2$ is independently an integer of 1 to 500 and satisfies $0.05 \leq n_1/(n_1+n_2) \leq 1$; when $m_2$ is 2, the plurality of $R_1$ may be the same or different; and the polymer structure may be a random structure or a block structure};

[Chem. 51]

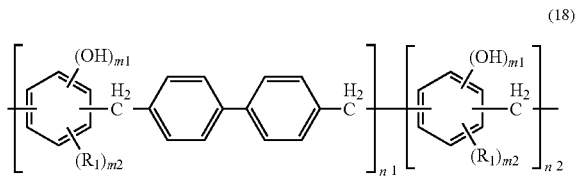

(18)

{in formula (18), each $R_1$ is independently a monovalent group having a carbon number of 1 to 10 selected from a hydrocarbon group and an alkoxy group; $m_1$ is an integer of 2 or 3, $m_2$ is an integer of 0 to 2, each of $n_1$ and $n_2$ is independently an integer of 1 to 500, and $m_1$, $m_2$, $n_1$ and $n_2$ satisfy $2 \leq m_1+m_2 \leq 4$ and $0.35 \leq n_1/(n_1+n_2) \leq 0.95$; when $m_2$ is 2, the plurality of $R_1$ may be the same or different; and the polymer structure may be a random structure or a block structure}.

In formula (17), $m_1$ is not limited as long as it is an integer of 2 or 3. Among others, in view of lithography performance, $m_1$ is preferably 2.

In formula (17), $R_1$ and $R_{17}$ are not limited as long as each is independently a group having a carbon number of 1 to 10 selected from a hydrocarbon group and an alkoxy group. In view of heat resistance, each is preferably a hydrocarbon group having a carbon number of 1 to 3.

In formula (17), $m_2$ and $m_6$ are not limited as long as each is independently an integer of 0 to 2. Among others, in view of heat resistance, $m_2$ is preferably 0, and $m_6$ is preferably 0 or 1.

In formula (17), $n_1$ and $n_2$ are not limited as long as each is independently an integer of 1 to 500 and satisfies $0.05 \leq n_1/(n_1+n_2) \leq 1$. In view of light of film properties, $0.35 \leq n_1/(n_1+n_2) \leq 0.9$ is preferable after curing and alkali solubility, and $0.4 \leq n_1/(n_1+n_2) \leq 0.8$ is more preferred in light of film properties after curing, pattern profile and alkali solubility.

In a case of $0.9 < n_1/(n_1+n_2) \leq 1$, $m_2$ is preferably 1, and $R_1$ is preferably an electron-withdrawing group.

In formula (18), $m_1$ is not limited as long as it is an integer of 2 or 3. In view of lithography performance, $m_1$ is preferably 2.

In formula (18), $R_1$ is not limited as long as each of $R_1$ is independently a group having a carbon number of 1 to 10 selected from a hydrocarbon group and an alkoxy group. Among others, in view of heat resistance, each of $R_1$ is preferably a hydrocarbon group having a carbon number of 1 to 3.

In formula (17), the value of $m_2$ is not limited as long as it is an integer of 0 to 2. In view of heat resistance, $m_2$ is preferably 0.

In formula (18), $n_1$ and $n_2$ are not limited as long as each is independently an integer of 1 to 500 and satisfies $0.35 \leq n_1/(n_1+n_2) \leq 0.95$. In view of light of film properties, $0.4 \leq n_1/(n_1+n_2) \leq 0.8$ is preferred after curing, pattern profile and alkali solubility.

In the embodiment, a resin containing a structure represented by following formula (19) may also be used as resin (A-1):

[Chem. 52]

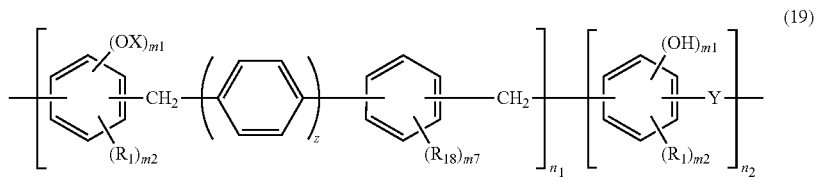

(19)

{in formula (19), each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group; each $m_1$ is independently an integer of 1 to 3, each $m_2$ is independently an integer of 1 to 2, and $2 \leq (m_1+m_2) \leq 4$; each of $n_1$ and $n_2$ is independently an integer of 1 to 500, and $n_1/(n_1+n_2)$ is from 0.05 to 1; each $R_1$ is independently a monovalent group selected from the group consisting of a nitro group, a cyano group, a group represented by formula (5), and a group represented by formula (6); when $m_2$ is 2, the plurality of $R_1$ may be the same as or different from each other; $m_7$ is an integer of 0 to 2; $R_{18}$ is a hydroxyl group or a methyl group; when $m_7=2$, the plurality of $R_{18}$ may be the same as or different from each other; z is an integer of 0 or 1; Y is a methylene group or a structure represented by formula (16); and the polymer structure may be a random structure or a block structure}.

In view of sensitivity, X is preferably a hydrogen atom, a tert-butoxycarbonyl group, a tert-butoxycarbonylmethyl group, a tetrahydropyranyl group, or a tetrahydrofuranyl group, and in view of heat resistance, is more preferably a hydrogen atom.

$R_1$ is not limited as long as it is a monovalent group selected from a nitro group, a cyano group, a group represented by formula (5), and a group represented by formula (6). From the standpoint that little by-product is produced during the polymer synthesis, $R_1$ is preferably a monovalent group represented by formula (5).

Furthermore, from the standpoint that the alkali solubility is easily controlled, $R_{15}$ is more preferably a group represented by —O—$R_{19}$.

$m_1$ is not limited as long as it is an integer of 1 to 3. Among others, in view of alkali solubility and cured relief pattern profile, in particular, in view of lithography, $m_1$ is preferably 2 or 3.

$m_2$ is not limited as long as it is an integer of 1 to 2. Among others, in view of reactivity in the polymer synthesis, $m_2$ is preferably 1.

z is not limited as long as it is an integer of 0 or 1. In view of elongation, z is preferably 1.

Typically, the resin constituting resin (A-1) or resin mixture (A-2) can be synthesized by polymerization reaction of a phenolic compound and a polymerization component. Specifically, the polymerization component includes a component containing one or more kinds of compounds selected from the group consisting of a compound having two methylol groups in the molecule, a compound having two alkoxymethyl groups in the molecule, a compound having two haloalkyl groups in the molecule, and a compound having an aldehyde group. More typically, the polymerization component is preferably a component consisting of at least one compound thereof. For example, a phenolic compound is subjected to a polymerization reaction with one or more kinds of compounds selected from the group consisting of a compound having two methylol groups in the molecule, a compound having two alkoxymethyl groups in the molecule, a compound having two haloalkyl groups in the molecule, and a compound having an aldehyde group, whereby phenolic resin (A-1) can be obtained. In view of reaction control and stability of phenolic resin (A-1) and photosensitive resin composition obtained, the molar ratio between the phenolic compound charged and the polymerization component charged is preferably from 5:1 to 1.01:1, more preferably from 2.5:1 to 1.1:1.

In the embodiment, the phenolic compound used for the synthesis of the resin constituting resin (A-1) or resin mixture (A-2) is described. The phenolic compound includes monohydric to trihydric phenols and is preferably a dihydric phenol or a trihydric phenol.

In the description of the present invention, the monohydric phenol indicates a compound in which one hydroxyl group is bonded directly to a benzene ring. Specifically, the monohydric phenol includes, for example, phenol and a phenol in which a hydrogen atom on an aromatic ring is substituted with an alkyl or alkoxy group having a carbon number of 1 to 10, and in view of thermal expansion coefficient after curing, phenol or cresol is preferred.

In the description of the present invention, the dihydric phenol indicates a compound in which two hydroxyl groups are bonded directed to a benzene ring. Specifically, the dihydric phenol includes, for example, resorcin, hydroquinone, catechol, etc. One of these dihydric phenols may be used alone, or two or more thereof may be used in combination. In view of alkali solubility and interaction with diazonaphthoquinone, resorcin is preferred.

Furthermore, the dihydric phenol may be a compound in which a hydrogen atom on an aromatic ring is substituted for by an alkyl or alkoxy group having a carbon number of 1 to 10, and in view of thermal expansion coefficient after curing, an unsubstituted dihydric phenol is preferred.

In the description of the present invention, the trihydric phenol indicates a compound in which three hydroxyl groups are bonded directly to a benzene ring. Specifically, the trihydric phenol includes, for example, pyrogallol, phloroglucinol, 1,2,4-trihydroxybenzene, etc. One of these trihydric phenols may be used alone, or two or more thereof may be used in combination. In view of lithography performance, pyrogallol is preferred.

Furthermore, the trihydric phenol may be a compound in which a hydrogen atom on an aromatic ring is substituted with an alkyl or alkoxy group having a carbon number of 1 to 10, and in view of thermal expansion coefficient after curing, an unsubstituted trihydric phenol is preferable.

In the case where $R_1$ in formula (1) is an electron-withdrawing group, the electron-withdrawing group is not limited as long as it is a nitro group, a cyano group, or a structure represented by following formula (5) or (6):

[Chem. 53]

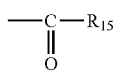

(5)

{in formula (5), $R_{15}$ is a monovalent group selected from the group consisting of a hydroxyl group, an aliphatic group having a carbon number of 1 to 12, an alicyclic group having a carbon number of 3 to 12, an aromatic group having a carbon number of 6 to 18, —$NH_2$, and groups represented by —NH—$R_{19}$, —N($R_{19}$)$_2$ and —O—$R_{19}$ (wherein $R_{19}$ is a monovalent group selected from an aliphatic group having a carbon number of 1 to 12, an alicyclic group having a carbon number of 3 to 12, and an aromatic group having a carbon number of 6 to 18)};

[Chem. 54]

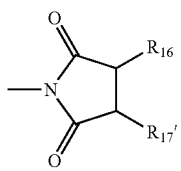

(6)

{in formula (6), each of $R_{16}$ and $R_{17}'$ is independently a monovalent group selected from the group consisting of a hydrogen atom, an aliphatic group having a carbon number of 1 to 12, an alicyclic group having a carbon number of 3 to 12, and an aromatic group having a carbon number of 6 to 18, and $R_{16}$ and $R_{17}'$ may form a ring}.

Among others, from the standpoint that a by-product is little produced during the polymer synthesis, $R_{15}$ is preferably a monovalent group selected from the group consisting of a hydroxyl group, —$NH_2$, and groups represented by —NH—$R_{19}$, —N($R_{19}$)$_2$ and —O—$R_{19}$, wherein $R_{19}$ is a monovalent group selected from an aliphatic group having a carbon number of 1 to 12, an alicyclic group having a carbon number of 3 to 12, and an aromatic group having a carbon number of 6 to 18.

From the standpoint that the alkali solubility is also easily controlled, $R_{15}$ is more preferably a monovalent group selected from the group consisting of groups represented by —O—$R_{19}$, wherein $R_{19}$ is a monovalent group selected from an aliphatic group having a carbon number of 1 to 12, an alicyclic group having a carbon number of 3 to 12, and an aromatic group having a carbon number of 6 to 18.

The phenolic compound used for the synthesis of the above-described phenolic resin includes the following.

When $R_1$ is a nitro group, the phenolic compound includes 2-nitrophenol, 3-nitrophenol, 4-nitrophenol, 4-nitrocatechol, 2-nitroresorcinol, etc.

When $R_1$ is a cyano group the phenolic compound includes 2-cyanophenol, 3-cyanophenol, 4-cyanophenol, 4-cyanocatechol, etc.

In the case where $R_1$ is represented by formula (5), specific examples of the phenolic compound in which the number $m_1$ of phenolic hydroxyl groups is 1 include 2-hydroxybenzoic acid, 3-hydroxybenzoic acid, 4-hydroxybenzoic acid, 3-hydroxy-2-methylbenzoic acid, 3-hydroxy-4-methylbenzoic acid, 4-hydroxy-2-methylbenzoic acid, 4-hydroxy-3-methylbenzoic acid, 4-hydroxy-3,5-dimethylbenzoic acid, 4-hydroxyisophthalic acid, 5-hydroxyisophthalic acid, methyl 2-hydroxybenzoate, methyl 3-hydroxybenzoate, methyl 4-hydroxybenzoate, methyl 2-hydroxy-4-methylbenzoate, methyl 2-hydroxy-5-methylbenzoate, ethyl 2-hydroxybenzoate, ethyl 3-hydroxybenzoate, ethyl 4-hydroxybenzoate, ethyl 2-hydroxy-6-methylbenzoate, propyl 2-hydroxybenzoate, isopropyl 2-hydroxybenzoate, propyl 4-hydroxybenzoate, isopropyl 4-hydroxybenzoate, butyl 2-hydroxybenzoate, isobutyl 2-hydroxybenzoate, butyl 4-hydroxybenzoate, sec-butyl 4-hydroxybenzoate, isobutyl 4-hydroxybenzoate, isoamyl 2-hydroxybenzoate, amyl 4-hydroxybenzoate, isoamyl 4-hydroxybenzoate, hexyl 4-hydroxybenzoate, heptyl 4-hydroxybenzoate, 2-ethylhexyl salicylate, 2-ethylhexyl 4-hydroxybenzoate, nonyl 4-hydroxybenzoate, dodecyl 4-hydroxybenzoate, 3,3,5-trimethylcyclohexyl salicylate, benzyl 2-hydroxybenzoate, benzyl 4-hydroxybenzoate, 2-hydroxybenzamide, 4-hydroxybenzamide, 2-hydroxyacetophenone, 4-hydroxyacetophenone, 2-hydroxy-5-methylacetophenone, 4-hydroxy-3-methylacetophenone, 2-hydroxypropiophenone, 4-hydroxypropiophenone, 2-hydroxybenzophenone, 4-hydroxybenzophenone, 2-hydroxy-5-methylbenzophenone, etc.

In the case where $R_1$ is represented by formula (5), specific examples of the phenolic compound in which the number $m_1$ of phenolic hydroxyl groups is 2 include 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2,6-dihydroxy-4-methylbenzoic acid, 2,5-dihydroxyterephthalic acid, methyl 2,3-dihydroxybenzoate, methyl 2,4-dihydroxybenzoate, methyl 2,5-dihydroxybenzoate, methyl 2,6-dihydroxybenzoate, methyl 3,4-dihydroxybenzoate, methyl 3,5-dihydroxybenzoate, ethyl 3,4-dihydroxybenzoate, ethyl 2,4-dihydroxy-6-methylbenzoate, 2,4-dihydroxybenzamide, 3,5-dihydroxybenzamide, 2,4-dihydroxyacetophenone, 2,5-dihydroxyacetophenone, 2,6-dihydroxyacetophenone, 3,4-dihydroxyacetophenone, 3,5-dihydroxyacetophenone, 2,4-dihydroxypropiophenone, 2,4-dihydroxybenzophenone, 3,4-dihydroxybenzophenone, etc.

In the case where $R_1$ is represented by formula (5), specific examples of the phenolic compound in which the number $m_1$ of phenolic hydroxyl groups is 3 include 2,3,4-trihydroxybenzoic acid, 2,4,6-trihydroxybenzoic acid, gallic acid (3,4,5-trihydroxybenzoic acid), methyl gallate, ethyl gallate, propyl gallate, butyl gallate, isoamyl gallate, octyl gallate, dodecyl gallate, 2,3,4-trihydroxyacetophenone, 2,4,6-trihydroxyacetophenone, 2,3,4-trihydroxybenzophenone, etc.

In the case where $R_1$ is represented by formula (6), specific examples of the phenolic compound include N-(hydroxyphenyl)-5-norbornene-2,3-dicarboxyimide, N-(hydroxyphenyl)-5-methyl-5-norbornene-2,3-dicarboxyimide, N-(dihydroxyphenyl)-5-norbornene-2,3-dicarboxyimide, N-(dihydroxyphenyl)-5-methyl-5-norbornene-2,3-dicarboxyimide, etc.

In the case where $R_1$ is an electron-withdrawing group, $m_2$ in formula (1) is an integer of 1 to 3, and in view of reactivity in the polymer synthesis, is preferably 1 or 2, more preferably 1.

The polymerization component used for the synthesis of the resin constituting resin (A-1) or resin mixture (A-2) is described below.

The compound having two methylol groups in the molecule includes, for example, bis(hydroxymethyl)diphenyl ether, bis(hydroxymethyl)benzophenone, hydroxymethylphenyl hydroxymethylbenzoate, bis(hydroxymethyl)biphenyl, dimethylbis(hydroxymethyl)biphenyl, etc. In view of reactivity and mechanical properties of phenolic resin (A-1) obtained, a compound having a biphenyldiyl skeleton is preferred, and 4,4'-bis(hydroxymethyl)biphenyl is more preferred.

The compound having two alkoxymethyl groups in the molecule includes, for example, bis(methoxymethyl)diphenyl ether, bis(methoxymethyl)benzophenone, methoxymethylphenyl methoxymethylbenzoate, bis(methoxymethyl) biphenyl, dimethylbis(methoxymethyl)biphenyl, etc. The carbon number of the alkoxy moiety in the alkoxymethyl group is, in view of reaction activity, preferably from 1 to 4, more preferably 1 or 2, and most preferably 1.

The compound having two haloalkyl groups in the molecule includes, for example, bischloromethylbiphenyl, etc.

Specific examples of the compound having an aldehyde group include formaldehyde, paraformaldehyde, acetaldehyde, propionaldehyde, cyclopropanecarboxyaldehyde, pivalaldehyde, butylaldehyde, isobutylaldehyde, pentanal, 2-methylbutylaldehyde, isovaleraldehyde, hexanal, methylvaleraldehyde, 2-methylvaleraldehyde, 2-ethylbutylaldehyde, 3,3-dimethylbutylaldehyde, cyclohexylaldehyde, heptanal, octanal, 2-ethylhexylaldehyde, nonanal, 3,5,5-trimethylhexanaldehyde, decanal, undecanal, dodecanal, acrolein, crotonaldehyde, 3-methyl-2-butenal, tiglinaldehyde, 3-cyclohexene-1-carboxyaldehyde, 2-nonenal, 10-undecenal, 5-norbornenecarboxyaldehyde, perillaldehyde, citral, citronellal, benzaldehyde, ortho-tolualdehyde, meta-tolualdehyde, para-tolualdehyde, phenylacetaldehyde, diphenylacetaldehyde, naphthaldehyde, cinnamaldehyde glycolaldehyde, lactaldehyde, salicylaldehyde, 5-methylsalicylaldehyde, 3-hydroxybenzaldehyde, 4-hydroxybenzaldehyde, 4-hydroxy-3,5-dimethylbenzaldehyde, 2,3-dihydroxybenzaldehyde, 2,4-dihydroxybenzaldehyde, 2,5-dihydroxybenzaldehyde, 3,4-dihydroxybenzaldehyde, 2,3,4-trihydroxybenzaldehyde, 2,4,5-trihydroxybenzaldehyde, 2,4,6-trihydroxybenzaldehyde, 3,4,5-trihydroxybenzaldehyde, vanillin, ethylvanillin, ortho-anisaldehyde, meta-anisaldehyde, para-anisaldehyde, furfural, hydroxymethylfurfural, glyoxylic acid, succinmonoaldehyde, traumatin, etc.

In view of heat resistance and synthesis control, the compound is preferably formaldehyde, acetaldehyde, propionaldehyde, pivalaldehyde, butylaldehyde, isobutylaldehyde, 5-norbornene-2-carboxyaldehyde, perillaldehyde, salicylaldehyde, 5-methylsalicylaldehyde, 3-hydroxybenzaldehyde, 4-hydroxybenzaldehyde, or 4-hydroxy-3,5-dimethylbenzaldehyde.

In view of photosensitivity during pattern formation, the compound is more preferably formaldehyde, acetaldehyde, propionaldehyde, pivalaldehyde, butylaldehyde, or isobutylaldehyde.

A typical synthesis method of the resin constituting phenolic resin (A-1) or resin mixture (A-2) is described in detail below. The above-described phenolic compound and the above-described polymerization component are heated and stirred in the presence of an appropriate polymerization catalyst, whereby the resin constituting phenolic resin (A-1) or resin mixture (A-2) can be obtained. The polymerization catalyst is not particularly limited but includes, for example, an acidic catalyst, an alkaline catalyst, etc., with an acidic catalyst being preferred. The acidic catalyst includes, for example, an inorganic acid, such as hydrochloric acid, sulfuric acid, phosphonic acid, etc.; an organic acid, such as methanesulfonic acid, p-toluenesulfonic acid, oxalic acid, etc.; a Lewis acid, such as boron trifluoride, anhydrous aluminum chloride, zinc chloride, etc.; and diethyl sulfate. The amount of the acidic catalyst used is preferably from 0.01 to 100 mol % based on the molar number of methylol compound, alkoxymethyl compound or haloalkyl compound. The alkaline catalyst includes, for example, lithium hydroxide, sodium hydroxide, potassium hydroxide, calcium hydroxide, barium hydroxide, sodium carbonate, triethylamine, pyridine, 4-N,N-dimethylaminopyridine, piperidine, piperazine, 1,4-diazabicyclo[2.2.2]octane, 1,8-diazabicyclo[5.4.0]-7-undecene, 1,5-diazabicyclo[4.3.0]-5-nonene, ammonia, hexamethylenetetramine, etc. The amount of the alkaline catalyst used is preferably from 0.01 to 100 mol % based on the molar number of methylol compound, alkoxymethyl compound or haloalkyl compound.

If necessary, an organic solvent can be used, when carrying out the synthesis reaction of the resin constituting resin (A-1) or resin mixture (A-2). Specific examples of the organic solvent which can be used include, although are not particularly limited to, bis(2-methoxyethyl)ether, methyl cellosolve, ethyl cellosolve, triethylene glycol monomethyl ether, propylene glycol monomethyl ether, propylene glycol monomethyl ether acetate, diethylene glycol dimethyl ether, dipropylene glycol dimethyl ether, cyclohexanone, cyclopentanone, toluene, xylene, γ-butyrolactone, N-methyl-2-pyrrolidone, tetrahydrofurfuryl alcohol, etc. The amount of the organic solvent used is usually from 10 to 1,000 parts by mass, preferably from 20 to 500 parts by mass, per 100 parts by mass as the total mass of raw materials charged. In addition, in the synthesis reaction of phenolic resin (A-1), the reaction temperature is usually from 20 to 250° C., preferably from 40 to 200° C., and the reaction time is usually from 1 to 20 hours.

The weight average molecular weight of the resin constituting resin (A-1) or resin mixture (A-2) is preferably from 2,000 to 200,000, more preferably from 3,000 to 120,000, still more preferably from 4,000 to 50,000. The weight average molecular weight is preferably 2,000 or more in light of elongation and is preferably 200,000 or less in light of alkali solubility.

The weight average molecular weight is a value obtained in terms of standard polystyrene by using gel permeation chromatography (hereinafter, referred to as "GPC").

As the method of substituting some hydrogen atoms or all hydrogen atoms of the phenolic hydroxyl group of the resin constituting resin (A-1) or resin mixture (A-2) with a protective group for the phenolic hydroxyl group, conventionally known methods may be used (see T. W. Greene, "Productive Groups in Organic Synthesis", John Wiley & Sons (1981)).

Resin (A-1) in which some hydrogen atoms or all hydrogen atoms of the hydroxyl group in the phenolic resin obtained above are substituted with the protective group is used in combination with the later-described photoacid generator (B), and the protective group is desorbed due to an acid generated in the exposed area to increase the solubility in an alkali solution, whereby a relief pattern can be formed.

The photosensitive resin composition may also further contain resins soluble in an aqueous alkali solution, other than the resin constituting resin (A-1) and resin mixture (A-2), as long as they do not adversely affect the effects of the present invention. The other resin soluble in an aqueous alkali solution specifically includes, for example, a novolak resin, a polyhydroxystyrene-based resin, polyamide, polyimide, and derivatives, precursors and copolymers of these resins.

Incidentally, in the case where the resin constituting resin (A-1) or resin mixture (A-2) is used by mixing it with the other resin soluble in an aqueous alkali solution, the content of the resin constituting resin (A-1) or resin mixture (A-2) in the mixed resin composition is, in view of elongation, preferably 50 mass % or more, more preferably 60 mass % or more.

[Photoacid Generator (B)]

In the embodiment, the photosensitive resin composition is not particularly limited as long as it is a composition capable of forming a resin pattern in response to an actinic ray (radiation) typified by ultraviolet ray, electron beam, X-ray, etc., and the composition may be a photosensitive resin composition of either a negative type (the non-irradiated area is dissolved out by development) or a positive type (the irradiated area is dissolved out by development).

In the case of using the photosensitive resin composition as a negative-type composition, the photoacid generator (B) is a compound capable of generating an acid upon irradiation with radiation, and the acid generated causes a cross-linking reaction between the resin constituting resin (A-1) or resin mixture (A-2) and other components, so that the crosslinking product can be insoluble in a developer. The compound includes, for example, the following compounds:
(i) Trichloromethyl-s-triazines tris(2,4,6-trichloromethyl)-s-triazine, 2-phenyl-bis(4,6-trichloromethyl)-s-triazine, 2-(3-chlorophenyl)-bis(4,6-trichloromethyl)-s-triazine, 2-(2-chlorophenyl)-bis(4,6-trichloromethyl)-s-triazine, 2-(4-methoxyphenyl)-bis(4,6-trichloromethyl)-s-triazine, 2-(3-methoxyphenyl)-bis(4,6-trichloromethyl)-s-triazine, 2-(2-methoxyphenyl)-bis(4,6-trichloromethyl)-s-triazine, 2-(4-methylthiophenyl)-bis(4,6-trichloromethyl)-s-triazine, 2-(3-methylthiophenyl)bis(4,6-trichloromethyl)-s-triazine, 2-(2-methylthiophenyl)-bis(4,6-trichloromethyl)-s-triazine, 2-(4-methoxynaphthyl)-bis(4,6-trichloromethyl)-s-triazine, 2-(3-methoxynaphthyl)-bis(4,6-trichloromethyl)-s-triazine, 2-(2-methoxynaphthyl)-bis(4,6-trichloromethyl)-s-triazine, 2-(3,4,5-trimethoxy-β-styryl)-bis(4,6-trichloromethyl)-s-triazine, 2-(4-methylthio-β-styryl)-bis(4,6-trichloromethyl)-s-triazine, 2-(3-methylthio-β-styryl)-bis(4,6-trichloromethyl)-s-triazine, 2-(2-methylthio-β-styryl)-bis(4,6-trichloromethyl)-s-triazine, etc.;

(ii) Diaryliodonium Salts diphenyliodonium tetrafluoroborate, diphenyliodonium tetrafluorophosphate, diphenyliodonium tetrafluoroarsenate, diphenyliodonium trifluoromethanesulfonate, diphenyliodonium trifluoroacetate, diphenyliodonium p-toluenesulfonate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethanesulfonate, 4-methoxyphenylphenyliodonium trifluoroacetate, 4-methoxyphenylphenyliodonium p-toluenesulfonate, bis(4-ter-butylphenyl)iodonium tetrafluoroborate, bis(4-ter-butylphenyl)iodonium hexafluoroarsenate, bis(4-ter-butylphenyl)iodonium trifluoromethanesulfonate, bis(4-ter-butylphenyl)iodonium trifluoroacetate, bis(4-ter-butylphenyl)iodonium p-toluenesulfonate, etc.; and (iii) Triarylsulfonium Salts triphenylsulfonium tetrafluoroborate, triphenylsulfonium hexafluorophosphonate, triphenylsulfonium hexafluoroarsenate, triphenylsulfonium methanesulfonate, triphenylsulfonium trifluoroacetate, triphenylsulfonium p-toluenesulfonate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium methanesulfonate, 4-methoxyphenyldiphenylsulfonium trifluoroacetate, 4-methoxyphenyldiphenylsulfonium p-toluenesulfonate, 4-phenylthiophenyldiphenyl tetrafluoroborate, 4-phenylthiophenyldiphenyl hexafluorophosphonate, 4-phenylthiophenyldiphenyl hexafluoroarsenate, 4-phenylthiophenyldiphenyl trifluoromethanesulfonate, 4-phenylthiophenyldiphenyl trifluoroacetate, 4-phenylthiophenyldiphenyl-p-toluenesulfonate, etc.

Among the compounds of (i) to (iii), preferable trichloromethyl-s-triazines are 2-(3-chlorophenyl)-bis(4,6-trichloromethyl)-s-triazine, 2-(4-chlorophenyl)-bis(4,6-trichloromethyl)-s-triazine, 2-(4-methylthiophenyl)-bis(4,6-trichloromethyl)-s-triazine, 2-(4-methoxy-β-styryl)-bis(4,6-trichloromethyl)-s-triazine, 2-(4-methoxynaphthyl)-bis(4,6-trichloromethyl)-s-triazine, etc.; preferable diaryliodonium salts are diphenyliodonium trifluoroacetate, diphenyliodonium trifluoromethanesulfonate, 4-methoxyphenylphenyliodonium trifluoromethanesulfonate, 4-methoxyphenylphenyliodonium trifluoroacetate, etc.; and preferable triarylsulfonium salts are triphenylsulfonium methanesulfonate, triphenylsulfonium trifluoroacetate, 4-methoxyphenyldiphenylsulfonium methanesulfonate, 4-methoxyphenyldiphenylsulfonium trifluoroacetate, 4-phenylthiophenyldiphenyl trifluoromethanesulfonate, 4-phenylthiophenyldiphenyl trifluoroacetate, etc.

Other than the compounds of (i) to (iii), the following compounds may also be used as photoacid generator (B):

(1) Diazo Ketone Compound

The diazo ketone compound includes, for example, a 1,3-diketo-2-diazo compound, a diazobenzoquinone compound, a diazonaphthoquinone compound, etc., and specific examples thereof include 1,2-naphthoquinonediazide-4-sulfonate compounds of phenols.

(2) Sulfone Compound

The sulfone compound includes, for example, a β-ketosulfone compound, a β-sulfonylsulfone compound, and an α-diazo compound thereof. Specific examples thereof include 4-trisphenacylsulfone, mesitylphenacylsulfone, bis(phenacylsulfonyl)methane, etc.

(3) Sulfonic Acid Compound

The sulfonic acid compound includes, for example, alkylsulfonic acid esters, haloalkylsulfonic acid esters, arylsulfonic acid esters, iminosulfonates, etc. Specific preferable examples of the sulfonic acid compound include benzoin tosylate, pyrogallol tristrifluoromethanesulfonate, o-nitrobenzyl trifluoromethanesulfonate, o-nitrobenzyl p-toluenesulfonate, etc.

(4) Sulfonimide Compound

The sulfonimide compound includes, for example, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)naphthylimide, etc.

(5) Oxime Ester Compound

The oxime ester compound specifically includes 2-[2-(4-methylphenylsulfonyloxyimino)]-2,3-dihydrothiophen-3-ylidene]-2-(2-methylphenyl)acetonitrile (trade name: "IRGACURE PAG 121" produced by Ciba Specialty Chemicals Inc.), [2-(propylsulfonyloxyimino)-2,3-dihydrothiophen-3-ylidene]-2-(2-methylphenyl)acetonitrile (trade name: "IRGACURE PAG 103" produced by Ciba Specialty Chemicals Inc.), [2-(n-octanesulfonyloxyimino)-2,3-dihydrothiophen-3-ylidene]-2-(2-methylphenyl)acetonitrile (trade name: "IRGACURE PAG 108" produced by Ciba Specialty Chemicals Inc.), α-(n-octanesulfonyloxyimino)-4-methoxybenzylcyanide (trade name: "CGI 725" produced by Ciba Specialty Chemicals Inc.), etc.

(6) Diazomethane Compound

The diazomethane compound specifically includes bis(trifluoromethylsulfonyl)diazomethane, bis(cyclohexylsulfonyl)diazomethane, bis(phenylsulfonyl)diazomethane, etc.

In view of sensitivity, among others, the oxime ester compound (5) is particularly preferred.

In the case where the photosensitive resin composition containing the resin constituting resin (A-1) or resin mixture (A-2) is of a negative type, the blending amount of photoacid generator (B) is preferably from 0.1 to 50 parts by mass, more preferably from 1 to 40 parts by mass, per 100 parts by mass of the resin constituting resin (A-1) or resin mixture (A-2). When the blending amount is 0.1 parts by mass or more, the effect of improving the sensitivity can be successfully obtained, and when the blending amount is 50 parts by mass or less, the mechanical properties of the cured film are advantageous.

In the case of using the photosensitive resin composition as a positive-type composition, photoacid generators described in (i) to (iii) and (1) to (6) and/or a quinonediazide compound are suitably used. Among these, a quinonediazide compound is preferred in view of physical properties after curing. This is because the quinonediazide compound is thermally decomposed during curing and the amount of the compound remaining in the cured film is very small. The quinonediazide compound includes, for example, compounds having a 1,2-benzoquinonediazide structure or a 1,2-naphthoquinonediazide structure (hereinafter, sometimes referred to as "NQD compound"). These compounds are described in detail, for example, in U.S. Pat. Nos. 2,772,972, 2,797,213, 3,669,658, etc. The NQD compound is at least one compound selected from the group consisting of a 1,2-naphthoquinonediazide-4-sulfonic acid ester of a compound having a plurality of phenolic hydroxyl groups (hereinafter, sometimes referred to as "polyhydroxy compound"), which is described in detail below, and a 1,2-naphthoquinonediazide-5-sulfonic acid ester of the polyhydroxy compound.

The NQD compound is obtained, in a conventional manner, by treating a naphthoquinonediazide sulfonic acid compound with chlorosulfonic acid, thionyl chloride, etc. to form a sulfonyl chloride, and reacting the obtained naphthoquinonediazide sulfonyl chloride with the polyhydroxy compound. For example, a predetermined amount of the polyhydroxy compound and a predetermined amount of 1,2-naphthoquinonediazide-5-sulfonyl chloride or 1,2-naphthoquinonediazide-4-sulfonyl chloride are reacted in a solvent, such as dioxane, acetone, tetrahydrofuran, etc., in the presence of a basic catalyst, such as triethylamine, to carry out esterification, and the obtained product is washed with water and dried, whereby the NQD compound can be obtained.

In view of physical properties of the cured film, such as sensitivity and elongation, the preferable NQD compound includes, for example, compounds represented by the following formula group:

[Chem. 55]

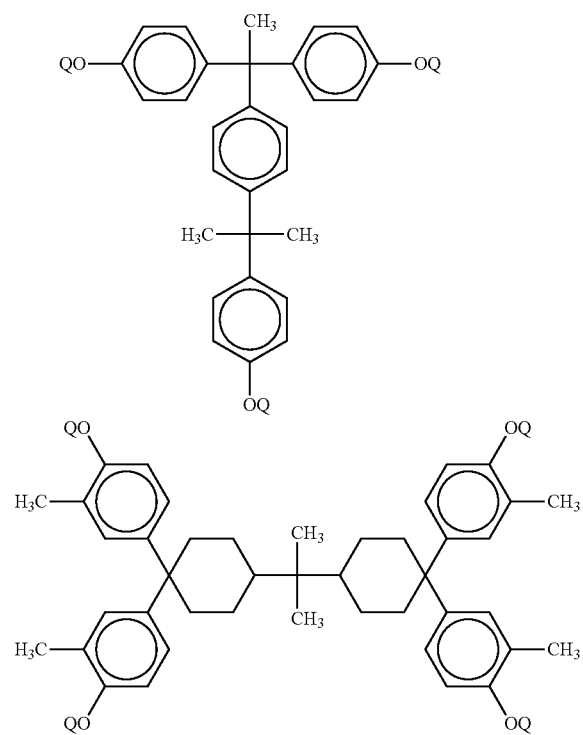

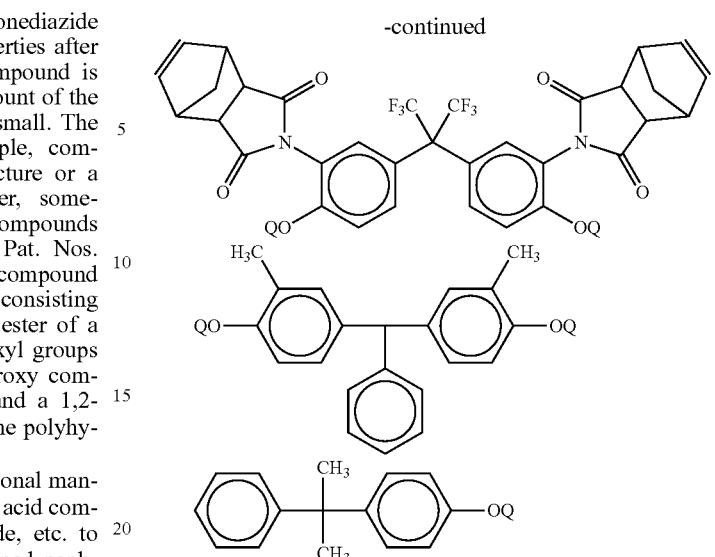

{wherein Q is a hydrogen atom or a naphthoquinonediazide sulfonic acid ester group represented by any one of the following formula group:

[Chem. 56]

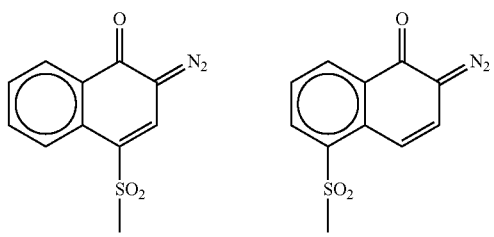

provided that all Q are not hydrogen atoms at the same time}.

In addition, as the NQD compound, a naphthoquinonediazide sulfonyl ester compound having a naphthoquinonediazide-4-sulfonyl group and a naphthoquinonediazide-5-sulfonyl group in the same molecule may also be used, or a mixture of a naphthoquinonediazide-4-sulfonyl ester compound and a naphthoquinonediazide-5-sulfonyl ester compound may also be used.

As the NQD compound, one of the above compounds may be used alone, or two or more of the above compounds may be mixed and used.

In the case where the photosensitive resin composition is of a positive type, the blending amount of photoacid generator (B) in the photosensitive resin composition is from 0.1 to 70 parts by mass, preferably from 1 to 40 parts by mass, more preferably from 5 to 30 parts by mass, per 100 parts by mass of the resin constituting resin (A-1) or resin mixture (A-2). When the blending amount is 0.1 parts by mass, good sensitivity is obtained, and when the blending amount is 70 parts by mass or less, mechanical properties of the cured film are advantageous.

[Crosslinking Agent (C)]

In the embodiment, in order to more improve the thermophysical properties and mechanical properties of the cured product, it is preferable to further blend (C) a crosslinking agent in the photosensitive resin composition.

As the crosslinking agent (C), a known crosslinking agent can be used, and examples thereof include, but are not limited to, an epoxy compound, an oxetane compound, an oxazoline compound, a carbodiimide compound, aldehyde, an aldehyde-modified product, an isocyanate compound, an unsaturated bond-containing compound, a melamine compound, a metal chelating agent, a methylol compound or alkoxymethyl compound represented by following formula (21), an N-methylol compound or N-alkoxymethyl compound having a structure represented by following formula (22), and a compound having a divalent group represented by following formula (23).

Among these, in view of film properties after curing, an epoxy compound, an oxetane compound, an oxazoline compound, an isocyanate compound, a methylol compound or alkoxymethyl compound represented by following formula (21), an N-methylol compound or N-alkoxymethyl compound represented by following formula (22), a divalent group-containing compound having a structure represented by following formula (23), etc., are preferred, and in view of pattern profile after curing, an epoxy compound, an isocyanate compound, an N-methylol compound or N-alkoxymethyl compound having a structure represented by following formula (22), etc., are more preferred:

[Chem. 57]

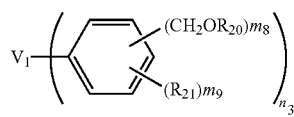
(21)

{in formula (21), $R_{20}$ is a hydrogen atom or a monovalent group selected from the group consisting of a methyl group, an ethyl group, an n-propyl group and an isopropyl group; $R_{21}$ is at least one monovalent group selected from the group consisting of a hydroxyl group, and alkyl group having a carbon number of 1 to 10, an alkoxy group, an ester group and a urethane group; $m_8$ is an integer of 1 to 5, and $m_9$ is an integer of 0 to 4, provided that $1 \leq (m_8+m_9) \leq 5$; $n_3$ is an integer of 1 to 4; $V_1$ is $CH_2OR_{20}$ or $R_{21}$ when $n_3=1$, and is a single bond or a di- to tetravalent organic group when $n_3=2$ to 4; when a plurality of $CH_2OR_{20}$ are present, the plurality of $R_{20}$ may be the same as or different from each other; and when a plurality of $R_{21}$ are present, the plurality of $R_{21}$ may be the same as or different from each other};

[Chem. 58]

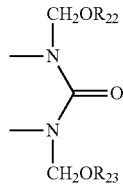
(22)

{in formula (22), each of $R_{22}$ and $R_{23}$ is independently a hydrogen atom or a hydrocarbon group having a carbon number of 1 to 10};

[Chem. 59]

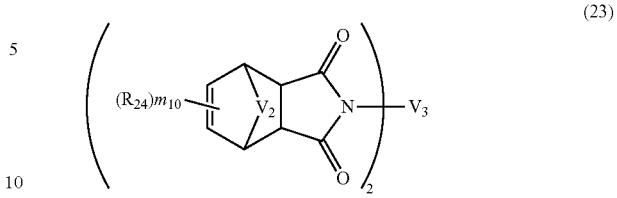
(23)

(in formula (23), $R_{24}$ is a functional group selected from the group consisting of a hydrogen atom, an alkyl group having a carbon number of 1 to 6, and an alkenyl group having a carbon number of 1 to 6, $V_2$ is a divalent group selected from the group consisting of —$CH_2$—, —O— and —S—, $V_3$ is a divalent organic group, $m_{10}$ is an integer of 0 to 4, and when a plurality of $R_{24}$ are present, the plurality of $R_{24}$ may be the same as or different from each other).

Specific preferable examples of the epoxy compound include 1,1,2,2-tetra(p-hydroxyphenyl)ethane tetraglycidyl ether, glycerol triglycidyl ether, ortho-sec-butylphenyl glycidyl ether, 1,6-bis(2,3-epoxypropoxy)naphthalene, diglycerol polyglycidyl ether, polyethylene glycol glycidyl ether, triglycidyl isocyanurate, EPICLON 830, 850, 1050, N-680, N-690, N-695, N-770, HP-7200, HP-820 and EXA-4850-1000 (trade names, produced by DIC Corp.), and DENACOL EX-201, EX-313, EX-314, EX-321, EX-411, EX-511, EX-512, EX-612, EX-614, EX-614B, EX-731, EX-810, EX-911 and EM-150 (trade names, produced by Nagase ChemteX Corporation). Among these, in view of elongation and heat resistance of the obtained heat-cured film, epoxy compounds of EPICLON 830, 850, 1050, N-680, N-690, N-695, N-770, HP-7200, HP-820 and EXA-4850-1000, and DENACOL EX-201, EX-313, EX-314, EX-321, EX-411, EX-511, EX-512, EX-612, EX-614, EX-614B, EX-731, EX-810, EX-911 and EM-150 are preferred.

Specific preferable examples of the oxetane compound include xylylene bisoxetane, 3-ethyl-3{[(3-ethyloxetanyl)methoxy]methyl}oxetane, ETERNACOLL OXBP (trade name, produced by Ube Industries, Ltd.), etc.

Specific preferable examples of the oxazoline compound include 2,2'-bis(2-oxazoline), 2,2'-isopropylidenebis(4-phenyl-2-oxazoline), 1,3-bis(4,5-dihydro-2-oxazolyl)benzene, 1,4-bis(4,5-dihydro-2-oxazolyl)benzene, EPOCROS K-2010E, K-2020E, K-2030E, WS-500, WS-700 and RPS-1005 (trade names, produced by Nippon Shokubai Co., Ltd.), etc. In view of elongation and heat resistance of the obtained heat-cured film, 1,3-bis(4,5-dihydro-2-oxazolyl)benzene is preferred.

Specific preferable examples of the carbodiimide compound include CARBODILITE SV-02, V-01, V-02, V-03, V-04, V-05, V-07, V-09, E-01, E-02 and LA-1 (trade names, produced by Nisshinbo Chemical Inc.), etc.

Specific preferable examples of the isocyanate-based crosslinking agent include 4,4'-diphenylmethane diisocyanate, tolylene diisocyanate, 1,3-phenylenebismethylene diisocyanate, dicyclohexylmethane-4,4'-diisocyanate; isophorone diisocyanate, hexamethylene diisocyanate, TAKENATE 500 and 600, COSMONATE NBDI and ND (trade names, produced by Mitsui Chemicals Inc.), DURANATE 17B-60PX, TPA-B80E, MF-B60X, MF-K60X and E402-B80T (trade names, produced by Asahi Kasei Chemicals Corporation), etc.

Specific examples of the aldehyde and aldehyde-modified product (in the description of the present invention, the modified product indicates a compound capable of decomposing by means of heating to produce an aldehyde) include formaldehyde, glutaraldehyde, hexamethylenetetramine, trioxane, glyoxal, malondialdehyde, succindialdehyde, etc.

Specific preferable examples of the melamine compound, the compound represented by formula (21) and the compound represented by formula (22) include CYMEL 300, 301, 303, 370, 325, 327, 701, 266, 267, 238, 1141, 272, 202, 1156, 1158, 1123, 1170 and 1174, UFR 65 and 300, MYCOAT 102 and 105 (all produced by Mitsui Cytec Ltd.); NIKALAC MX-270, -280 and -290, NIKALAC MS-11, and NIKALAC MW-30, -100, -300, -390 and -750 (all produced by Sanwa Chemical Co., Ltd.); DML-OCHP, DML-MBPC, DML-BPC, DML-PEP, DML-34X, DML-PSBP, DML-PTBP, DML-PCHP, DML-POP, DML-PFP, DML-MBOC, BisCMP-F, DML-BisOC-Z, DML-BisOCHP-Z, DML-BisOC-P, DMOM-PTBT, TMOM-BP, TMOM-BPA, and TML-BPAF-MF (all produced by Honshu Chemical Industry Co., Ltd.); benzenedimethanol, bis(hydroxymethyl)cresol, bis(hydroxymethyl)dimethoxybenzene, bis(hydroxymethyl)diphenyl ether, bis(hydroxymethyl)benzophenone, hydroxymethylphenyl hydroxymethylbenzoate, bis(hydroxymethyl)biphenyl, dimethylbis(hydroxymethyl)biphenyl, bis(methoxymethyl)benzene, bis(methoxymethyl)cresol, bis(methoxymethyl)dimethoxybenzene, bis(methoxymethyl)diphenyl ether, bis(methoxymethyl)benzophenone, methoxymethylphenyl methoxymethylbenzoate, bis(methoxymethyl)biphenyl, dimethylbis(methoxymethyl)biphenyl, etc. Among these, in view of elongation and heat resistance of the obtained heat-cured film, NIKALAC MW-30MH, MW-100LH, BL-60, MX-270, MX-280 and MX-290, CYMEL 300, 303 and 1123, MYCOAT 102 and 105, benzene dimethanol, TMOM-BP, TMOM-BPA, TML-BPAF-MF are preferred.

Specific preferable examples of the unsaturated bond-containing compound include trimethylolpropane trimethacrylate, triallyl 1,3,5-benzenetricarboxylate, triallyl trimellitate, tetraallyl pyromellitate, pentaerythritol triacrylate, pentaerythritol tetraacrylate, dipentaerythritol pentaacrylate, dipentaerythritol hexaacrylate, trimethylolpropane triacrylate, ditrimethylolpropane tetraacrylate, NK ESTER 1G, 2G, 3G, 4G, 9G, 14G, NPG, BPE-100, BPE-200, BPE-500, BPE-1400, A-200, A-400, A-600, TMPT and A-TMM-3 (trade names, produced by Shin-Nakamura Chemical Co., Ltd.), BANI-M, BANI-X (trade names, produced by Maruzen Petrochemical Co., Ltd), etc. In view of elongation and heat resistance of the obtained heat-cured film, trimethylolpropane trimethacrylate, triallyl 1,3,5-benzenetricarboxylate, triallyl trimellitate, tetraallyl pyromellitate, pentaerythritol triacrylate, pentaerythritol tetraacrylate, dipentaerythritol pentaacrylate, dipentaerythritol hexaacrylate, trimethylolpropane triacrylate, ditrimethylolpropane tetraacrylate, BANI-M, and BANI-X are more preferred.

Specific preferably examples of the metal chelating agent include an acetylacetone aluminum(III) salt, an acetylacetone titanium(IV) salt, an acetylacetone chromium(III) salt, an acetylacetone magnesium(II) salt, an acetylacetone nickel(II) salt, a trifluoroacetylacetone aluminum(III) salt, a trifluoroacetylacetone titanium(IV) salt, a trifluoroacetylacetone chromium(III) salt, a trifluoroacetylacetone magnesium(II) salt, a trifluoroacetylacetone nickel(II) salt, etc.

In the embodiment, the blending amount of crosslinking agent (C) in the photosensitive resin composition is preferably from 0.1 to 40 parts by mass, more preferably from 1 to 30 parts by mass, per 100 parts by mass of the resin constituting resin (A-1) or resin mixture (A-2). When the blending amount is 0.1 parts by mass or more, the thermo-physical properties and mechanical strength of the heat-cured film are good, and when the blending amount is 40 parts by mass or less, the stability of composition in the varnish state and the elongation of heat-cured film are advantageous.

Among those crosslinking agents (C), in the case where the resin of this embodiment has a carbonyl group, the polyhydric alcohol compound and polyvalent amine compound can efficiently crosslink resins with each other by means of a nucleophilic substitution reaction to the carbonyl group.

Specific preferable polyhydric alcohol compound and polyvalent amine compound include ethylene glycol, propylene glycol, 1,4-butanediol, 1,6-hexanediol, 1,8-octanediol, 1,12-dodecanediol, glycerol, trimethylolethane, trimethylolpropane, DURANOL T6002, T6001, T5652, T5651, T5650J, T5650E, T4672, T4671, T4692, T4691, G3452 and G3450J (product names, produced by Asahi Kasei Chemicals Corp.), ethylenediamine, 1,3-propanediamine, 1,4-butanediamine, 1,6-hexanediamine, 1,8-octanediamine, 1,12-dodecanediamine, etc.

[Thermal Acid Generator (D)]

From the standpoint that even when the curing temperature is lowered, good thermophysical properties and mechanical properties of the cured product are exhibited, it is preferable to further blend (D) a thermal acid generator in the photosensitive resin composition. Thermal acid generator (D) is a compound capable of generating an acid by heat and accelerating the reaction of crosslinking agent (C). In addition, the temperature at which thermal acid generator (D) generates an acid is preferably from 150 to 250° C.

Specifically, thermal acid generator (D) includes, for example, carboxylic acid esters, such as allyl chloroacetate, n-butyl chloroacetate, t-butyl chloroacetate, ethyl chloroacetate, methyl chloroacetate, benzyl chloroacetate, isopropyl chloroacetate, 2-methoxyethyl chloroacetate, methyl dichloroacetate, methyl trichloroacetate, ethyl trichloroacetate, 2-ethoxyethyl trichloroacetate, t-butyl cyanoacetate, t-butyl methacrylate, ethyl trifluoroacetate, methyl trifluoroacetate, phenyl trifluoroacetate, vinyl trifluoroacetate, isopropyl trifluoroacetate, allyl trifluoroacetate, ethyl benzoate, methyl benzoate, t-butyl benzoate, methyl 2-chlorobenzoate, ethyl 2-chlorobenzoate, ethyl 4-chlorobenzoate, ethyl 2,5-dichlorobenzoate, methyl 2,4-dichlorobenzoate, ethyl p-fluorobenzoate, methyl p-fluorobenzoate, t-butyl pentachlorophenylcarboxylate, methyl pentafluoropropionate, ethyl pentafluoropropionate, t-butyl crotonate, etc.; cyclic carboxylic acid esters, such as phenolphthalein, thimolphthalein, etc.; sulfonic acid esters, such as ethyl methanesulfonate, methyl methanesulfonate, 2-methoxyethyl methanesulfonate, 2-isopropoxyethyl methanesulfonate, methyl benzenesulfonate, phenyl p-toluenesulfonate, ethyl p-toluenesulfonate, methyl p-toluenesulfonate, 2-phenylethyl p-toluenesulfonate, n-propyl p-toluenesulfonate, n-butyl p-toluenesulfonate, t-butyl p-toluenesulfonate, n-hexyl p-toluenesulfonate, n-heptyl p-toluenesulfonate, n-octyl p-toluenesulfonate, 2-methoxyethyl p-toluenesulfonate, propargyl p-toluenesulfonate, 3-butynyl p-toluenesulfonate, ethyl trifluoromethanesulfonate, n-butyl trifluoromethanesulfonate, ethyl perfluorobutanesulfonate, methyl perfluorobutanesulfonate, ethyl perfluorooctanesulfonate, etc.; cyclic sulfonic acid esters, such as 1,4-butanesultone, 2,4-butanesultone, 1,3-propanesultone, phenol red, bromocresol green, bromocresol purple, etc.; and 2-sulfobenzoic anhydride, p-toluenesulfonic anhydride, phthalic anhydride, etc.

Among these thermal acid generators (D), sulfonic acid esters, such as ethyl methanesulfonate, methyl methanesulfonate, 2-methoxyethyl methanesulfonate, 2-isopropoxyethyl methanesulfonate, phenyl p-toluenesulfonate, ethyl p-toluenesulfonate, methyl p-toluenesulfonate, 2-methoxyethyl p-toluenesulfonate, ethyl trifluoromethanesulfonate, n-butyl trifluoromethanesulfonate, ethyl perfluorobutanesulfonate, methyl perfluorobutanesulfonate, ethyl perfluorooctanesulfonate, 1,4-butanesultone, 2,4-butanesultone, etc.; 2-sulfobenzoic anhydride, and p-toluenesulfonic anhydride are preferred.

Furthermore, in view of adherence to a substrate, more preferable thermal acid generators (D) includes ethyl methanesulfonate, methyl methanesulfonate, 2-methoxyethyl methanesulfonate, ethyl p-toluenesulfonate, methyl p-toluenesulfonate, 2-methoxyethyl p-toluenesulfonate, ethyl trifluoromethanesulfonate, n-butyl trifluoromethanesulfonate, 1,4-butanesultone, 2,4-butanesultone, 2-sulfobenzoic anhydride, p-toluenesulfonic anhydride, etc.

One of thermal acid generators (D) described above may be used alone, or two or more thereof may be used in combination.

The blending amount of thermal acid generator (D) in the photosensitive resin composition is preferably from 0.1 to 30 parts by mass, more preferably from 0.5 to 10 parts by mass, still more preferably from 1 to 5 parts by mass, per 100 parts by mass of the resin constituting resin (A-1) or resin mixture (A-2). When the blending amount is 0.1 parts by mass or more, an effect of maintaining the pattern profile after heat-curing is caused, and when the blending amount is 30 parts by mass or less, an adverse effect on the lithography performance is not caused and the composition stability is advantageously good.

[Other Components]

The photosensitive resin composition may contain, if desired, a solvent, a dye, a surfactant, a silane coupling agent, a dissolution accelerator, a crosslinking accelerator, etc.

The solvent includes, for example, amides, sulfoxides, ureas, ketones, esters, lactones, ethers, halogenated hydrocarbons, hydrocarbons, etc. More specifically, the solvent that can be used includes, for example, N-methyl-2-pyrrolidone, N,N-dimethylacetamide, N,N-dimethylformamide, dimethylsulfoxide, tetramethylurea, acetone, methyl ethyl ketone, methyl isobutyl ketone, cyclopentanone, cyclohexanone, methyl acetate, ethyl acetate, butyl acetate, diethyl oxalate, ethyl lactate, methyl lactate, butyl lactate, γ-butyrolactone, propylene glycol monomethyl ether acetate, propylene glycol monomethyl ether, benzyl alcohol, phenyl glycol, tetrahydrofurfuryl alcohol, ethylene glycol dimethyl ether, diethylene glycol dimethyl ether, tetrahydrofuran, morpholine, dichloromethane, 1,2-dichloroethane, 1,4-dichlorobutane, chlorobenzene, o-dichlorobenzene, anisole, hexane, heptane, benzene, toluene, xylene, mesitylene, etc. In view of solubility of the resin, stability of the resin composition, and adhesiveness to a substrate, N-methyl-2-pyrrolidone, dimethylsulfoxide, tetramethylurea, butyl acetate, ethyl lactate, γ-butyrolactone, propylene glycol monomethyl ether acetate, propylene glycol monomethyl ether, benzyl alcohol, phenyl glycol, and tetrahydrofurfuryl alcohol are preferred.

In the embodiment, the amount of the solvent used in the photosensitive resin composition is preferably from 100 to 1,000 parts by mass, more preferably from 120 to 700 parts by mass, still more preferably from 125 to 500 parts by mass, per 100 parts by mass of phenolic resin (A-1).

The dye includes, for example, methyl violet, crystal violet, malachite green, etc. The blending amount of the dye in the photosensitive resin composition is preferably from 0.1 to 30 parts by mass per 100 parts by mass of phenolic resin (A-1).

The surfactant includes a nonionic surfactant, for example, polyglycols, such as polypropylene glycol, polyoxyethylene lauryl ether, etc., and derivatives thereof; for example, a fluorine-containing surfactant, such as FLUORAD (registered trademark and trade name, produced by Sumitomo 3M Limited), MEGAFACE (registered trademark and trade name, produced by Dainippon Ink & Chemicals, Inc.), LUMIFLON (registered trademark and trade name, produced by Asahi Glass Co., Ltd.), etc.; and, for example, an organic siloxane surfactant, such as KP 341 (trade name, produced by Shin-Etsu Chemical Co., Ltd.), DBE (trade name, produced by Chisso Corporation), GLANOL (trade name, produced by Kyoeisha Chemical Co., Ltd), etc.

The blending amount of the surfactant in the photosensitive resin composition is preferably from 0.01 to 10 parts by mass per 100 parts by mass of the resin constituting resin (A-1) or resin mixture (A-2).

The silane coupling agent includes, although is not limited to, for example, 3-mercaptopropyltrimethoxysilane (for example, trade name: KBM803 produced by Shin-Etsu Chemical Co., Ltd., trade name: Sila-Ace 5810 produced by Chisso Corporation, etc.), 3-mercaptopropyltriethoxysilane (trade name: SIM6475.0 produced by AZmax Co.), 3-mercaptopropylmethyldimethoxysilane (for example, trade name: LS1375 produced by Shin-Etsu Chemical Co., Ltd., trade name: SIM6474.0 produced by AZmax Co., etc.), mercaptomethyltrimethoxysilane (trade name: SIM6473.5C produced by AZmax Co.), mercaptomethyltrimethoxysilane (trade name: SIM6473.0 produced by AZmax Co.), 3-mercaptopropyldiethoxymethoxysilane, 3-mercaptopropylethoxydimethoxysilane, 3-mercaptopropyltripropoxysilane, 3-mercaptopropyldiethoxypropoxysilane, 3-mercaptopropylethoxydipropoxysilane, 3-mercaptopropyldimethoxypropoxysilane, 3-mercaptopropylmethoxydipropoxysilane, 2-mercaptoethyltrimethoxysilane, 2-mercaptoethyldiethoxymethoxysilane, 2-mercaptoethylethoxydimethoxysilane, 2-mercaptoethyltripropoxysilane, 2-mercaptoethyltripropoxysilane, 2-mercaptoethylethoxydipropoxysilane, 2-mercaptoethyldimethoxypropoxysilane, 2-mercaptoethylmethoxydipropoxysilane, 4-mercaptobutyltrimethoxysilane, 4-mercaptobutyltriethoxysilane, 4-mercaptobutyltripropoxysilane, etc.

The silane coupling agent also includes, although is not limited to, for example, N-(3-triethoxysilylpropyl)urea (trade name: LS3610 produced by Shin-Etsu Chemical Co., Ltd., trade name: SIU9055.0 produced by AZmax Co.), N-(3-trimethoxysilylpropyl)urea (trade name: SIU9058.0 produced by AZmax Co.), N-(3-diethoxymethoxysilylpropyl)urea, N-(3-ethoxydimethoxysilylpropyl)urea, N-(3-tripropoxysilylpropyl)urea, N-(3-diethoxypropoxysilylpropyl)urea, N-(3-ethoxydipropoxysilylpropyl)urea, N-(3-dimethoxypropoxysilylpropyl)urea, N-(3-methoxydipropoxysilylpropyl)urea, N-(3-trimethoxysilylethyl)urea, N-(3-ethoxydimethoxysilylethyl)urea, N-(3-tripropoxysilylethyl)urea, N-(3-tripropoxysilylethyl)urea, N-(3-ethoxydipropoxysilylethyl)urea, N-(3-dimethoxypropoxysilylethyl)urea, N-(3-methoxydipropoxysilylethyl)urea, N-(3-trimethoxysilylbutyl)urea, N-(3-triethoxysilylbutyl)urea, N-(3-tripropoxysilylbutyl)urea, 3-(m-aminophenoxy)propyltrimethoxysilane (trade name: SLA0598.0 produced by AZmax Co.), m-aminophenyltrimethoxysilane (trade name: SLA0599.0 produced by AZmax Co.), p-aminophenyltrimethoxysilane (trade name: SLA0599.1 produced by AZmax Co.), aminophenyltrimethoxysilane (trade name: SLA0599.2 produced by AZmax Co.), 2-(trimethoxysilylethyl)pyridine (trade name: SIT8396.0 produced by AZmax Co.).

In addition, the silane coupling agent includes, although is not limited to, for example, 2-(triethoxysilylethyl)pyridine, 2-(dimethoxysilylmethylethyl)pyridine, 2-(diethoxysilylmethylethyl)pyridine, (3-triethoxysilylpropyl)-t-butylcarbamate, (3-glycidoxypropyl)triethoxysilane, tetramethoxysilane, tetraethoxysilane, tetra-n-propoxysilane, tetra-i-propoxysilane, tetra-n-butoxysilane, tetra-i-butoxysilane, tetra-t-butoxysilane, tetrakis(methoxyethoxysilane), tetrakis(methoxy-n-propoxysilane), tetrakis(ethoxyethoxysilane), tetrakis(methoxyethoxyethoxysilane), bis(trimethoxysilyl)ethane, bis(trimethoxysilyl)hexane, bis(triethoxysilyl)methane, bis(triethoxysilyl)ethane, bis(triethoxysilyl)ethylene, bis(triethoxysilyl)octane, bis(triethoxysilyl)octadiene, bis[3-(triethoxysilyl)propyl]disulfide, bis[3-(triethoxysilyl)propyl]tetrasulfide, di-t-butoxydiacetoxysilane, di-i-butoxyaluminoxytriethoxysilane, bis(pentadionate)titanium-0,0'-bis (oxyethyl)-aminopropyltriethoxysilane, phenylsilanetriol, methylphenylsilanediol, ethylphenylsilanediol, n-propylphenylsilanediol, isopropylphenylsilanediol, n-butyldiphenylsilanediol, isobutylphenylsilanediol, tert-butylphenylsilanediol, diphenylsilanediol, dimethoxydiphenylsilane, diethoxydiphenylsilane, dimethoxydi-p-tolylsilane, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, triphenylsilanol, etc.

Among the above-listed silane coupling agents, in view of storage stability, phenylsilanetriol, trimethoxyphenylsilane, trimethoxy(p-tolyl)silane, diphenylsilanediol, dimethoxydiphenylsilane, diethoxydiphenylsilane, dimethoxydi-p-tolylsilane, triphenylsilanol, and silane coupling agents represented by the following structures are preferred.

[Chem. 60]

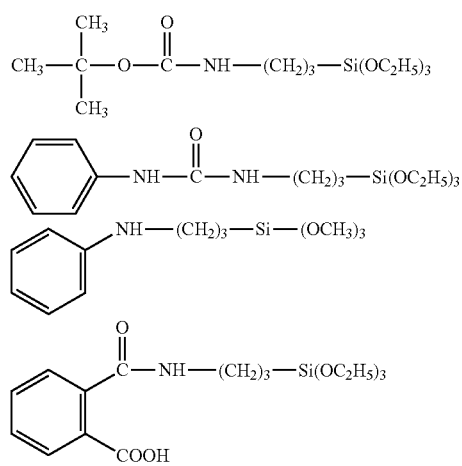

The blending amount of the silane coupling agent in the photosensitive resin composition is preferably from 0.01 to 20 parts by mass per 100 parts by mass of resin (A-1) or resin mixture (A-2).

The dissolution accelerator includes, for example, a compound having a hydroxyl group or a carboxyl group. Examples of the compound having a hydroxyl group include a linear phenolic compound, such as ballasting agents used in naphthoquinonediazide compounds recited above, paracumylphenol, bisphenols, resorcinols, MtrisPC, MtetraPC, etc.; a nonlinear phenolic compound, such as TrisP-HAP, TrisP-PHBA, TrisP-PA (all produced by Honshu Chemical Industry Co. Ltd.), etc.; from 2 to 5 phenolic substitution products of diphenylmethane, from 1 to 5 phenolic substitution products of 3,3-diphenylpropane, a compound obtained by reacting 2,2-bis-(3-amino-4-hydroxyphenyl)hexafluoropropane and 5-norbornene-2,3-dicarboxylic anhydride in a molar ratio of 1:2, a compound obtained by reacting bis-(3-amino-4-hydroxyphenyl)sulfone and 1,2-cyclohexyldicarboxylic anhydride in a molar ratio of 1:2, N-hydroxysuccinic acid imide, N-hydroxyphthalic acid imide, N-hydroxy 5-norbornene-2,3-dicarboxylic acid imide, etc.

Examples of the compound having a carboxyl group include 3-phenyllactic acid, 4-hydroxyphenyllactic acid, 4-hydroxymandelic acid, 3,4-dihydroxymandelic acid, 4-hydroxy-3-methoxymandelic acid, 2-methoxy-2-(1-naphthyl) propionic acid, mandelic acid, atrolactic acid, α-methoxyphenylacetic acid, 0-acetylmandelic acid, itaconic acid, benzoic acid, o-toluic acid, m-toluic acid, p-toluic acid, 2,3-dimethylbenzoic acid, 2,4-dimethylbenzoic acid, 2,5-dimethylbenzoic acid, 2,6-dimethylbenzoic acid, 3,4-dimethylbenzoic acid, 3,5-dimethylbenzoic acid, 2,4,5-trimethylbenzoic acid, 2,4,6-trimethylbenzoic acid, 4-vinylbenzoic acid, cumic acid, isobutylbenzoic acid, 4-propylbenzoic acid, salicylic acid, 3-hydroxybenzoic acid, 4-hydroxybenzoic acid, 2-acetylbenzoic acid, 4-acetylbenzoic acid, 3-fluorobenzoic acid, 4-fluorobenzoic acid, 4-fluoro-2-methylbenzoic acid, 5-fluoro-2-methylbenzoic acid, p-anisic acid, 4-amylbenzoic acid, 4-butylbenzoic acid, 4-tert-butylbenzoic acid, 3,5-di-tert-butylbenzoic acid, 4-trifluoromethylbenzoic acid, 4-hydroxymethylbenzoic acid, phthalic acid, 4-methylphthaic acid, 4-hydroxyphthalic acid, 4-trifluoromethylbenzoic acid, 4-methoxyphthalic acid, phthalamic acid, isophthalic acid, terephthalic acid, 2,5-dimethylbenzoic acid, monomethyl terephthalate, trimesic acid, trimellitic acid, hemimellitic acid, pyromellitic acid, benzenepentacarboxylic acid, mellitic acid, etc.

The blending amount of the dissolution accelerator in the photosensitive resin composition is preferably from 0.1 to 30 parts by mass per 100 parts by mass of the resin constituting resin (A-1) or resin mixture (A-2).

The crosslinking accelerator is preferably a compound capable of generating an acid by light or generating a base or a radical by heat or light.

The compound capable of generating an acid by light includes, for example, an onium salt, such as TPS-105 and 1000, DTS-105, NDS-105 and 165 (trade names, produced by Midori Kagaku Co., Ltd.), DPI-DMAS, TTBPS-TF, TPS-TF, DTBPI-TF (trade names, produced by Toyo Gosei Co., Ltd.), etc.; and an oxime sulfonate, such as NAI-100, 101, 105 and 106, PAI-101 (trade names, produced by Midori Kagaku Co., Ltd.), IRGACURE PAG-103, 108, 121 and 203, CGI-1380 and 725, NIT, 1907, PNBT (trade names, produced by BASF Japan Inc.), etc.

The compound capable of generating a base by heat or light includes, for example, an amine salt, such as U-CATSA-1, 102, 506, 603 and 810 (trade names, produced by San-Apro Ltd.), CGI-1237, 1290 and 1293 (trade names, produced by BASF Japan Inc.), etc.; and a compound in which an amino group of 2,6-piperidine, butylamine, diethylamine, dibutylamine, N,N'-diethyl-1,6-diaminohexane, hexamethylenediamine, etc., is converted to a urethane group or a urea group. The urethane group includes a t-butoxycarbonylamino group, etc., and the urea group includes a phenylaminocarbonylamino group, etc.

The compound capable of generating a radical by heat or light includes, for example, an alkylphenone, such as IRGACURE 651, 184, 2959, 127, 907, 369 and 379 (trade names, produced by BASF Japan Inc.), etc.; an acylphosphine oxide, such as IRGACURE 819 (trade name, produced by BASF Japan Inc.), etc.; a titanocene, such as IRGACURE 784 (trade name, produced by BASF Japan Inc.), etc.; and an oxime ester, such as IRGACURE OXE 01 and 02 (trade names, produced by BASF Japan Inc.), etc.

<Method for Forming Cured Relief Pattern>

In another embodiment, a method for producing a cured relief pattern by using the above-described photosensitive resin composition is provided. The production method of a cured relief pattern comprises the following steps:

a step of forming (applying), on a substrate, a photosensitive resin layer containing the photosensitive resin composition, a step of exposing the photosensitive resin layer to light, a step of developing the exposed photosensitive resin layer to form a relief pattern, and a step of heat-treating the relief pattern to form a cured relief pattern.

One example of the production method of a cured relief pattern is described below.

First, the above-described photosensitive resin composition is applied onto an appropriate support or substrate, for example, a silicon wafer, a ceramic, an aluminum substrate, etc. At the applying, in order to ensure water-resistant adhesiveness between the pattern formed and the support, an adhesion aid, such as silane coupling agent may be previously applied on the support or substrate. Applying the photosensitive resin composition is carried out by spin coating using a spinner, spray coating using a spray coater, dipping, printing, roll coating, etc.

Next, the applied film of the photosensitive resin composition containing phenolic resin (A-1) is dried by prebaking at 80 to 140° C., and the photosensitive resin composition is then exposed to light. As the chemical ray for exposure, an X-ray, an electron beam, an ultraviolet ray, visible light, etc., can be used, and a chemical ray having a wavelength of 200 to 500 nm is preferred. In view of resolution and handling of a pattern, the light source wavelength is preferably g-line, h-line or i-line of a mercury lamp, and one of these chemical rays may be used alone, or two or more thereof may be mixed. As the exposure apparatus, a contact aligner, a mirror projection, and a stepper are particularly preferred. After the exposure, the applied film may be again heated at 80 to 140° C., if desired.

Subsequently, development is carried out by a dipping method, a puddling method, a spin spraying method, etc. The exposed area (in the case of a positive type) or unexposed area (in the case of a negative type) is eluted and removed from the applied photosensitive resin composition by development, whereby a relief pattern can be obtained.

The developer that can be used includes, for example, an aqueous solution of inorganic alkalis, such as sodium hydroxide, sodium carbonate, sodium silicate, aqueous ammonia, etc., organic amines, such as ethylamine, diethylamine, triethylamine, triethanolamine, etc., or quaternary ammonium salts, such as tetramethylammonium hydroxide, tetrabutylammonium hydroxide, etc. If necessary, a water-soluble organic solvent, such as methanol, ethanol, etc., or a surfactant is added in an appropriate amount to the aqueous solution. Among these, an aqueous tetramethylammonium hydroxide solution is preferred. The concentration of tetramethylammonium hydroxide is preferably from 0.5 to 10 mass %, more preferably from 1 to 5 mass %.

After the development, cleaning with a rinsing solution is carried out to remove the developer, whereby a pattern film can be obtained. As the rinsing solution, for example, one of distilled water, methanol, ethanol, isopropanol, etc. may be used alone, or two or more thereof may be used in combination.

Finally, the thus-obtained relief pattern is heated, whereby a cured relief pattern can be obtained. The heating temperature is preferably from 150 to 300° C., more preferably 250° C. or less.

In the usual method of forming a cured relief pattern by using a polyimide or polybenzoxazole precursor composition it is necessary to convert the precursor to polyimide or polybenzoxazole by heating the composition at a temperature more than 300° C. to cause a dehydrating cyclization reaction. However, in the production method of a cured relief pattern of the present invention, such heating is not necessary, so that the production method can be suitably used also for a thermally weak semiconductor device, etc. In one example, the production method of a cured relief pattern is suitably used for a semiconductor device having an insulating layer consisting of a high-dielectric material or ferroelectric material having a restriction on the processing temperature, for example, an oxide of a metal having a high melting point, such as titanium, tantalum, hafnium, etc. In the case where a semiconductor device is free from such a restriction in terms of heat resistance, also in the embodiment, a heat treatment at 300 to 400° C. may be of course carried out. Such a heat treatment can be carried out using a hot plate, an oven, or a temperature-programmable temperature-rising oven. As the atmosphere gas in the heating treatment, air may be used, or an inert gas, such as nitrogen, argon, etc., may also be used. In the case where the heat treatment must be carried out at a lower temperature, the composition may be heated under reduced pressure by using a vacuum pump, etc.

<Semiconductor Device>

In another embodiment, a semiconductor device having a cured relief pattern produced by the above-described method using the above-described photosensitive resin composition is also provided. In this embodiment, the semiconductor device has a semiconductor element and a cured film provided on the top of the semiconductor element, wherein the cured film is the cured relief pattern described above. In addition, the cured relief pattern may be laminated to come into direct contact with the semiconductor element or may be laminated with interposition of another layer on the element. For example, the cured film includes a surface protective film, an interlayer insulating film, an insulating film for rewiring, a protective film for a flip-chip device, and a protective film of a semiconductor device having a bump structure. In the embodiment, the semiconductor device can be manufactured by combining a known method for manufacturing a semiconductor device and the above-described production method of a cured relief pattern of the present invention.

<Display Device>

In another embodiment, a display device having a cured relief pattern produced by the above-described method using the above-described photosensitive resin composition is also provided. In this embodiment, the display device has a display element and a cured film provided on the top of the display element, wherein the cured film is the cured relief pattern described above. In addition, the cured relief pattern may be laminated to come into direct contact with the display element or may be laminated with interposition of another layer on the element. For example, the cured film includes a surface protective film, an insulating film and a planarization film for a TFT liquid crystal display element or a color filter element; a projection for an MVA liquid crystal display device; and a cathode partition wall for an organic EL element. In the embodiment, similarly to the semiconductor device described above, the display device can be manufactured by combining a known method for manufacturing a display device and the above-described production method of a cured relief pattern.

Examples of the application of the display device include a protective film obtained by forming a cured film of the above-described photosensitive resin composition on a display device, an insulating film or a planarization film for a TFT element, a color filter, etc., a projection for an MVA liquid crystal display device, etc., and a cathode partition wall for an organic EL element, etc. As for the use method thereof, in accordance with the application of the semiconductor device, a patterned cured film of the photosensitive resin composition is formed by the above-described method on a substrate on which a display element or a color filter has been formed.

In another embodiment of the present invention, an alkali-soluble resin composition containing an alkali-soluble resin and a solvent is provided. The alkali-soluble resin composition is characterized in that a cured film obtained by coating the resin composition and curing the coated resin composition at 200° C. satisfies all of following a) to c):

a) the stress at a film thickness of 7 μm is from 5 to 18 MPa, b) the maximum value of tensile elongation of the film having a film thickness of 10 μm is from 20 to 100%, and c) the glass transition temperature at a film thickness of 10 μm is from 180 to 300° C.

In recent years, mainly for reasons of the material of constituent member and the structural design, a demand for a material capable of being heated and cured at a lower temperature, for example, at a temperature of 200° C. or less, is increasing.

Accordingly, in such a case, it is necessary that even when cured at 200° C., the cured film consisting of the alkali-soluble resin composition has sufficient properties as a surface protective film or interlayer insulating film of a semiconductor. The present inventors have found that when a cured film obtained by curing the alkali-soluble resin composition at 200° C. satisfies all of a) to c), the cured film exhibits excellent performance as a protective film of a semiconductor device.

In the case of satisfying a), i.e., in the case where the stress is from 5 to 18 MPa, when an insulating film is formed on a silicon wafer, warpage of the silicon wafer is suppressed.

In the case of satisfying b), i.e., in the case where the maximum value of tensile elongation is from 20 to 100%, when the cured film is applied as a surface protective film or interlayer insulating film of a semiconductor device, cracking is less likely to occur upon imposition of a stress due to heat and the reliability of the semiconductor device can be increased.

In the case of satisfying c), i.e., in the case where the glass transition temperature is from 180 to 300° C., a semiconductor having a cured film consisting of the resin composition can be mounted on a printed board without involving deformation of the cured relief pattern due to heat applied when mounting the semiconductor on the board.

The alkali-soluble resin is not limited but in view of heat resistance, is preferably a resin selected from a polyimide precursor, a polyimide, a polybenzoxazole precursor, and a phenolic resin.

Above all, a resin mixture of a resin containing a structure represented by formula (1) and resins containing structures represented by formulae (7) and (8) is more preferred.

The solvent is not particularly limited and includes those described above.

From the standpoint of forming a fine pattern, it is also preferred that the alkali-soluble resin composition containing an alkali-soluble resin and a solvent further contains a photoacid generator.

The photoacid generator includes those described above.

In addition, in order to more improve thermal properties and mechanical properties of the cured product, it is preferable to further blend a crosslinking agent in the alkali-soluble resin composition.

The crosslinking agent includes those described above.

Furthermore, as for the thermal acid generator and other components, those described above can be also added.

In another embodiment of the present invention, a cured product obtained by coating a substrate with a photosensitive resin layer consisting of a positive-type photosensitive resin composition containing a phenolic resin, a photoacid generator and a solvent, and subjecting the layer to exposure, development and curing is provided. The cured product is characterized in that, in a cross-sectional profile consisting of a space moiety of 5 to 100 μm and a land moiety of 1 to 10 mm, the cross-sectional angle defined by an interior angle relative to the base material surface when a tangential line is drawn at a height of half the cured film thickness is from 40 to 90°.

When the cross-sectional angle of the cured product is 40° or more, a wiring layer below the cured film can be prevented from being naked, and when the cross-sectional angle is 90° or less, stress concentration on the cured film can be avoided, and the damage to a structure with the cured film can be reduced. The cross-sectional angle of the cured product is preferably from 40 to 85°, more preferably from 45 to 80°.

The substrate includes a silicon wafer, etc.

The exposure, development and curing conditions are not limited as long as a cured film giving a cured product having a cross-sectional angle of from 40 to 90° is obtained, but the exposure, development and curing can be carried out, for example, under the conditions described in following Examples.

EXAMPLES

The present invention is described in detail below by referring to Synthesis Examples, Examples and Comparative Examples, but the present invention is not limited to them.

In Examples, the measurement conditions are as follows.

<Weight Average Molecular Weight (Mw)>

The weight average molecular weight was calculated in terms of standard polystyrene (organic solvent-based standard sample, STANDARD SM-105 produced by Showa Denko K.K.) by GPC. The GPC apparatus used and the measurement conditions are as follows:

Pump: JASCO PU-980

Detector: JASCO RI-930

Column oven: JASCO CO-965 40° C.

Column: Shodex KD-806M, two columns in series
Mobile phase: 0.01 mol/l, LiBr/N-methylpyrrolidone
Flow velocity: 1.0 ml/min.

<Evaluation of Alkali Solubility>

The resin was dissolved in γ-butyrolactone to give a solid content concentration of 37 mass %, and a silicon wafer was spin-coated with the solution and then placed on a hot plate. The silicon wafer and spin-coated film were prebaked on the hot plate at 120° C. for 180 seconds to form a coating film having a thickness of 10 μm. The film thickness was measured by a film thickness measurement system (LAMBDA ACE) manufactured by Dainippon Screen Mfg. Co., Ltd. Thereafter, the film was dipped in an aqueous TMAH solution (AZ300MIF produced by AZ Electronic Materials) of 2.38 mass % at a liquid temperature of 23.0° C. and then again measured for the film thickness, and based on the values obtained the dissolution rate of the coated film was calculated. The alkali solubility was judged as "good" when the dissolution rate was 0.01 μm/sec or more, and judged as "bad" when it was less than 0.01 μm/sec.

<Residual Film Ratio During Curing and Evaluation of Cured Relief Pattern Profile>

A silicon wafer was spin-coated with a photosensitive resin composition and placed on a hot plate, and the silicon wafer and spin-coated film were prebaked on the hot plate at 120° C. for 180 seconds to form a coating film having a thickness of 10 μm. This coating film was exposed to irradiation with i-line at an exposure dose of 500 mJ/cm$^2$ by using a stepper NSR2005i8A (manufactured by Nikon Corp.) having an exposure wavelength of i-line (365 nm) through a reticle with a test pattern. After the exposure, with respect to Examples 12, 13, 33, 59, 68, 70, 71 and 72, the film was reheated on the hot plate at 120° C. for 180 seconds. The film was then developed with an aqueous 2.38% tetramethylammonium hydroxide solution AZ-300MIF (produced by AZ Electronic Materials) at 23° C. for 100 seconds in a developing machine (D-SPIN), rinsed with pure water, and cured at 225° C. or 250° C. for 1 hour under nitrogen atmosphere in a vertical curing furnace VF200B (manufactured by Koyo Thermo Systems Co., Ltd.) to obtain a cured relief pattern. At this time, the film thickness was measured with a contact-type film thickness measuring apparatus P-15 (manufactured by KLA-Tencor Corporation) before and after the curing, and the residual film ratio during curing was calculated.

In addition, the cured relief pattern profile was judged as "good" when the relief pattern of a 20 square was not buried after curing and the shape was maintained, and the cured relief pattern profile was judged as "bad" when the shape was collapsed and the pattern was buried. However, with respect to Examples 13, 33, 59, 68, 70, 71 and 72, since the pattern is of a negative type, the profile was judged as "bad" when the pattern profile was collapsed.

<Measurement of Tensile Elongation>

The sample for elongation measurement was produced by the following method. A 6-inch silicon wafer substrate having an aluminum deposition layer on the outermost surface thereof was spin-coated with each of the photosensitive resin compositions obtained in Examples and Comparative Examples to have a film thickness of about 10 μm after curing, and prebaked on a hot plate at 120° C. for 180 seconds to form a coating film. The film thickness was measured by a film thickness measurement system (LAMBDA ACE) manufactured by Dainippon Screen Mfg. Co., Ltd. This coating film was heated at 200° C., 225° C. or 250° C. for 1 hour under nitrogen atmosphere to obtain a film having a thickness of 10 μm. The obtained resin cured film was cut into a width of 3 mm by means of a dicing saw and then separated from the wafer by a treatment with an aqueous dilute hydrochloric acid solution. In this way, 20 samples were obtained. After leaving each sample to stand still for 24 hours or more in an atmosphere of a temperature of 23° C. and a relative humidity of 50%, the elongation was measured by a tensile tester (TENSILON). The elongation of the film cured at 225° C. or 250° C. shows the average value of 20 samples, and the elongation of the film cured at 200° C. shows the maximum value. The measurement conditions of the tensile tester were as follows:

Temperature: 23° C.
Relative humidity: 50%
Initial sample length: 50 mm
Testing speed: 40 mm/min
Load cell rating: 2 kgf <Measurement of Glass Transition Temperature>

Similarly to the sample produced above for the measurement of tensile elongation, a cured film piece having a thickness of about 10 μm and a width of 3 mm was produced and measured for the glass transition temperature using a thermal mechanical analyzer (model name: TMA-50 manufactured by Shimadzu Corporation). The measurement conditions were as follows.

Sample length: 10 mm
Constant load: 200 g/mm$^2$
Measurement temperature range: from 25 to 400° C.
Temperature rise rate: 10° C./min
Measurement atmosphere: nitrogen atmosphere <Measurement of Residual Stress>

A 6-inch silicon wafer having a thickness of 625 μm±25 μm whose warpage was previously measured was spin-coated with each of the photosensitive resin compositions obtained in Examples and Comparative Examples to have a film thickness of about 10 μm after curing, and prebaked on a hot plate at 120° C. for 180 seconds to form a coating film. The film thickness was measured by a film thickness measurement system (LAMBDA ACE) manufactured by Dainippon Screen Mfg. Co., Ltd. The coating film was heated at 200° C. for 1 hour under nitrogen atmosphere to obtain a film having a thickness of 10 μm, and after leaving the obtained wafer with a cured film to stand still in an atmosphere of a temperature of 23° C. and humidity of 50% for 24 hours, the residual stress of the wafer was measured by a residual stress measuring apparatus (model name: FLX-2320 manufactured by Tencor Corporation).

<Measurement of Cross-Sectional Angle>

A silicon wafer was spin-coated with the photosensitive resin composition and placed on a hot plate, and the silicon wafer and spin-coated film were prebaked on the hot plate at 120° C. for 180 seconds to form a coating film having a thickness of 10 μm. This coating film was exposed to irradiation with i-line at an exposure dose of 500 mJ/cm$^2$ by using a stepper NSR2005i8A (manufactured by Nikon Corp.) having an exposure wavelength of i-line (365 nm) through a reticle with a test pattern. After the exposure, with respect to Examples 12, 13, 33, 58, 67, 69, 70 and 71, the film was reheated on the hot plate at 120° C. for 180 seconds. The film was then developed with an aqueous 2.38% tetramethylammonium hydroxide solution AZ-300MIF (produced by AZ Electronic Materials) at 23° C. for 100 seconds in a developing machine (D-SPIN), rinsed with pure water, and cured at 200° C. for 1 hour under nitrogen atmosphere in a vertical curing furnace VF200B (manufactured by Koyo Thermo Systems Co., Ltd.) to obtain a cured relief pattern. Thereafter, the cross-sectional profile consisting of a space moiety of 50 μm and a land moiety of 5 mm was observed using SEM (model name: S-4800 manufactured by Hitachi High-Technologies Corporation), and the cross-sectional angle defined by an interior angle relative to the base material surface when a tangential line is drawn at a height of half the cured film thickness was measured.

<$^1$H NMR Measurement Conditions>

Measuring apparatus: Model JNM-GSX 400 manufactured by JEOL Ltd.

Measurement temperature: 23° C.

Measurement solvent: deuterated dimethylsulfoxide solvent (DMSO-$d_6$)

The structures of photoacid generator (B), crosslinking agent (C) and thermal acid generator (D) used in Examples and Comparative Examples are as follows.

(B-1)

A photoacid generator shown by the following formula:

[Chem. 61]

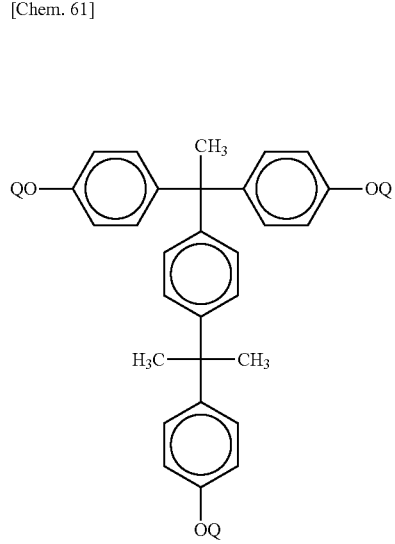

{wherein out of Q, 83% is a structure represented by the following formula and the remaining is a hydrogen atom}:

[Chem. 62]

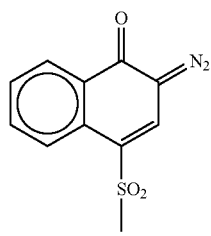

(B-2)

IRGACURE PAG121 (trade name, produced by BASF Japan Inc.)

(B-3)

A photoacid generator shown by the following formula:

[Chem. 63]

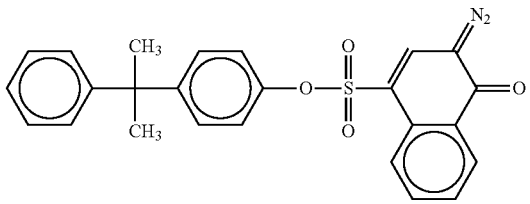

(C-1)

[Chem. 64]

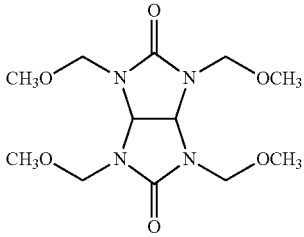

(NIKALAC MX-270, trade name, produced by Sanwa Chemical Co., Ltd.)

(C-2)

A crosslinking agent shown by the following formula:

[Chem. 65]

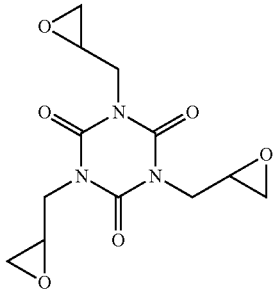

triglycidyl isocyanurate (C-3)

A crosslinking agent shown by the following formula:

[Chem. 66]

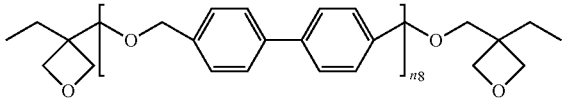

{wherein $n_8$ is an integer of 1 to 3) ETERNACOLL OXBP (trade name, produced by Ube Industries, Ltd.)

(C-4)
A crosslinking agent shown by the following formula:

[Chem. 67]

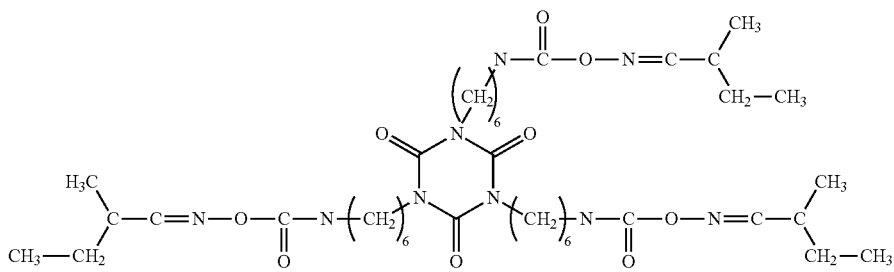

DURANATE TPA-B80E (trade name, produced by Asahi Kasei Chemicals Corporation)

(C-5)
A crosslinking agent shown by the following formula:

[Chem. 68]

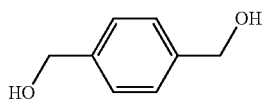

p-xylylene glycol (C-6):
DURANOL T5652 (product name, produced by Asahi Kasei Chemicals Corp.)

(C-7)
A crosslinking agent shown by the following formula:

[Chem. 69]

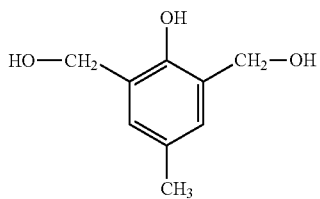

2,6-Bis(hydroxymethyl)-p-cresol (D-1)
A thermal acid generator shown by the following formula:

[Chem. 70]

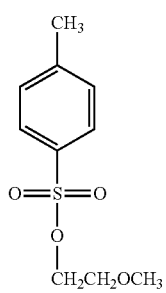

2-Methoxyethyl p-toluenesulfonate

EP-4080G: Novolak resin, produced by Asahi Organic Chemicals Industry Co., Ltd., weight average molecular weight=10,600

MEH-7851-4H: Phenol-biphenyldiyl resin, produced by Meiwa Plastic Industries, Ltd., weight average molecular weight=10,000, a structure represented by following formula (24)

MEH-7851-SS: Phenol-biphenyldiyl resin, produced by Meiwa Plastic Industries, Ltd., weight average molecular weight=1,600, a structure represented by following formula (24)

[Chem. 71]

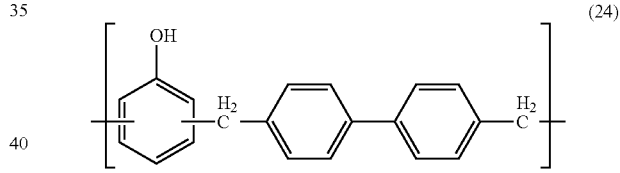

(24)

Synthesis Example 1

Synthesis of Resin P1-1

In a 0.5 liter-volume separable flask with a Dean-Stark device, 76.4 g (0.36 mol) of propyl gallate, 67.9 g (0.28 mol) of 4,4'-bis(methoxymethyl)biphenyl, 2.2 g (0.014 mol) of diethylsulfuric acid, and 100 g of diglyme (hereinafter, sometimes referred to as "DMDG") were mixed and stirred at 70° C. to dissolve solids.

The mixed solution was heated to 140° C. in an oil bath, and generation of methanol was confirmed by the reaction solution. In this state, the reaction solution was stirred at 140° C. for 5 hours.

Thereafter, the reaction vessel was cooled in the atmosphere, and 150 g of tetrahydrofuran was separately added thereto and stirred. The resulting diluted reaction solution was added dropwise to 5 L of water with high-speed stirring to disperse and precipitate a resin, and the resin was recovered, appropriately washed with water, dewatered and then vacuum-dried to obtain Resin (P1-1) at a yield of 76%. The weight average molecular weight by GPC of Resin (P1-1) thus synthesized was 10,900 in terms of polystyrene. FIG. 1 shows the $^1$H NMR spectrum obtained by dissolving P1-1 in a deuterated dimethylsulfoxide solvent and measuring the solution by Model JNM-GSX 400 manufactured by JEOL Ltd.

Synthesis Example 2

Synthesis of Resin P1-2

Figure 2:
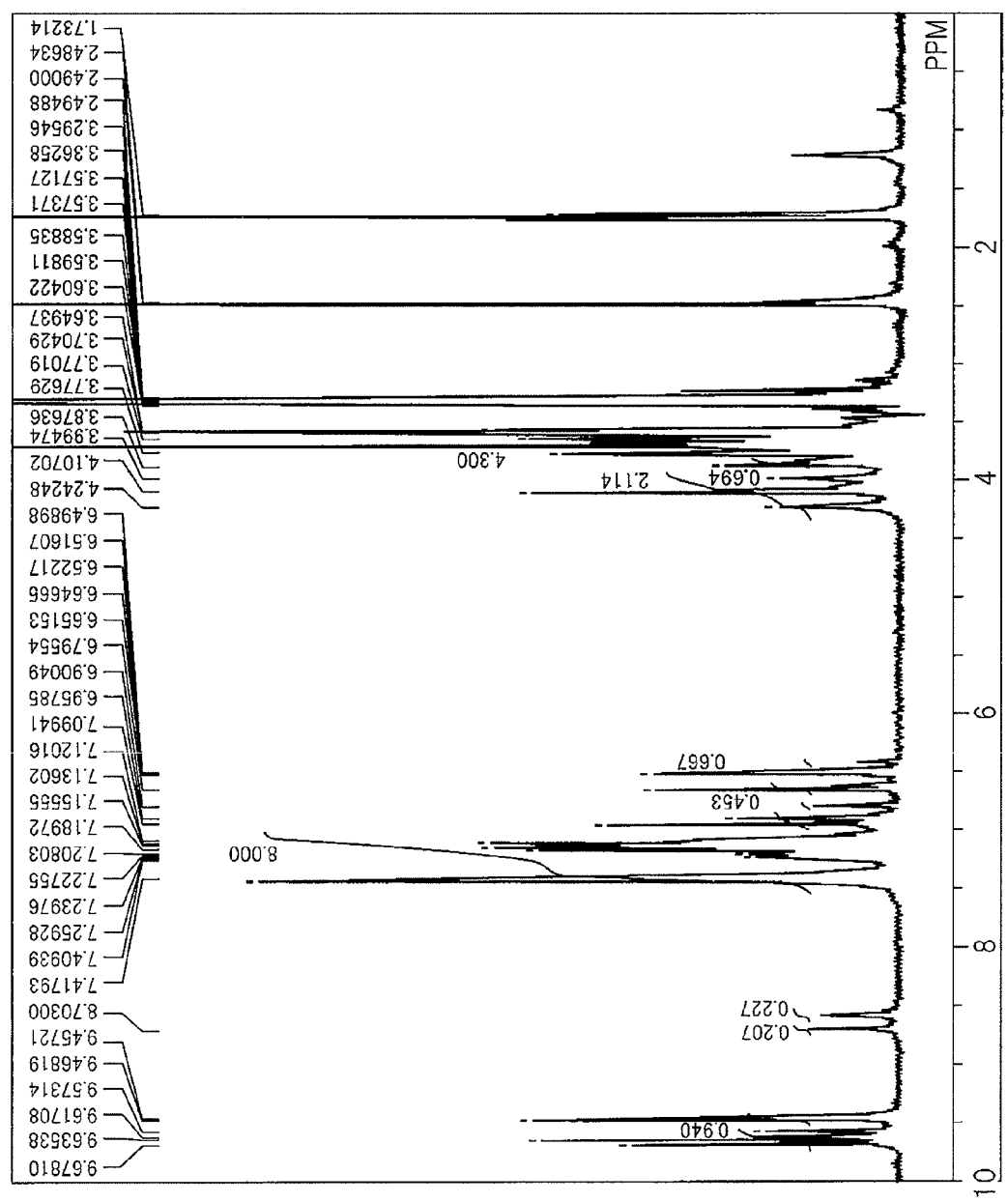
FIG. 2 A $^1$H NMR spectrum of Resin P1-2 described in Examples.

Synthesis was carried out in the same manner as in Synthesis Example 1 by using 70.6 g (0.42 mol) of methyl 3,5-dihydroxybenzoate in place of propyl gallate of Synthesis Example 1, whereby Resin (P1-2) was obtained at a yield of 78%. The weight average molecular weight by GPC of Resin (P1-2) synthesized was 14,600 in terms of polystyrene. FIG. 2 shows the $^1$H NMR spectrum obtained by measuring P1-2 in the same manner as in Synthesis Example 1.

Synthesis Example 3

Synthesis of Resin P1-3

Synthesis was carried out in the same manner as in Synthesis Example 1 by using 64.3 g (0.42 mol) of 2,4-dihydroxybenzamide in place of propyl gallate of Synthesis Example 1, whereby Resin (P1-3) was obtained at a yield of 82%. The weight average molecular weight by GPC of Resin (P1-3) synthesized was 19,200 in terms of polystyrene.

Synthesis Example 4

Synthesis of Resin P1-4

Synthesis was carried out in the same manner as in Synthesis Example 1 by using 71.0 g (0.47 mol) of 2,4-dihydroxyacetophenone in place of propyl gallate of Synthesis Example 1, whereby Resin (P1-4) was obtained at a yield of 73%. The weight average molecular weight by GPC of Resin (P1-4) synthesized was 11,800 in terms of polystyrene.

Synthesis Example 5

Synthesis of Imidophenol Compound I-1

In 0.5 liter-volume separable flask, 54.6 g (0.5 mol) of 2-aminophenol, 120 g of γ-butyrolactone (GBL), and 39.6 g (0.5 mol) of pyridine were put, and 89.1 g (0.5 mol) of methyl-5-norbornene-2,3-dicarboxylic anhydride was charged thereinto at room temperature. After reaction with stirring overnight at room temperature, the reaction was confirmed by low molecular GPC, as a result, raw materials were not detected at all and the product was detected as a single peak with a purity of 99%. This reaction solution was directly added dropwise with stirring to 2 liter of ion-exchanged water to precipitate the product. The product was separated by filtration and then vacuum-dried to obtain Imidophenol Compound (I-1) having the following structure at a yield of 85%.

[Chem. 72]

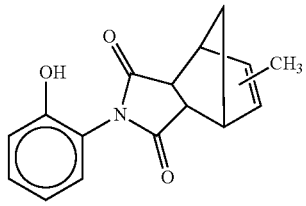

Synthesis of Resin P1-5

Synthesis was carried out in the same manner as in Synthesis Example 1 by using 85.0 g (0.44 mol) of Compound (I-1) in place of propyl gallate of Synthesis Example 1, whereby Resin (P1-5) was obtained at a yield of 58%. The weight average molecular weight by GPC of Resin (P1-5) synthesized was 3,900 in terms of polystyrene.

Synthesis Example 6

Synthesis of Resin P1-6

Synthesis was carried out in the same manner as in Synthesis Example 1 by using 51.6 g (0.37 mol) of salicylic acid in place of propyl gallate of Synthesis Example 1, whereby Resin (P1-6) was obtained at a yield of 71%. The weight average molecular weight by GPC of Resin (P1-6) synthesized was 18,200 in terms of polystyrene.

Synthesis Example 7

Synthesis of Resin P1-7

Synthesis was carried out in the same manner as in Synthesis Example 1 by using 60.4 g (0.39 mol) of 2,4-dihydroxybenzoic acid in place of propyl gallate of Synthesis Example 1, whereby Resin (P1-7) was obtained at a yield of 66%. The weight average molecular weight by GPC of Resin (P1-7) synthesized was 13,500 in terms of polystyrene.

Synthesis Example 8

Synthesis of Resin P1-8

Synthesis was carried out in the same manner as in Synthesis Example 1 by using 60.6 g (0.44 mol) of 3-nitrophenol in place of propyl gallate of Synthesis Example 1, whereby Resin (P1-8) was obtained at a yield of 70%. The weight average molecular weight by GPC of Resin (P1-8) synthesized was 11,500 in terms of polystyrene.

Synthesis Example 9

Synthesis of Resin P1-9

Synthesis was carried out in the same manner as in Synthesis Example 1 by using 41.4 g (0.3 mol) of 1,4-bis(methoxymethyl)benzene in place of 4,4'-bis(methoxymethyl)biphenyl of Synthesis Example 1, whereby Resin (P1-9) was obtained at a yield of 72%. The weight average molecular weight by GPC of Resin (P1-9) synthesized was 12,600 in terms of polystyrene.

Synthesis Example 10

Synthesis of Resin P1-10

Synthesis was carried out in the same manner as in Synthesis Example 1 by using 50.5 g (0.3 mol) of 2,6-bis(hydroxymethyl)-p-cresol in place of 4,4'-bis(methoxymethyl)biphenyl of Synthesis Example 1, whereby Resin (P1-10) was obtained at a yield of 74%. The weight average molecular weight by GPC of Resin (P1-10) synthesized was 13,400 in terms of polystyrene.

Synthesis Example 11

Synthesis of Resin P1-11

In a 0.5 liter-volume separable flask, 50 g of Resin P1-1 obtained in Synthesis Example 1 and 70 g of GBL were mixed and stirred to dissolve solids. Thereafter, 26.2 g (0.12 mol) of di-tert-butyl dicarbonate was added dropwise together with 25 g of GBL. Furthermore, 4.7 g (0.06 mol) of pyridine was added dropwise together with 10 g of GBL, and the reaction was allowed to proceed at room temperature for 5 hours.

Thereafter, 100 g of tetrahydrofuran was separately added thereto and stirred, and the resulting diluted reaction solution was added dropwise to 3 L of water with high-speed stirring to disperse and precipitate a resin. The resin was recovered, appropriately washed with water, dewatered and then vacuum-dried to obtain target Resin (P1-11) where 30% of all hydroxyl groups are protected by a tert-butoxycarbonyl group.

<Evaluation of Alkali Solubility>

Using Resins P1-1 to P1-10 obtained in Synthesis Examples 1 to 10, Resin P1-12 (EP-4080G, a novolak resin obtained by condensing a mixture of m-cresol: p-cresol=60: 40 with formaldehyde, produced by Asahi Organic Chemicals Industry Co., Ltd., weight average molecular weight=10,600), Resin P1-13 (MEH-7851-4H, a resin mainly containing a phenol-biphenyldiyl resin obtained by condensing phenol and 4,4'-bis(methoxymethyl)biphenol, produced by Meiwa Plastic Industries, Ltd., weight average molecular weight=10,000) and Resin P1-14 (MEH-7851-SS, a resin mainly containing a phenol-biphenyldiyl resin obtained by condensing phenol and 4,4'-bis(methoxymethyl)biphenyl, produced by Meiwa Plastic Industries, Ltd., weight average molecular weight=1,600), the alkali solubility was evaluated by the above-described method. The results are shown in Table 1 below.

Preparation and Evaluation of Positive-Type Photosensitive Resin Composition

Example 1

100 Parts by mass of Resin (P1-1) obtained in Synthesis Example 1 and 12 parts by mass of Photoacid Generator (B-1) were dissolved in 114 parts by mass of GBL, and the solution was filtered through a 0.1 μm filter to prepare a positive-type photosensitive resin composition. The resin composition was evaluated for the cured relief pattern profile and tensile elongation. The evaluation results are shown in Table 2.

Example 2

Preparation and evaluation were carried out in the same manner as in Example 1, except that 20 parts by mass of Crosslinking Agent (C-1) was further added in Example 1. The evaluation results are shown in Table 2.

Examples 3 to 11

Preparation and evaluation were carried out in the same manner as in Example 2, except that Resin P1-1 was replaced by Resins P1-2 to P1-10 as shown in Table 3 in Example 2. The evaluation results are shown in Table 2.

Example 12

100 Parts by mass of Resin (P1-11) and 5 parts by mass of Photoacid Generator (B-2) were dissolved in 114 parts by mass of GBL, and the solution was filtered through a 0.1 μm filter to prepare a positive-type photosensitive resin composition. The resin composition was evaluated for the cured relief pattern profile and tensile elongation. The evaluation results are shown in Table 2.

Example 13

100 Parts by mass of Resin (P1-1), 5 parts by mass of Photoacid Generator (B-2) and 20 parts by mass of Crosslinking Agent (C-1) were dissolved in 114 parts by mass of GBL, and the solution was filtered through a 0.1 μm filter to prepare a negative-type photosensitive resin composition and evaluated for the cured relief pattern profile and tensile elongation. The evaluation results are shown in Table 2.

Example 14

Preparation and evaluation were carried out in the same manner as in Example 2, except that the amount added of Photoacid Generator B-1 was changed to 20 parts by mass in Example 2. The evaluation results are shown in Table 2.

Example 15

Preparation and evaluation were carried out in the same manner as in Example 2, except that the amount added of Crosslinking Agent C-1 was changed to 40 parts by mass in Example 2. The evaluation results are shown in Table 2.

Example 16

Preparation and evaluation were carried out in the same manner as in Example 2, except that 10 parts by mass of

TABLE 1

| Polymer | P1-1 | P1-2 | P1-3 | P1-4 | P1-5 | P1-6 | P1-7 | P1-8 | P1-9 | P1-10 | P1-12 | P1-13 | P1-14 |
|---|---|---|---|---|---|---|---|---|---|---|---|---|---|
| Alkali dissolution rate [$*10^{-2}$ um/sec] | 5.3 | 4.9 | 4.4 | 3.9 | 2.8 | 11.9 | 6.9 | 2.1 | 5.8 | 6.5 | 5.0 | 0.0 | 5.9 |
| Evaluation of alkali solubility | good | good | good | good | good | good | good | good | good | good | good | bad | good |

Crosslinking Agent C-2 was added in place of Crosslinking Agent C-1 in Example 2. The evaluation results are shown in Table 2.

Example 17

Preparation and evaluation were carried out in the same manner as in Example 2, except that 20 parts by mass of Crosslinking Agent C-3 was added in place of Crosslinking Agent C-1 in Example 2. The evaluation results are shown in Table 2.

Example 18

Preparation and evaluation were carried out in the same manner as in Example 2, except that 10 parts by mass of Crosslinking Agent C-4 was added in place of Crosslinking Agent C-1 in Example 2. The evaluation results are shown in Table 2.

Example 19

Preparation and evaluation were carried out in the same manner as in Example 2, except that 10 parts by mass of Crosslinking Agent C-5 was added in place of Crosslinking Agent C-1 in Example 2. The evaluation results are shown in Table 2.

Example 20

Preparation and evaluation were carried out in the same manner as in Example 2, except that 5 parts by mass of Crosslinking Agent C-6 was added in place of Crosslinking Agent C-1 in Example 2. The evaluation results are shown in Table 2.

Comparative Example 1

Preparation and evaluation were carried out in the same manner as in Example 1, except that Resin P1-1 was replaced by Resin (P1-12) in Example 1. The evaluation results are shown in Table 2.

Comparative Example 2

Preparation and evaluation were carried out in the same manner as in Example 1, except that Resin P1-1 was replaced by Resin (P1-13) in Example 1. With respect to the cured relief pattern profile, a relief pattern could not be formed due to insufficient alkali solubility, failing in evaluation. The evaluation results are shown in Table 2.

Comparative Example 3

Preparation and evaluation were carried out in the same manner as in Example 1, except that Resin P1-1 was replaced by Resin (P1-14) in Example 1. With respect to the cured relief pattern profile, the pattern was buried, and the evaluation was "bad". The evaluation results are shown in Table 2.

Comparative Example 4

Preparation and evaluation were carried out in the same manner as in Example 2, except that Resin P1-1 was replaced by Resin (P1-14) in Example 2. With respect to the cured relief pattern profile, the pattern was buried, and the evaluation was "bad". The evaluation results are shown in Table 2.

TABLE 2

| | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Polymer | P1-1 | P1-1 | P1-2 | P1-3 | P1-4 | P1-5 | P1-6 | P1-7 | P1-8 | P1-9 | P1-10 | P1-11 |
| Photoacid Generator B-1 | 12 | 12 | 12 | 12 | 12 | 12 | 12 | 12 | 12 | 12 | 12 | |
| Photoacid Generator B-2 | | | | | | | | | | | | 5 |
| Crosslinking Agent C-1 | | 20 | 20 | 20 | 20 | 20 | 20 | 20 | 20 | 20 | 20 | 20 |
| Crosslinking Agent C-2 | | | | | | | | | | | | |
| Crosslinking Agent C-3 | | | | | | | | | | | | |
| Crosslinking Agent C-4 | | | | | | | | | | | | |
| Crosslinking Agent C-5 | | | | | | | | | | | | |
| Crosslinking Agent C-6 | | | | | | | | | | | | |
| Cured relief pattern profile | good | good | good | good | good | good | good | good | good | good | good | good |
| Elongation [%] | 15 | 45 | 18 | 15 | 36 | 11 | 21 | 24 | 15 | 19 | 15 | 17 |
| Curing temperature [° C.] | 250 | 250 | 250 | 250 | 250 | 250 | 250 | 250 | 250 | 250 | 250 | 250 |

| | Example | | | | | | | | Comparative Example | | | |
|---|---|---|---|---|---|---|---|---|---|---|---|---|
| | 13 | 14 | 15 | 16 | 17 | 18 | 19 | 20 | 1 | 2 | 3 | 4 |
| Polymer | P1-1 | P1-1 | P1-1 | P1-1 | P1-1 | P1-1 | P1-1 | P1-1 | P1-12 | P1-13 | P1-14 | P1-14 |
| Photoacid Generator B-1 | | 20 | 12 | 12 | 12 | 12 | 12 | 12 | 12 | 12 | 12 | 12 |
| Photoacid Generator B-2 | 5 | | | | | | | | | | | |
| Crosslinking Agent C-1 | 20 | 20 | 40 | | | | | | | | | 20 |
| Crosslinking Agent C-2 | | | | 10 | | | | | | | | |
| Crosslinking Agent C-3 | | | | | 20 | | | | | | | |
| Crosslinking Agent C-4 | | | | | | 10 | | | | | | |
| Crosslinking Agent C-5 | | | | | | | 10 | | | | | |
| Crosslinking Agent C-6 | | | | | | | | 5 | | | | |
| Cured relief pattern profile | good | good | good | good | good | good | good | good | bad | — | bad | bad |
| Elongation [%] | 21 | 41 | 27 | 30 | 29 | 16 | 32 | 42 | 3 | 5 | 3 | 30 |
| Curing temperature [° C.] | 250 | 250 | 250 | 250 | 250 | 250 | 250 | 250 | 250 | 250 | 250 | 250 |

Results shown in Table 2 reveal that the photosensitive resin composition of the present invention has sufficient alkali solubility, is excellent in tensile elongation of the cured film, and gives a resin film ensuring a good cured relief pattern profile.

Synthesis Example 12

Synthesis of Resin P2-1

A 1.0 L-volume separable flask with a Dean-Stark device was purged with nitrogen and thereafter, in the separable flask, 91.8 g (0.833 mol) of resorcin, 109.0 g (0.45 mol) of 4,4'-bis(methoxymethyl)biphenyl (BMMB), 3.81 g (0.02 mol) of p-toluenesulfonic acid, and 116 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. In this state, the reaction solution was stirred at 120° C. for 3 hours.

Subsequently, 8.3 g (0.050 mol) of 2,6-bis(hydroxymethyl)-p-cresol and 83 g of PGME were mixed and stirred in a separate vessel, and the resulting uniformly dissolved solution was added dropwise over 1 hour to the separable flask by using a dropping funnel. After the dropwise addition, the system was further stirred for 2 hours.

Figure 3:
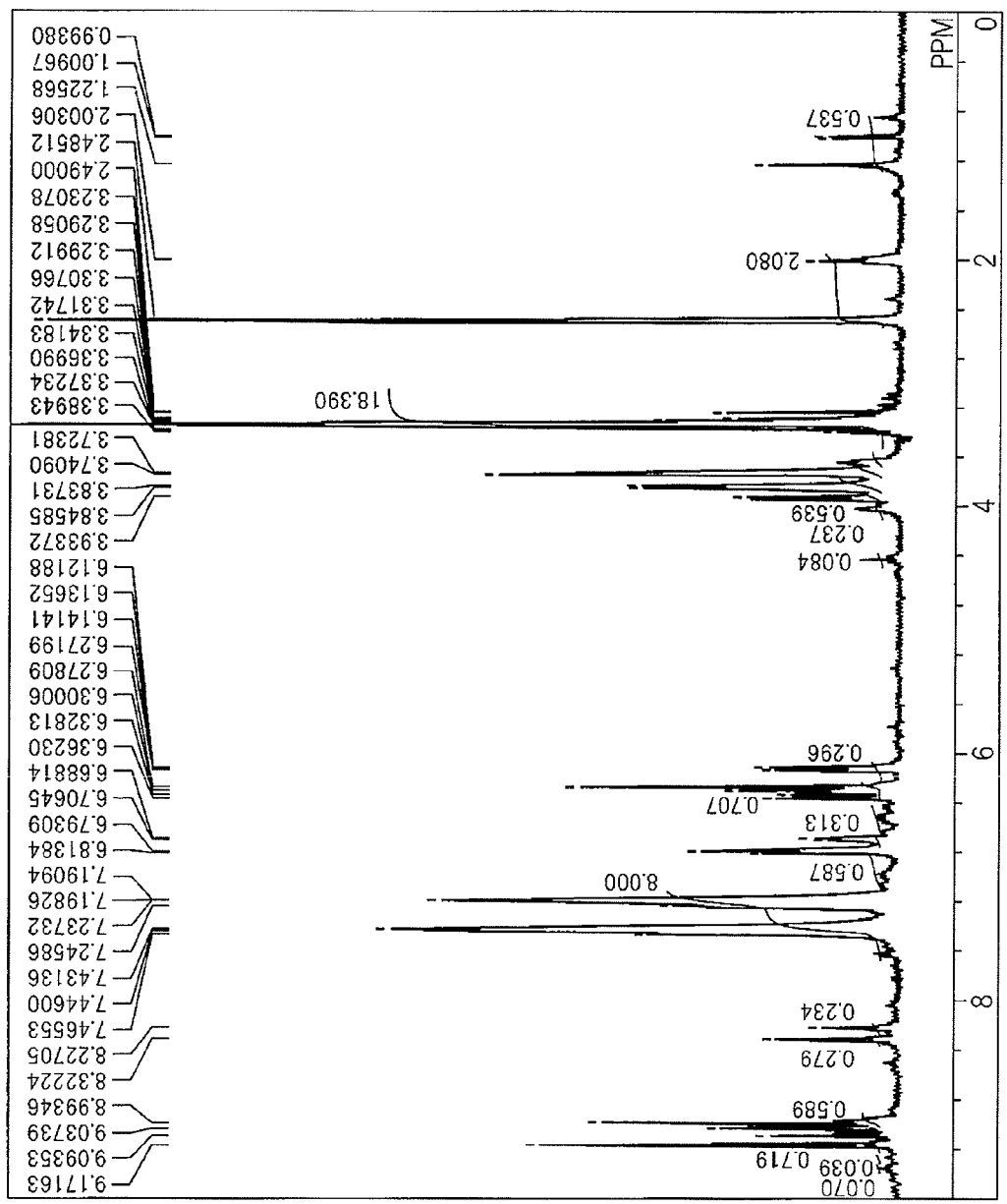
FIG. 3 A $^1$H NMR spectrum of Resin P2-1 described in Examples.

After the completion of reaction, the reaction vessel was cooled in the atmosphere, and 50 g of PGME was separately added thereto and stirred. The resulting diluted reaction solution was added dropwise to 8 L of water with high-speed stirring to disperse and precipitate a resin, and the resin was recovered, appropriately washed with water, dewatered and then vacuum-dried to obtain Resin (P2-1) at a yield of 78%. The weight average molecular weight by GPC of Resin (P2-1) thus synthesized was 6,600 in terms of polystyrene. FIG. 3 shows the NMR spectrum obtained by dissolving P2-1 in a deuterated dimethylsulfoxide solvent and measuring the solution by Model JNM-GSX 400 manufactured by JEOL Ltd.

Synthesis Example 13

Synthesis of Resin P2-2

A 1.0 L-volume separable flask with a Dean-Stark device was purged with nitrogen and thereafter, in the separable flask, 85.6 g (0.778 mol) of resorcin, 96.9 g (0.40 mol) of BMMB, 3.81 g (0.02 mol) of p-toluenesulfonic acid, and 116 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. In this state, the reaction solution was stirred at 120° C. for 3 hours.

Subsequently, 16.2 g (0.100 mol) of 2,6-bis(hydroxymethyl)-p-cresol and 162 g of PGME were mixed and stirred in a separate vessel, and the resulting uniformly dissolved solution was added dropwise over 1 hour to the separable flask by using a dropping funnel. After the dropwise addition, the system was further stirred for 2 hours. After the completion of reaction, the same processing as in Synthesis Example 12 was carried out to obtain Resin (P2-2) at a yield of 77%. The weight average molecular weight by GPC of Resin (P2-2) synthesized was 9,000 in terms of polystyrene.

Figure 4:
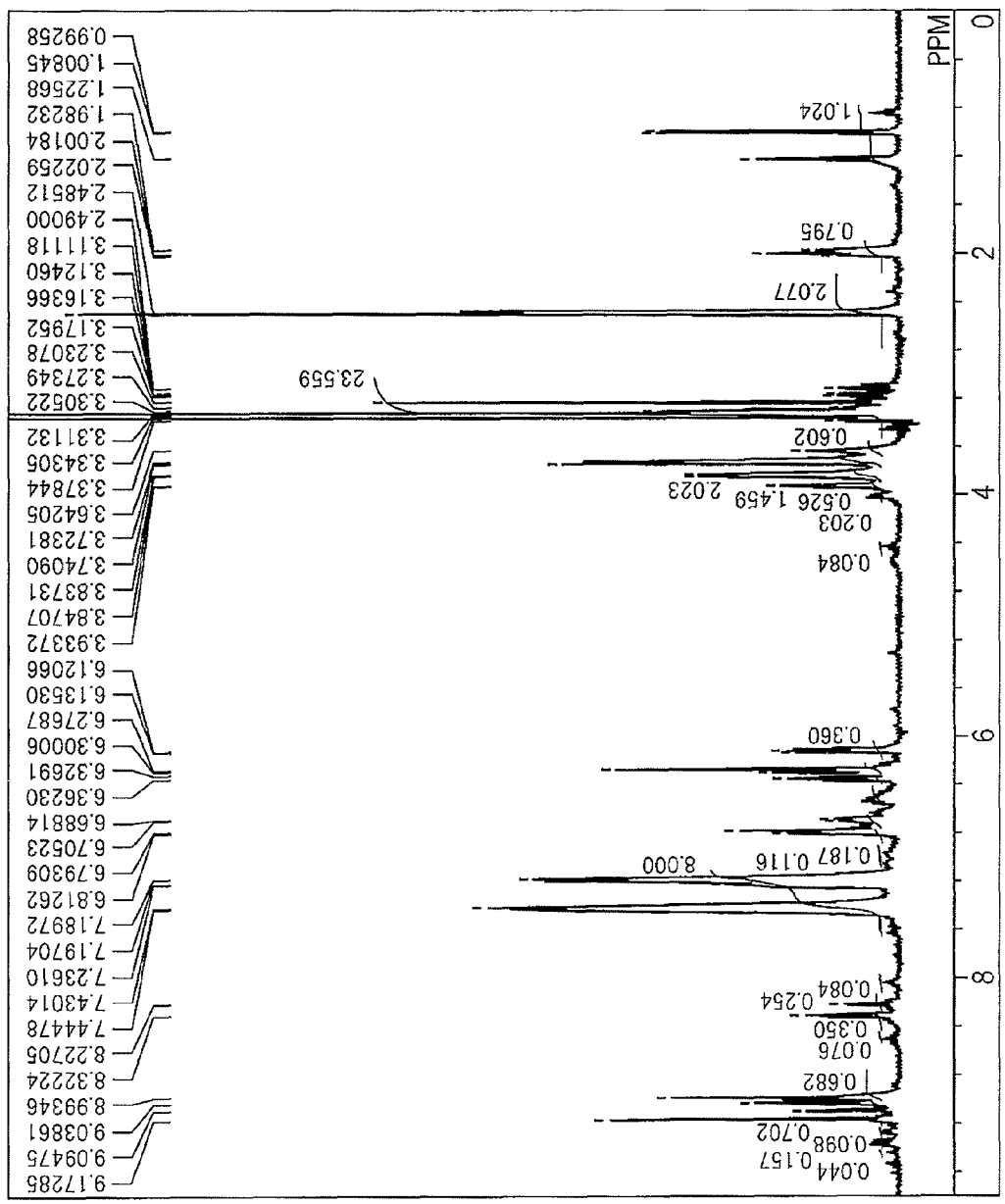
FIG. 4 A $^1$H NMR spectrum of Resin P2-2 described in Examples.

FIG. 4 shows the NMR spectrum obtained by measuring P2-2 in the same manner as in Synthesis Example 12.

Synthesis Example 14

Synthesis of Resin P2-3

A 1.0 L-volume separable flask with a Dean-Stark device was purged with nitrogen and thereafter, in the separable flask, 81.3 g (0.738 mol) of resorcin, 84.8 g (0.35 mol) of BMMB, 3.81 g (0.02 mol) of p-toluenesulfonic acid, and 116 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. In this state, the reaction solution was stirred at 120° C. for 3 hours.

Subsequently, 24.9 g (0.150 mol) of 2,6-bis(hydroxymethyl)-p-cresol and 249 g of PGME were mixed and stirred in a separate vessel, and the resulting uniformly dissolved solution was added dropwise over 1 hour to the separable flask by using a dropping funnel. After the dropwise addition, the system was further stirred for 2 hours.

Figure 5:
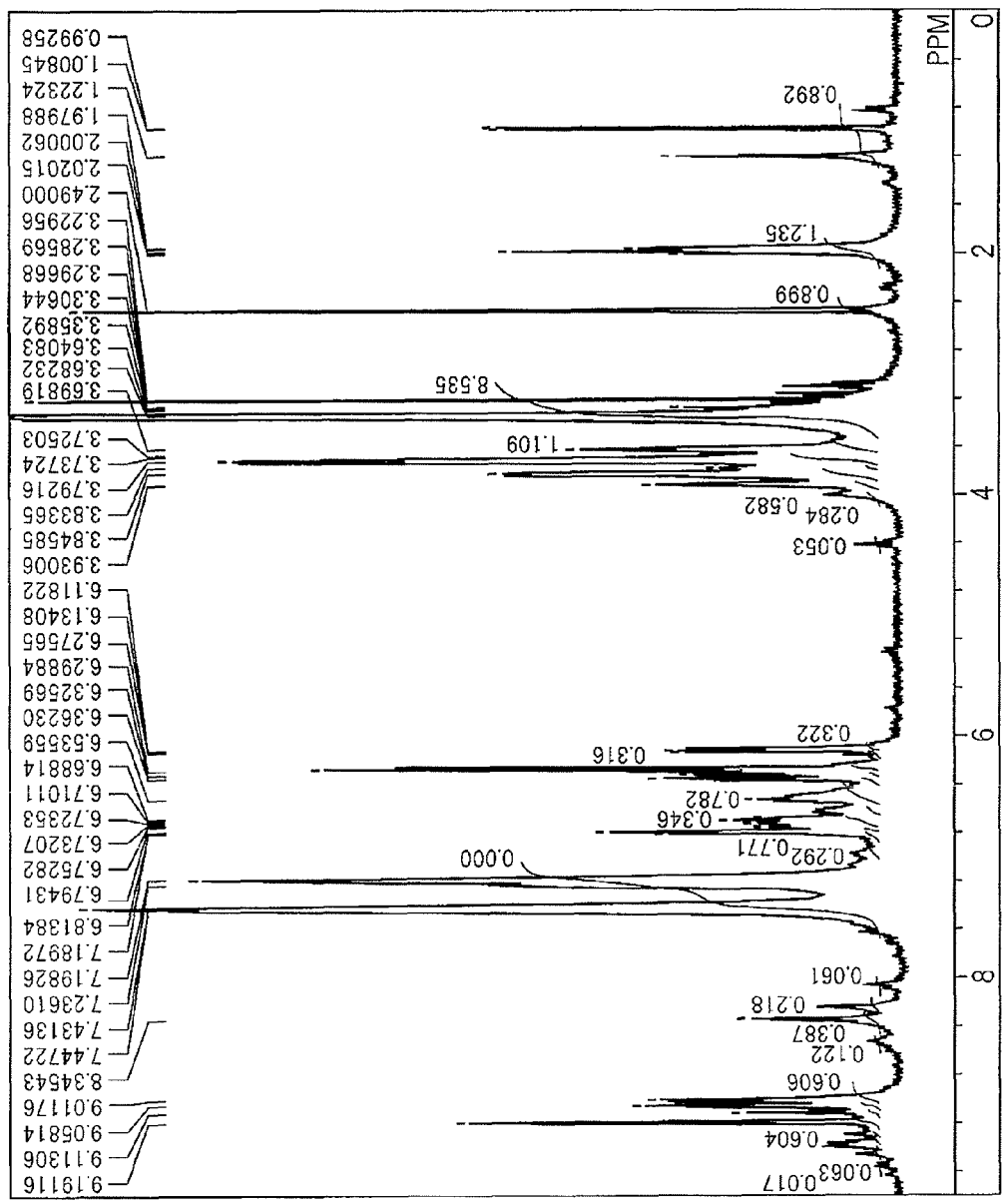
FIG. 5 A $^1$H NMR spectrum of Resin P2-3 described in Examples.

After the completion of reaction, the same processing as in Synthesis Example 12 was carried out to obtain Resin (P2-3) at a yield of 77%. The weight average molecular weight by GPC of Resin (P2-3) synthesized was 9,900 in terms of polystyrene. FIG. 5 shows the NMR spectrum obtained by measuring P2-3 in the same manner as in Synthesis Example 12.

Synthesis Example 15

Synthesis of Resin P2-4

A 1.0 L-volume separable flask with a Dean-Stark device was purged with nitrogen and thereafter, in the separable flask, 78.0 g (0.708 mol) of resorcin, 72.7 g (0.30 mol) of BMMB, 3.81 g (0.02 mol) of p-toluenesulfonic acid, and 116 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. In this state, the reaction solution was stirred at 120° C. for 3 hours.

Subsequently, 33.2 g (0.200 mol) of 2,6-bis(hydroxymethyl)-p-cresol and 332 g of PGME were mixed and stirred in a separate vessel, and the resulting uniformly dissolved solution was added dropwise over 1 hour to the separable flask by using a dropping funnel. After the dropwise addition, the system was further stirred for 2 hours.

Figure 6:
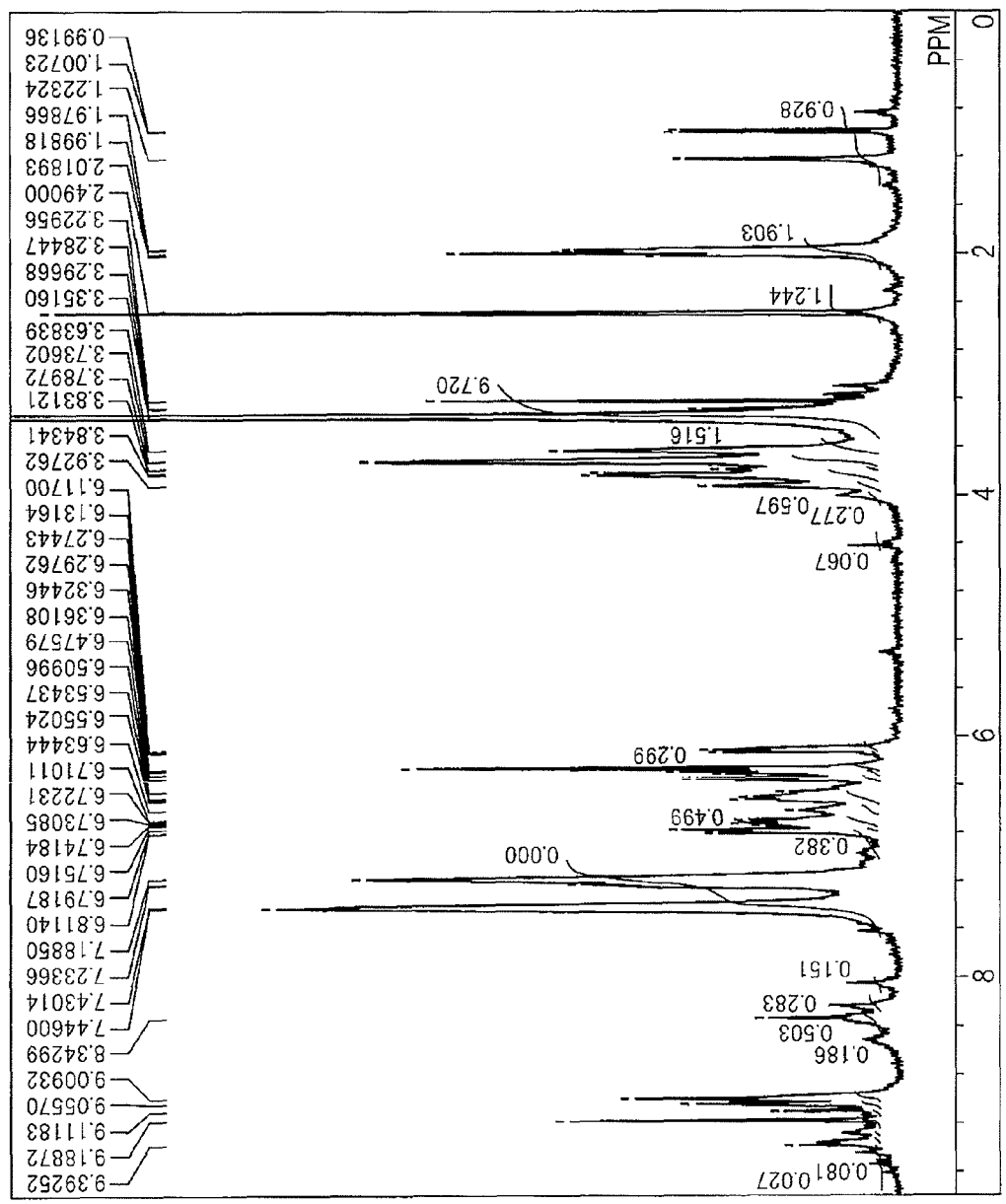
FIG. 6 A $^1$H NMR spectrum of Resin P2-4 described in Examples.

After the completion of reaction, the same processing as in Synthesis Example 12 was carried out to obtain Resin (P2-4) at a yield of 79%. The weight average molecular weight by GPC of Resin (P2-4) synthesized was 11,500 in terms of polystyrene. FIG. 6 shows the NMR spectrum obtained by measuring P2-4 in the same manner as in Synthesis Example 12.

Synthesis Example 16

Synthesis of Resin P2-5

A 1.0 L-volume separable flask with a Dean-Stark device was purged with nitrogen and thereafter, in the separable flask, 73.7 g (0.667 mol) of resorcin, 48.5 g (0.20 mol) of BMMB, 3.81 g (0.02 mol) of p-toluenesulfonic acid, and 116 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. In this state, the reaction solution was stirred at 120° C. for 3 hours.

Subsequently, 49.9 g (0.300 mol) of 2,6-bis(hydroxymethyl)-p-cresol and 499 g of PGME were mixed and stirred in a separate vessel, and the resulting uniformly dissolved solution was added dropwise over 1 hour to the separable flask by using a dropping funnel. After the dropwise addition, the system was further stirred for 2 hours. After the completion of reaction, the same processing as in Synthesis Example 12 was carried out to obtain Resin (P2-5) at a yield of 81%. The weight average molecular weight by GPC of Resin (P2-5) synthesized was 18,500 in terms of polystyrene.

Synthesis Example 17

Synthesis of Resin P2-6

A 1.0 L-volume separable flask with a Dean-Stark device was purged with nitrogen and thereafter, in the separable flask, 88.3 g (0.700 mol) of pyrogallol, 96.9 g (0.40 mol) of BMMB, 3.81 g (0.02 mol) of p-toluenesulfonic acid, and 130 g of propylene glycol monomethyl ether (PGME) were mixed and stirred at 50° C. to dissolve solids.

The mixed solution dissolved was heated to 115° C. in an oil bath, and generation of methanol was confirmed by the reaction solution. In this state, the reaction solution was stirred at 120° C. for 3 hours.

Figure 7:
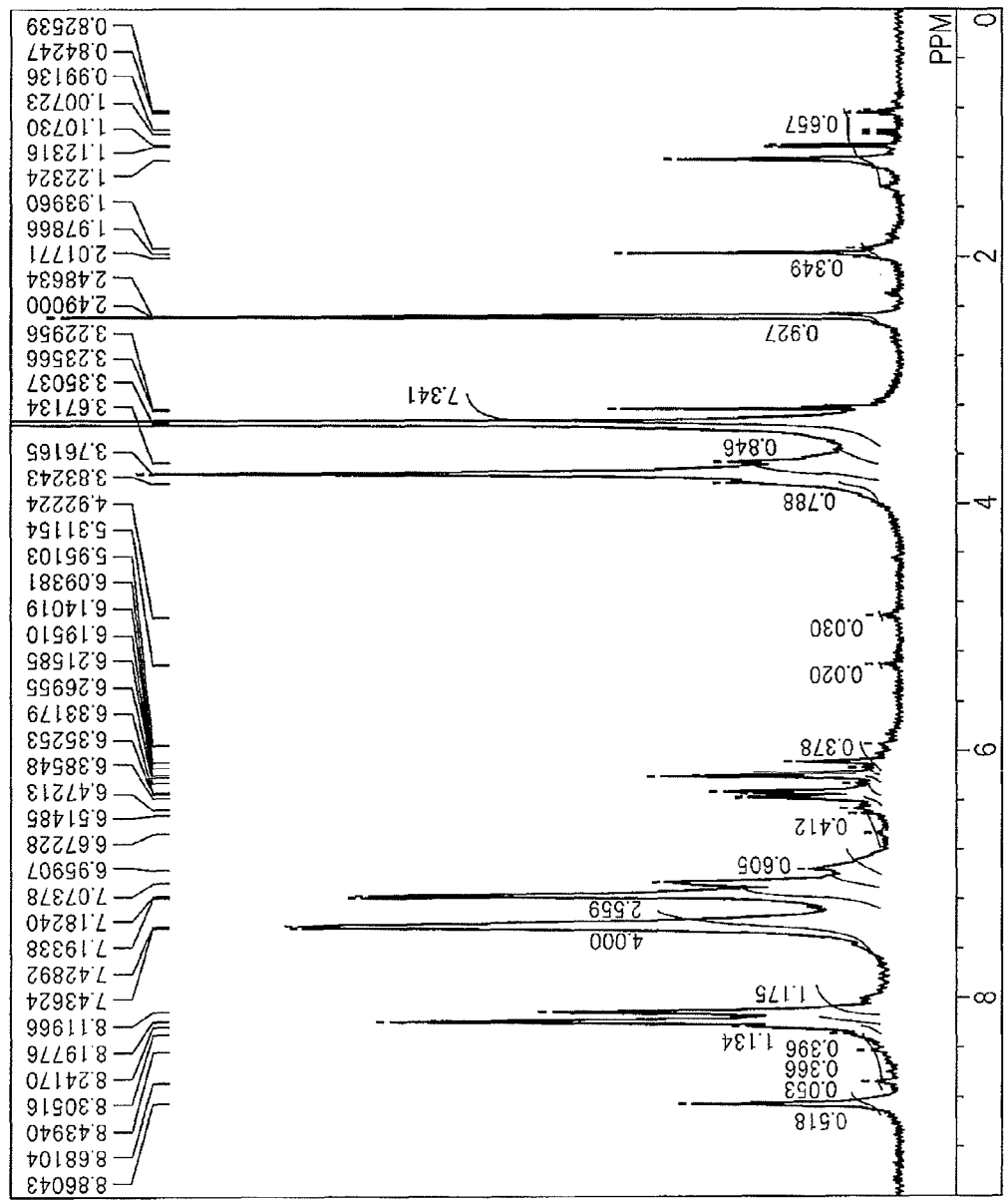
FIG. 7 A $^1$H NMR spectrum of Resin P2-6 described in Examples.

Subsequently, 16.6 g (0.100 mol) of 2,6-bis(hydroxymethyl)-p-cresol and 166 g of PGME were mixed and stirred in a separate vessel, and the resulting uniformly dissolved solution was added dropwise over 1 hour to the separable flask by using a dropping funnel. After the dropwise addition, the system was further stirred for 2 hours. After the completion of reaction, the same processing as in Synthesis Example 12 was carried out to obtain Resin (P2-6) at a yield of 81%. The weight average molecular weight by GPC of Resin (P2-6) synthesized was 11,200 in terms of polystyrene. FIG. 7 shows the NMR spectrum obtained by measuring P2-6 in the same manner as in Synthesis Example 12.

Synthesis Example 18

Synthesis of Resin P2-7

A 1.0 L-volume separable flask with a Dean-Stark device was purged with nitrogen and thereafter, in the separable flask, 119.7 g (0.738 mol) of phloroglucinol dihydrate, 109.0 g (0.45 mol) of BMMB, 3.81 g (0.02 mol) of p-toluenesulfonic acid, and 130 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. In this state, the reaction solution was stirred at 120° C. for 3 hours.

Figure 8:
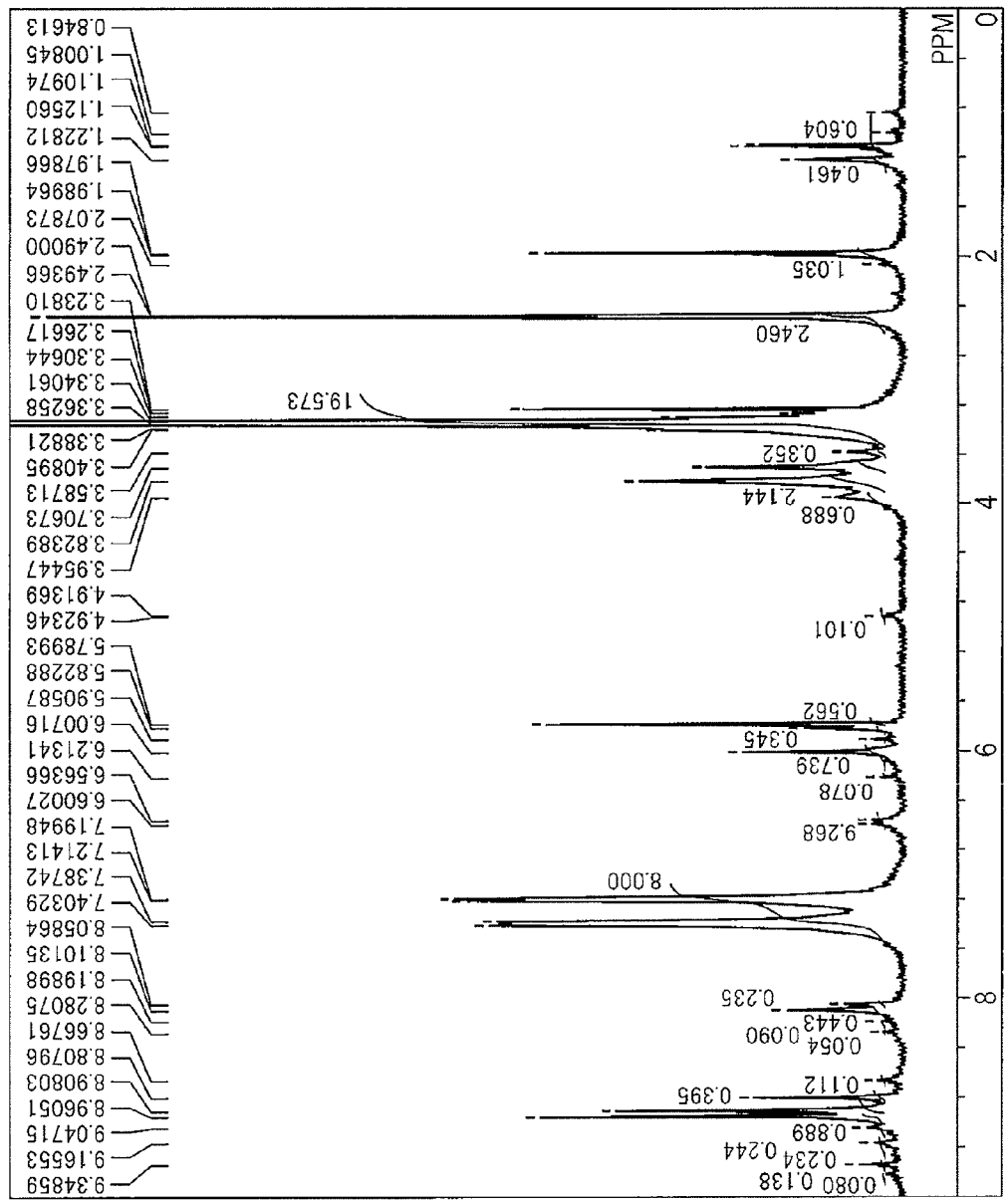
FIG. 8 A $^1$H NMR spectrum of Resin P2-7 described in Examples.

Subsequently, 8.3 g (0.100 mol) of 2,6-bis(hydroxymethyl)-p-cresol and 83 g of PGME were mixed and stirred in a separate vessel, and the resulting uniformly dissolved solution was added dropwise over 1 hour to the separable flask by using a dropping funnel. After the dropwise addition, the system was further stirred for 2 hours. After the completion of reaction, the same processing as in Synthesis Example 12 was carried out to obtain Resin (P2-7) at a yield of 84%. The weight average molecular weight by GPC of Resin (P2-7) synthesized was 21,000 in terms of polystyrene. FIG. 8 shows the NMR spectrum obtained by measuring P2-7 in the same manner as in Synthesis Example 12.

Synthesis Example 19

Synthesis of Resin P2-8

Synthesis was carried out in the same manner as in Synthesis Example 15 by using 39.6 g (0.200 mol) of 2,6-bis(hydroxymethyl)-4-ethoxyphenol in place of 33.2 g (0.200 mol) of 2,6-bis(hydroxymethyl)-p-cresol of Synthesis Example 15, whereby Resin (P2-8) was obtained at a yield of 82%. The weight average molecular weight by GPC of Resin (P2-8) synthesized was 10,800 in terms of polystyrene.

Synthesis Example 20

Synthesis of Resin P2-9

Synthesis was carried out in the same manner as in Synthesis Example 15 by using 47.7 g (0.200 mol) of 2,6-bis(hydroxymethyl)-4-t-butylphenol in place of 33.2 g (0.200 mol) of 2,6-bis(hydroxymethyl)-p-cresol of Synthesis Example 15, whereby Resin (P2-9) was obtained at a yield of 80%. The weight average molecular weight by GPC of Resin (P2-9) synthesized was 10,200 in terms of polystyrene.

Synthesis Example 21

Synthesis of Resin P2-10

A 1.0 L-volume separable flask with a Dean-Stark device was purged with nitrogen and thereafter, in the separable flask, 91.8 g (0.833 mol) of resorcin, 82.1 g (0.18 mol) of TML-BPAF-MF (product name of Honshu Chemical Industry Co., Ltd.), 3.81 g (0.02 mol) of p-toluenesulfonic acid, and 116 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. In this state, the reaction solution was stirred at 120° C. for 3 hours.

Subsequently, 41.5 g (0.25 mol) of 2,6-bis(hydroxymethyl)-p-cresol and 83 g of PGME were mixed and stirred in a separate vessel, and the resulting uniformly dissolved solution was added dropwise over 1 hour to the separable flask by using a dropping funnel. After the dropwise addition, the system was further stirred for 2 hours. After the completion of reaction, the reaction vessel was cooled in the atmosphere, and 50 g of PGME was separately added thereto and stirred. The resulting diluted reaction solution was added dropwise to 8 L of water with high-speed stirring to disperse and precipitate a resin, and the resin was recovered, appropriately washed with water, dewatered and then vacuum-dried to obtain Resin (P2-10) at a yield of 75%. The weight average molecular weight by GPC of Resin (P2-10) thus synthesized was 8,600 in terms of polystyrene.

The structure of TML-BPAF-MF is shown below.

[Chem. 73]

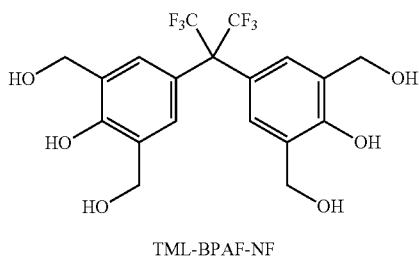

TML-BPAF-NF

Synthesis Example 22

Synthesis of Resin P2-11

Synthesis was carried out in the same manner as in Synthesis Example 12 by using 72.8 g (0.18 mol) of TMOM-BPA (product name of Honshu Chemical Industry Co., Ltd.) in place of 82.1 g (0.18 mol) of TML-BPAF-MF (product name of Honshu Chemical Industry Co., Ltd.) of Synthesis Example 21, whereby Resin (P2-11) was obtained at a yield of 73%. The weight average molecular weight by GPC of Resin (P2-11) synthesized was 7,600 in terms of polystyrene.

The structure of TMOM-BPA is shown below.

[Chem. 74]

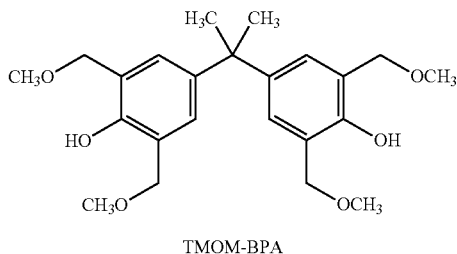

TMOM-BPA

<Evaluation Results of Alkali Solubility>

Using Resins P2-1 to P2-11 obtained in Synthesis Examples 12 to 22, Resin P2-12 (EP-4080G, a novolak resin, produced by Asahi Organic Chemicals Industry Co., Ltd., weight average molecular weight=10,600), Resin P2-13 (MEH-7851-4H, a phenol-biphenyldiyl resin, produced by Meiwa Plastic Industries, Ltd., weight average molecular weight=10,000) and Resin P2-14 (MEH-7851-SS, a phenol-biphenyldiyl resin, produced by Meiwa Plastic Industries, Ltd., weight average molecular weight=1,600), the alkali solubility was evaluated by the above-described method. The results are shown in Table 3 below.

Preparation and Evaluation of Positive-Type Photosensitive Resin Composition

Example 21

100 Parts by mass of Resin (P2-1) obtained in Synthesis Example 12 and 11 parts by mass of Photoacid Generator (B-1) were dissolved in 114 parts by mass of γ-butyrolactone (GBL), and the solution was filtered through a 0.1 μm filter to prepare a positive-type photosensitive resin composition. The resin composition was evaluated for the cured relief pattern profile and tensile elongation. The evaluation results are shown in Table 4.

Example 22

Preparation and evaluation were carried out in the same manner as in Example 1, except that 10 parts by mass of Crosslinking Agent (C-1) was further added in Example 21. The evaluation results are shown in Table 4.

Examples 23 to 32

Compositions were prepared and evaluated in the same manner as in Example 22, except that Resin P2-1 was replaced by Resins P2-2 to P2-11 as shown in Table 4. The evaluation results are shown in Table 4.

Example 33

100 Parts by mass of Resin (P2-3), 5 parts by mass of Photoacid Generator (B-2) and 15 parts by mass of Crosslinking Agent (C-1) were dissolved in 114 parts by mass of GBL, and the solution was filtered through a 0.1 μm filter to prepare a negative-type photosensitive resin composition. The resin composition was evaluated for the cured relief pattern profile and tensile elongation. The evaluation results are shown in Table 4.

Example 34

Preparation and evaluation were carried out in the same manner as in Example 24, except that the amount added of Photosensitizing Agent B-1 was changed to 20 parts by mass in Example 24. The evaluation results are shown in Table 4.

Example 35

Preparation and evaluation were carried out in the same manner as in Example 24, except that the amount added of Crosslinking Agent C-1 was changed to 40 parts by mass in Example 24. The evaluation results are shown in Table 4.

Example 36

Preparation and evaluation were carried out in the same manner as in Example 24, except that 20 parts by mass of

TABLE 3

| Resin | P2-1 | P2-2 | P2-3 | P2-4 | P2-5 | P2-6 | P2-7 | P2-8 | P2-9 | P2-10 | P2-11 | P2-12 | P2-13 | P2-14 |
|---|---|---|---|---|---|---|---|---|---|---|---|---|---|---|
| Alkali dissolution rate [*$10^{-2}$ um/sec] | 1.7 | 2.2 | 2.6 | 2.8 | 3.6 | 12.3 | 15.5 | 2.1 | 1.9 | 3.5 | 3.2 | 5.0 | 0.0 | 5.9 |
| Evaluation of alkali solubility | good | good | good | good | good | good | good | good | good | good | good | good | bad | good |

Crosslinking Agent C-2 was added in place of Crosslinking Agent C-1 in Example 24. The evaluation results are shown in Table 4.

Example 37

Preparation and evaluation were carried out in the same manner as in Example 24, except that 20 parts by mass of Crosslinking Agent C-3 was added in place of Crosslinking Agent C-1 in Example 24. The evaluation results are shown in Table 4.

Example 38

Preparation and evaluation were carried out in the same manner as in Example 24, except that 15 parts by mass of Crosslinking Agent C-4 was added in place of Crosslinking Agent C-1 in Example 24. The evaluation results are shown in Table 4.

Example 39

Preparation and evaluation were carried out in the same manner as in Example 24, except that 10 parts by mass of Crosslinking Agent C-5 was added in place of Crosslinking Agent C-1 in Example 24. The evaluation results are shown in Table 4.

Example 40

Preparation and evaluation were carried out in the same manner as in Example 24, except that 4 parts by mass of Thermal Acid Generator (D-1) was further added and evaluation was carried out at a curing temperature of 200° C. in Example 24. The evaluation results are shown in Table 4.

Example 41

Preparation and evaluation were carried out in the same manner as in Example 24, except that evaluation was carried out at a curing temperature of 200° C. in Example 24. The evaluation results are shown in Table 4.

Example 42

Preparation and evaluation were carried out in the same manner as in Example 26, except that 15 parts by mass of Photoacid Generator B-3 was added in place of Photoacid Generator B-1 in Example 26. The evaluation results are shown in Table 4.

Example 43

Preparation and evaluation were carried out in the same manner as in Example 26, except that 57 parts by mass of GBL and 57 parts by mass of tetrahydrofurfuryl alcohol were added in place of 114 parts by mass of GBL in Example 26. The evaluation results are shown in Table 4.

Example 44

Preparation and evaluation were carried out in the same manner as in Example 26, except that 5 parts by mass of phthalic acid was further added in Example 26. The evaluation results are shown in Table 4.

Example 45

Preparation and evaluation were carried out in the same manner as in Example 26, except that 5 parts by mass of pyromellitic acid was further added in Example 26. The evaluation results are shown in Table 4.

Comparative Example 5

Preparation and evaluation were carried out in the same manner as in Example 21, except that Resin P2-1 was replaced by Resin (P2-12) in Example 21. With respect to the cured relief pattern profile, the pattern was buried, and the evaluation was "bad". The evaluation results are shown in Table 4.

Comparative Example 6

Preparation and evaluation were carried out in the same manner as in Example 21, except that Resin P2-1 was replaced by Resin (P2-13) in Example 21. With respect to the cured relief pattern profile, a relief pattern could not be formed due to insufficient alkali solubility, failing in evaluation. The evaluation results are shown in Table 4.

Comparative Example 7

Preparation and evaluation were carried out in the same manner as in Example 21, except that Resin P2-1 was replaced by Resin (P2-14) in Example 21. With respect to the cured relief pattern profile, the pattern was buried, and the evaluation was "bad". The evaluation results are shown in Table 4.

Comparative Example 8

Preparation and evaluation were carried out in the same manner as in Example 22, except that Resin P2-1 was replaced by Resin (P2-14) in Example 22. With respect to the cured relief pattern profile, the pattern was buried, and the evaluation was "bad". The evaluation results are shown in Table 4.

TABLE 4

| | Example | | | | | | | | | |
|---|---|---|---|---|---|---|---|---|---|---|
| | 21 | 22 | 23 | 24 | 25 | 26 | 27 | 28 | 29 | 30 |
| Polymer (100 parts by mass) | P2-1 | P2-1 | P2-2 | P2-3 | P2-4 | P2-5 | P2-6 | P2-7 | P2-8 | P2-9 |
| Photoacid Generator B-1 (parts by mass) | 11 | 11 | 11 | 11 | 11 | 11 | 11 | 11 | 11 | 11 |
| Photoacid Generator B-2 (parts by mass) | | | | | | | | | | |
| Photoacid Generator B-3 (parts by mass) | | | | | | | | | | |

TABLE 4-continued

| | | | | | | | | | | |
|---|---|---|---|---|---|---|---|---|---|---|
| Crosslinking Agent C-1 (parts by mass) | 10 | 10 | 10 | 10 | 10 | 10 | 10 | 10 | 10 | |
| Crosslinking Agent C-2 (parts by mass) | | | | | | | | | | |
| Crosslinking Agent C-3 (parts by mass) | | | | | | | | | | |
| Crosslinking Agent C-4 (parts by mass) | | | | | | | | | | |
| Crosslinking Agent C-5 (parts by mass) | | | | | | | | | | |
| Thermal Acid Generator D-1 (parts by mass) | | | | | | | | | | |
| GBL | 114 | 114 | 114 | 114 | 114 | 114 | 114 | 114 | 114 | 114 |
| Tetrahydrofurfuryl alcohol | | | | | | | | | | |
| Phthalic acid | | | | | | | | | | |
| Pyromellitic acid | | | | | | | | | | |
| Cured relief pattern profile | good | good | good | good | good | good | good | good | good | good |
| Elongation [%] | 14 | 69 | 67 | 66 | 52 | 36 | 38 | 36 | 47 | 42 |
| Curing temperature [° C.] | 225 | 225 | 225 | 225 | 225 | 225 | 225 | 225 | 225 | 225 |

| | Example |||||||||| 
|---|---|---|---|---|---|---|---|---|---|---|
| | 31 | 32 | 33 | 34 | 35 | 36 | 37 | 38 | 39 | 40 |
| Polymer (100 parts by mass) | P2-10 | P2-11 | P2-3 | P2-3 | P2-3 | P2-3 | P2-3 | P2-3 | P2-3 | P2-3 |
| Photoacid Generator B-1 (parts by mass) | 11 | 11 | | 20 | 11 | 11 | 11 | 11 | 11 | 11 |
| Photoacid Generator B-2 (parts by mass) | | | 5 | | | | | | | |
| Photoacid Generator B-3 (parts by mass) | | | | | | | | | | |
| Crosslinking Agent C-1 (parts by mass) | 10 | 10 | 15 | 10 | 40 | | | | | 10 |
| Crosslinking Agent C-2 (parts by mass) | | | | | | 20 | | | | |
| Crosslinking Agent C-3 (parts by mass) | | | | | | | 20 | | | |
| Crosslinking Agent C-4 (parts by mass) | | | | | | | | 15 | | |
| Crosslinking Agent C-5 (parts by mass) | | | | | | | | | 10 | |
| Thermal Acid Generator D-1 (parts by mass) | | | | | | | | | | 4 |
| GBL | 114 | 114 | 114 | 114 | 114 | 114 | 114 | 114 | 114 | 114 |
| Tetrahydrofurfuryl alcohol | | | | | | | | | | |
| Phthalic acid | | | | | | | | | | |
| Pyromellitic acid | | | | | | | | | | |
| Cured relief pattern profile | good | good | good | good | good | good | good | good | good | good |
| Elongation [%] | 32 | 30 | 57 | 52 | 42 | 35 | 28 | 35 | 58 | 42 |
| Curing temperature [° C.] | 225 | 225 | 225 | 225 | 225 | 225 | 225 | 225 | 225 | 200 |

| | Example ||||| Comparative Example ||||
|---|---|---|---|---|---|---|---|---|---|
| | 41 | 42 | 43 | 44 | 45 | 5 | 6 | 7 | 8 |
| Polymer (100 parts by mass) | P2-3 | P2-5 | P2-5 | P2-5 | P2-5 | P2-12 | P2-13 | P2-14 | P2-14 |
| Photoacid Generator B-1 (parts by mass) | 11 | | 11 | 11 | 11 | 11 | 11 | 11 | 11 |
| Photoacid Generator B-2 (parts by mass) | | | | | | | | | |
| Photoacid Generator B-3 (parts by mass) | | 15 | | | | | | | |
| Crosslinking Agent C-1 (parts by mass) | 10 | 10 | 10 | 10 | 10 | | | | 10 |
| Crosslinking Agent C-2 (parts by mass) | | | | | | | | | |
| Crosslinking Agent C-3 (parts by mass) | | | | | | | | | |
| Crosslinking Agent C-4 (parts by mass) | | | | | | | | | |
| Crosslinking Agent C-5 (parts by mass) | | | | | | | | | |
| Thermal Acid Generator D-1 (parts by mass) | | | | | | | | | |

TABLE 4-continued

| | | | | | | | | | |
|---|---|---|---|---|---|---|---|---|---|
| GBL | 114 | 114 | 57 | 114 | 114 | 114 | 114 | 114 | 114 |
| Tetrahydrofurfuryl alcohol | | | 57 | | | | | | |
| Phthalic acid | | | | 5 | | | | | |
| Pyromellitic acid | | | | | 5 | | | | |
| Cured relief pattern profile | good | good | good | good | good | bad | — | bad | bad |
| Elongation [%] | 24 | 25 | 22 | 24 | 24 | 3 | 5 | 3 | 22 |
| Curing temperature [° C.] | 200 | 225 | 225 | 225 | 225 | 225 | 225 | 225 | 225 |

Results shown in Table 4 reveal that in Examples 21 to 45, tensile elongation of the cured film is excellent, pattern formation with a thick film is possible, and a resin film ensuring a good cured relief pattern profile is formed.

Synthesis Example 23

Synthesis of Resin P3-1

A 1.0 L-volume separable flask with a Dean-Stark device was purged with nitrogen and thereafter, in the separable flask, 81.3 g (0.738 mol) of resorcin, 84.8 g (0.35 mol) of 4,4'-bis(methoxymethyl)biphenyl (hereinafter, referred to as "BMMB"), 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

Subsequently, 12.3 g (purity content: 0.15 mol) of a formaldehyde solution (37%) in a separate vessel was added dropwise over 1 hour to the separable flask by using a dropping funnel. After the dropwise addition, the temperature was raised to 60° C., and the system was further stirred for 2 hours.

After the completion of reaction, the reaction vessel was cooled in the atmosphere, and 50 g of PGME was separately added thereto and stirred. The resulting diluted reaction solution was added dropwise to 8 L of water with high-speed stirring to disperse and precipitate a resin, and the resin was recovered, appropriately washed with water, dewatered and then vacuum-dried to obtain Resin (P3-1) at a yield of 82%. The weight average molecular weight by GPC of Resin (P3-1) synthesized was 8,700 in terms of polystyrene.

Synthesis Example 24

Synthesis of Resin P3-2

A 1.0 L-volume separable flask with a Dean-Stark device was purged with nitrogen and thereafter, in the separable flask, 91.8 g (0.833 mol) of resorcin, 109.0 g (0.45 mol) of BMMB, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

Subsequently, 4.1 g (pure content: 0.050 mol) of a formaldehyde solution 07%) in a separate vessel was added dropwise over 1 hour to the separable flask by using a dropping funnel. After the dropwise addition, the temperature was raised to 60° C., and the system was further stirred for 2 hours.

After the completion of reaction, the same processing as in Synthesis Example 23 was carried out to obtain Resin (P3-2) at a yield of 74%. The weight average molecular weight by GPC of Resin (P3-2) synthesized was 6,400 in terms of polystyrene.

Synthesis Example 25

Synthesis of Resin P3-3

A 1.0 L-volume separable flask with a Dean-Stark device was purged with nitrogen and thereafter, in the separable flask, 85.6 g (0.778 mol) of resorcin, 96.9 g (0.40 mol) of BMMB, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

Subsequently, 8.2 g (pure content: 0.10 mol) of a formaldehyde solution (37%) in a separate vessel was added dropwise over 1 hour to the separable flask by using a dropping funnel. After the dropwise addition, the temperature was raised to 60° C., and the system was further stirred for 2 hours.

After the completion of reaction, the same processing as in Synthesis Example 23 was carried out to obtain Resin (P3-3) at a yield of 83%. The weight average molecular weight by GPC of Resin (P3-3) thus synthesized was 8,200 in terms of polystyrene.

Synthesis Example 26

Synthesis of Resin P3-4

A 1.0 L-volume separable flask with a Dean-Stark device was purged with nitrogen and thereafter, in the separable flask, 78.0 g (0.708 mol) of resorcin, 72.7 g (0.30 mol) of BMMB, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

Subsequently, 16.4 g (0.200 mol) of a formaldehyde solution (37%) in a separate vessel was added dropwise over 1 hour to the separable flask by using a dropping funnel. After the dropwise addition, the temperature was raised to 60° C., and the system was further stirred for 2 hours.

After the completion of reaction, the same processing as in Synthesis Example 23 was carried out to obtain Resin (P3-4) at a yield of 82%. The weight average molecular weight by GPC of Resin (P3-4) synthesized was 10,200 in terms of polystyrene.

Synthesis Example 27

Synthesis of Resin P3-5

A 1.0 L-volume separable flask with a Dean-Stark device was purged with nitrogen and thereafter, in the separable flask, 73.7 g (0.68 mol) of resorcin, 48.5 g (0.20 mol) of BMMB, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

Subsequently, 24.6 g (pure content: 0.300 mol) of a formaldehyde solution (37%) in a separate vessel was added dropwise over 1 hour to the separable flask by using a dropping funnel. After the dropwise addition, the temperature was raised to 60° C., and the system was further stirred for 2 hours.

After the completion of reaction, the same processing as in Synthesis Example 1 was carried out to obtain Resin (P3-5) at a yield of 74%. The weight average molecular weight by GPC of Resin (P3-5) synthesized was 13,900 in terms of polystyrene.

Synthesis Example 28

Synthesis of Resin P3-6

A 1.0 L-volume separable flask with a Dean-Stark device was purged with nitrogen and thereafter, in the separable flask, 88.3 g (0.700 mol) of pyrogallol, 96.9 g (0.40 mol) of BMMB, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 115° C. in an oil bath, and generation of methanol was confirmed by the reaction solution. After stirring the reaction solution for 3 hours while maintaining 120° C., the solution was cooled to room temperature.

Subsequently, 8.2 g (pure content: 0.10 mol) of a formaldehyde solution (37%) in a separate vessel was added dropwise over 1 hour to the separable flask by using a dropping funnel. After the dropwise addition, the temperature was raised to 60° C., and the system was further stirred for 2 hours.

After the completion of reaction, the same processing as in Synthesis Example 23 was carried out to obtain Resin (P3-6) at a yield of 80%. The weight average molecular weight by GPC of Resin (P3-6) synthesized was 10,600 in terms of polystyrene.

Synthesis Example 29

Synthesis of Resin P3-7

A 1.0 L-volume separable flask with a Dean-Stark device was purged with nitrogen and thereafter, in the separable flask, 119.7 g (0.738 mol) of phloroglucinol dihydrate, 109.0 g (0.45 mol) of BMMB, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

Subsequently, 4.1 g (pure content: 0.050 mol) of a formaldehyde solution (37%) in a separate vessel was added dropwise over 1 hour to the separable flask by using a dropping funnel. After the dropwise addition, the temperature was raised to 60° C., and the system was further stirred for 2 hours.

After the completion of reaction, the same processing as in Synthesis Example 23 was carried out to obtain Resin (P3-7) at a yield of 71%. The weight average molecular weight by GPC of Resin (P3-7) synthesized was 18,600 in terms of polystyrene.

Synthesis Example 30

Synthesis of Resin P3-8

A 1.0 L-volume separable flask with a Dean-Stark device was purged with nitrogen and thereafter, in the separable flask, 82.6 g (0.750 mol) of resorcin, 84.8 g (0.350 mol) of BMMB, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

Subsequently, 8.7 g (0.150 mol) of propionaldehyde and 50 g of PGME were mixed and stirred in a separate vessel, and the resulting uniformly dissolved solution was added dropwise over 1 hour to the separable flask by using a dropping funnel. After the dropwise addition, the temperature was raised to 60° C., and the system was further stirred for 2 hours.

After the completion of reaction, the same processing as in Synthesis Example 23 was carried out to obtain Resin (P3-8) at a yield of 82%. The weight average molecular weight by GPC of Resin (P3-8) synthesized was 8,500 in terms of polystyrene.

Synthesis Example 31

Synthesis of Resin P3-9

A 1.0 L-volume separable flask with a Dean-Stark device was purged with nitrogen and thereafter, in the separable flask, 84.0 g (0.763 mol) of resorcin, 84.8 g (0.350 mol) of BMMB, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

Subsequently, 15.0 g (0.150 mol) of 2-methylvaleraldehyde and 50 g of PGME were mixed and stirred in a separate vessel, and the resulting uniformly dissolved solution was added dropwise over 1 hour to the separable flask by using a dropping funnel. After the dropwise addition, the temperature was raised to 60° C., and the system was further stirred for 2 hours.

After the completion of reaction, the same processing as in Synthesis Example 23 was carried out to obtain Resin (P3-9) at a yield of 81%. The weight average molecular weight by GPC of Resin (P3-9) synthesized was 8,400 in terms of polystyrene.

Synthesis Example 32

Synthesis of Resin P3-10

A 1.0 L-volume separable flask with a Dean-Stark device was purged with nitrogen and thereafter, in the separable molecular weight by GPC of Resin (P3-12) synthesized was 8,600 in terms of polystyrene.

<Evaluation of Alkali Solubility>

Using Resins P3-1 to P3-12 obtained in Synthesis Examples 23 to 34, Resin P3-13 (EP-4080G, a novolak resin, produced by Asahi Organic Chemicals Industry Co., Ltd., weight average molecular weight=10,600), Resin P-14 (MEH-7851-4H, a phenol-biphenyldiyl resin, produced by Meiwa Plastic Industries, Ltd., weight average molecular weight=10,000) and Resin P-15 (MEH-7851-SS, a phenol-biphenyldiyl resin, produced by Meiwa Plastic Industries, Ltd., weight average molecular weight=1,600), the alkali solubility was evaluated by the above-described method. The results are shown in Table 5 below.

TABLE 5

| Polymer | P3-1 | P3-2 | P3-3 | P3-4 | P3-5 | P3-6 | P3-7 | P3-8 | P3-9 | P3-10 | P3-11 | P3-12 | P3-13 | P3-14 | P3-15 |
|---|---|---|---|---|---|---|---|---|---|---|---|---|---|---|---|
| Alkali dissolution rate [$*10^{-2}$ um/sec] | 3.2 | 1.9 | 3.1 | 2.8 | 4.1 | 10.4 | 14.7 | 2.9 | 2.8 | 2.5 | 2.8 | 2.9 | 5.0 | 0.0 | 5.9 |
| Evaluation of alkali solubility | good | good | good | good | good | good | good | good | good | good | good | good | good | bad | good | flask, 89.5 g (0.813 mol) of resorcin, 84.8 g (0.350 mol) of BMMB, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

Subsequently, 27.6 g (0.150 mol) of dodecanal was diluted with 50 g of PGME in a separate vessel and then added dropwise over 1 hour to the separable flask by using a dropping funnel. After the dropwise addition, the temperature was raised to 60° C., and the system was further stirred for 2 hours.

After the completion of reaction, the same processing as in Synthesis Example 23 was carried out to obtain Resin (P3-10) at a yield of 79%. The weight average molecular weight by GPC of Resin (P3-10) synthesized was 7,900 in terms of polystyrene.

Synthesis Example 33

Synthesis of Resin P3-11

Synthesis was carried out in the same manner as in Synthesis Example 31 by using 18.3 g (0.150 mol) of 5-norbornenecarboxyaldehyde in place of 15.0 g (0.150 mol) of 2-methylvaleraldehyde of Synthesis Example 31, whereby Resin (P3-11) was obtained at a yield of 80%. The weight average molecular weight by GPC of Resin (P3-11) synthesized was 8,800 in terms of polystyrene.

Synthesis Example 34

Synthesis of Resin P3-12

Synthesis was carried out in the same manner as in Synthesis Example 31 by using 18.3 g (0.150 mol) of salicylaldehyde in place of 15.0 g (0.150 mol) of 2-methylvaleraldehyde of Synthesis Example 31, whereby Resin (P3-12) was obtained at a yield of 76%. The weight average Preparation and Evaluation of Positive-Type Photosensitive Resin Composition Example 46

100 Parts by mass of Resin (P3-1) obtained in Synthesis Example 23 and 11 parts by mass of Photoacid Generator (B-1) were dissolved in 114 parts by mass of γ-butyrolactone (GBL), and the solution was filtered through a 0.1 μm filter to prepare a positive-type photosensitive resin composition. The resin composition was evaluated for the residual film ratio during heat curing, cured relief pattern profile and tensile elongation. The evaluation results are shown in Table 6.

Example 47

Preparation and evaluation were carried out in the same manner as in Example 46, except that 10 parts by mass of Crosslinking Agent (C-1) was further added in Example 46. The evaluation results are shown in Table 6.

Examples 48 to 58

Preparation and evaluation were carried out in the same manner as in Example 47, except that Resin P3-1 was replaced by Resins P3-2 to P3-12 obtained in Synthesis Examples 24 to 34 as shown in Table 6 in Example 47. The evaluation results are shown in Table 6.

Example 59

100 Parts by mass of Resin (P3-1), 5 parts by mass of Photoacid Generator (B-2) and 15 parts by mass of Crosslinking Agent (C-1) were dissolved in 114 parts by mass of GBL, and the solution was filtered through a 0.1 μm filter to prepare a negative-type photosensitive resin composition. The resin composition was evaluated for the cured relief pattern profile and tensile elongation. The evaluation results are shown in Table 6.

Example 60

Preparation and evaluation were carried out in the same manner as in Example 47, except that the amount added of Photoacid Generator B-1 was changed to 20 parts by mass in Example 47. The evaluation results are shown in Table 6.

Example 61

Preparation and evaluation were carried out in the same manner as in Example 47, except that the amount added of Crosslinking Agent C-1 was changed to 40 parts by mass in Example 47. The evaluation results are shown in Table 6.

Example 62

Preparation and evaluation were carried out in the same manner as in Example 47, except that 20 parts by mass of Crosslinking Agent C-2 was added in place of Crosslinking Agent C-1 in Example 47. The evaluation results are shown in Table 6.

Example 63

Preparation and evaluation were carried out in the same manner as in Example 47, except that 20 parts by mass of Crosslinking Agent C-3 was added in place of Crosslinking Agent C-1 in Example 47. The evaluation results are shown in Table 6.

Example 64

Preparation and evaluation were carried out in the same manner as in Example 47, except that 15 parts by mass of Crosslinking Agent C-4 was added in place of Crosslinking Agent C-1 in Example 47. The evaluation results are shown in Table 6.

Example 65

Preparation and evaluation were carried out in the same manner as in Example 47, except that 10 parts by mass of Crosslinking Agent C-7 was added in place of Crosslinking Agent C-1 in Example 47. The evaluation results are shown in Table 6.

Examples 66 and 67

Example 66 was carried out in the same manner as in Example 47, except that 4 parts by mass of Thermal Acid Generator (D-1) was further added and the curing temperature was set to 200° C. in Example 47. Example 67 was carried out in the same manner as in Example 47, except that the curing temperature was set to 200° C. in Example 47. The evaluation results are shown in Table 6.

Comparative Example 9

Preparation and evaluation were carried out in the same manner as in Example 46, except that Resin P3-1 was replaced by Resin (P3-13) in Example 46. With respect to the cured relief pattern profile, the pattern was buried, and the evaluation was "bad". The evaluation results are shown in Table 6.

Comparative Example 10

Preparation and evaluation were carried out in the same manner as in Example 47, except that Resin P3-1 was replaced by Resin (P3-13) in Example 47. With respect to the cured relief pattern profile, the pattern was buried, and the evaluation was "bad". The evaluation results are shown in Table 6.

Comparative Example 11

Preparation and evaluation were carried out in the same manner as in Example 46, except that Resin P3-1 was replaced by Resin (P3-14) in Example 46. With respect to the cured relief pattern profile, a relief pattern could not be formed due to insufficient alkali solubility, failing in evaluation. The evaluation results are shown in Table 6.

Comparative Example 12

Preparation and evaluation were carried out in the same manner as in Example 46, except that Resin P3-1 was replaced by Resin (P3-15) in Example 46. With respect to the cured relief pattern profile, the pattern was buried, and the evaluation was "bad". The evaluation results are shown in Table 6.

Comparative Example 13

Preparation and evaluation were carried out in the same manner as in Example 47, except that Resin P3-1 was replaced by Resin (P3-15) in Example 47. With respect to the cured relief pattern profile, the pattern was buried, and the evaluation was "bad". The evaluation results are shown in Table 6.

TABLE 6

|  | Example | | | | | | | | | |
| --- | --- | --- | --- | --- | --- | --- | --- | --- | --- | --- |
|  | 46 | 47 | 48 | 49 | 50 | 51 | 52 | 53 | 54 | 55 |
| Polymer (100 parts by mass) | P3-1 | P3-1 | P3-2 | P3-3 | P3-4 | P3-5 | P3-6 | P3-7 | P3-8 | P3-9 |
| Photoacid Generator B-1 | 11 | 11 | 11 | 11 | 11 | 11 | 11 | 11 | 11 | 11 |
| Photoacid Generator B-2 | | | | | | | | | | |
| Crosslinking Agent C-1 | | 10 | 10 | 10 | 10 | 10 | 10 | 10 | 10 | 10 |
| Crosslinking Agent C-2 | 20 | | | | | | | | | |
| Crosslinking Agent C-3 | | | | | | | | | | |
| Crosslinking Agent C-4 | | | | | | | | | | |
| Crosslinking Agent C-7 | | | | | | | | | | |
| Thermal Acid Generator D-1 | | | | | | | | | | |
| Residual film ratio during curing [%] | 85.1 | 86.3 | 85.3 | 85.8 | 86.9 | 85.7 | 85.4 | 86.6 | 86.5 | 86.8 |
| Cured relief pattern profile | good | good | good | good | good | good | good | good | good | good |
| Elongation [%] | 10 | 51 | 37 | 46 | 39 | 25 | 29 | 27 | 46 | 42 |
| Curing temperature [° C.] | 225 | 225 | 225 | 225 | 225 | 225 | 225 | 225 | 225 | 225 |

TABLE 6-continued

| | Example | | | | | | | | | |
|---|---|---|---|---|---|---|---|---|---|---|
| | 56 | 57 | 58 | 59 | 60 | 61 | 62 | 63 | 64 | 65 |
| Polymer (100 parts by mass) | P3-10 | P3-11 | P3-12 | P3-1 | P3-1 | P3-1 | P3-1 | P3-1 | P3-1 | P3-1 |
| Photoacid Generator B-1 | 11 | 11 | 11 | | 20 | 11 | 11 | 11 | 11 | 11 |
| Photoacid Generator B-2 | | | | 5 | | | | | | |
| Crosslinking Agent C-1 | 10 | 10 | 10 | 15 | 10 | 40 | | | | |
| Crosslinking Agent C-2 | | | | | | | 20 | | | |
| Crosslinking Agent C-3 | | | | | | | | 20 | | |
| Crosslinking Agent C-4 | | | | | | | | | 15 | |
| Crosslinking Agent C-7 | | | | | | | | | | 10 |
| Thermal Acid Generator D-1 | | | | | | | | | | |
| Residual film ratio during curing [%] | 87 | 86.7 | 87.2 | 87.4 | 84.9 | 87.3 | 86.2 | 85.4 | 87.3 | 88.2 |
| Cured relief pattern profile | good | good | good | good | good | good | good | good | good | good |
| Elongation [%] | 32 | 36 | 35 | 41 | 43 | 36 | 41 | 36 | 42 | 48 |
| Curing temperature [° C.] | 225 | 225 | 225 | 225 | 225 | 225 | 225 | 225 | 225 | 225 |

| | Example | | Comparative Example | | | | |
|---|---|---|---|---|---|---|---|
| | 66 | 67 | 9 | 10 | 11 | 12 | 13 |
| Polymer (100 parts by mass) | P3-1 | P3-1 | P3-13 | P3-13 | P3-14 | P3-15 | P3-15 |
| Photoacid Generator B-1 | 11 | 11 | 11 | 11 | 11 | 11 | 11 |
| Photoacid Generator B-2 | | | | | | | |
| Crosslinking Agent C-1 | 10 | 10 | | 10 | | | 10 |
| Crosslinking Agent C-2 | | | | | | | |
| Crosslinking Agent C-3 | | | | | | | |
| Crosslinking Agent C-4 | | | | | | | |
| Crosslinking Agent C-7 | | | | | | | |
| Thermal Acid Generator D-1 | 4 | | | | | | |
| Residual film ratio during curing [%] | 87.2 | 87.7 | 76.4 | 81.2 | — | 85.2 | 86.8 |
| Cured relief pattern profile | good | good | bad | bad | — | bad | bad |
| Elongation [%] | 45 | 27 | 3 | 4 | 5 | 3 | 22 |
| Curing temperature [° C.] | 200 | 200 | 225 | 225 | 225 | 225 | 225 |

It is understood from Table 6 that the photosensitive resin composition of the present invention is excellent in tensile elongation of the cured film, enables pattern formation with a thick film, and provides a resin film ensuring a good cured relief pattern profile.

Synthesis Example 35

Synthesis of Resin P4-1

A 1.0 L-volume separable flask with a Dean-Stark device was purged with nitrogen and thereafter, in the separable flask, 83.3 g (0.885 mol) of phenol, 48.5 g (0.20 mol) of BMMB, 3.81 g (0.02 mol) of p-toluenesulfonic acid, and 116 g of diglyme (DMDG) were mixed and stirred at 50° C. to dissolve solids.

The mixed solution dissolved was heated to 150° C. in an oil bath, and generation of methanol was confirmed by the reaction solution. In this state, the reaction solution was stirred at 150° C. for 3 hours, and then the solution was cooled to 120° C.

Subsequently, 50.5 g (0.300 mol) of 2,6-bis(hydroxymethyl)-p-cresol and 450 g of propylene glycol monomethyl ether (PGME) were mixed and stirred in a separate vessel, and the resulting uniformly dissolved solution was added dropwise over 1 hour to the separable flask by using a dropping funnel. After the dropwise addition, the system was further stirred for 2 hours.

After the completion of reaction, the reaction vessel was cooled in the atmosphere, and the resulting diluted reaction solution was added dropwise to 8 L of water with high-speed stirring to disperse and precipitate a resin, and the resin was recovered, appropriately washed with water, dewatered and then vacuum-dried to obtain Resin (P4-1) at a yield of 64%. The weight average molecular weight by GPC of Resin (P4-1) synthesized was 4,700 in terms of polystyrene.

Synthesis Example 36

Synthesis of Resin P4-2

A 1.0 L-volume separable flask with a Dean-Stark device was purged with nitrogen and thereafter, in the separable flask, 114.1 g (0.75 mol) of methyl 2-hydroxybenzoate, 72.7 g (0.30 mol) of BMMB, 3.81 g (0.02 mol) of p-toluenesulfonic acid, and 116 g of diglyme (DMDG) were mixed and stirred at 50° C. to dissolve solids.

The mixed solution dissolved was heated to 150° C. in an oil bath, and generation of methanol was confirmed by the reaction solution. In this state, the reaction solution was stirred at 150° C. for 3 hours, and then the solution was cooled to 120° C.

Subsequently, 33.2 g (0.200 mol) of 2,6-bis(hydroxymethyl)-p-cresol and 332 g of PGME were mixed and stirred in a separate vessel, and the resulting uniformly dissolved solution was added dropwise over 1 hour to the separable flask by using a dropping funnel. After the dropwise addition, the system was further stirred for 2 hours.

After the completion of reaction, the reaction vessel was cooled in the atmosphere, and the resulting diluted reaction solution was added dropwise to 8 L of water with high-speed stirring to disperse and precipitate a resin, and the resin was recovered, appropriately washed with water, dewatered and then vacuum-dried to obtain Resin (P4-2) at a yield of 74%. The weight average molecular weight by GPC of Resin (P4-2) synthesized was 6,900 in terms of polystyrene.

Synthesis Example 37

Synthesis of Resin P4-3

A 1.0 L-volume separable flask with a Dean-Stark device was purged with nitrogen and thereafter, in the separable flask, 95.8 g (0.870 mol) of resorcin, 84.8 g (0.500 mol) of BMMB, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

Figure 9:
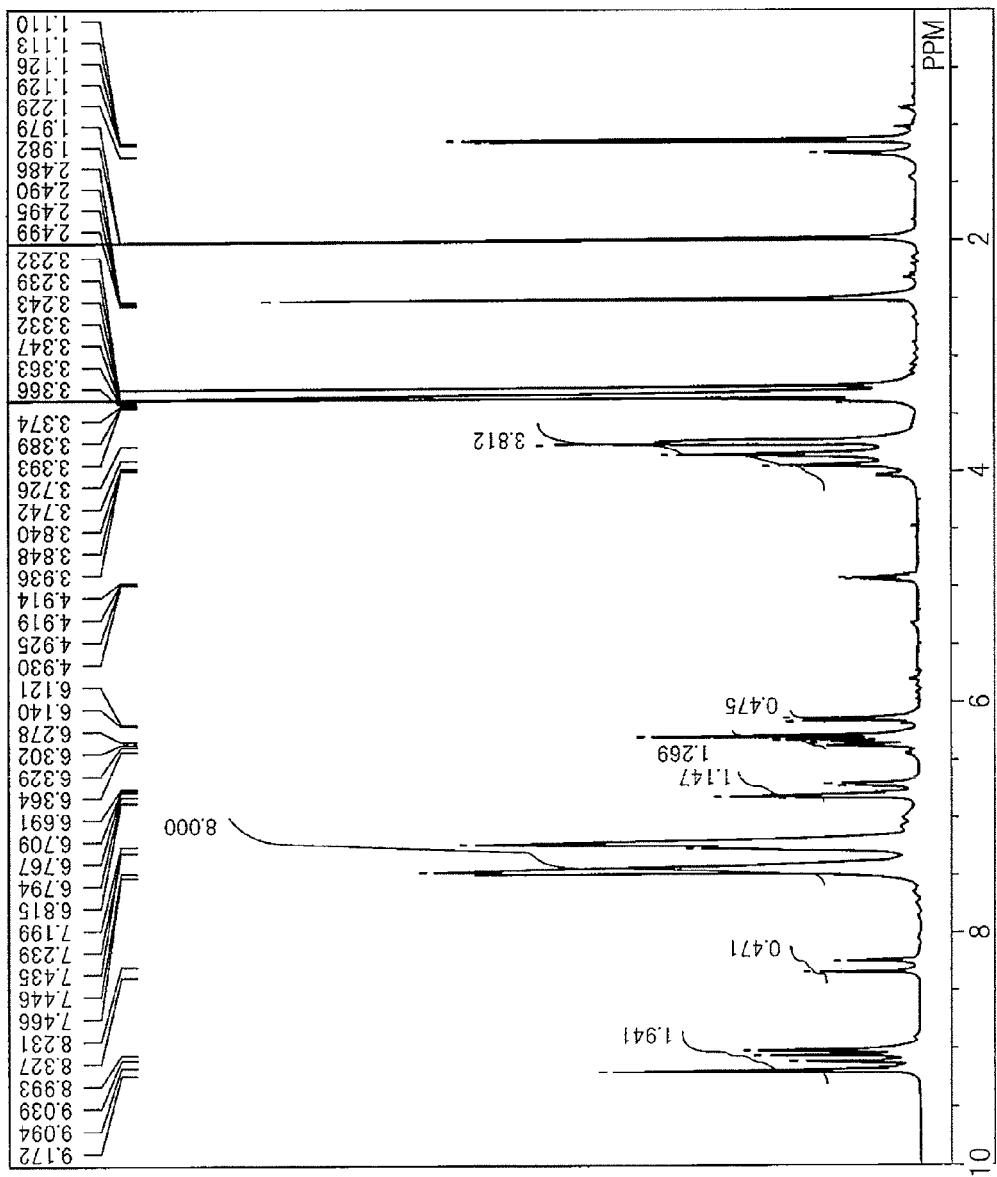
FIG. 9 A $^1$H NMR spectrum of Resin P4-3 described in Examples.

After the completion of reaction, the reaction vessel was cooled in the atmosphere, and 300 g of PGME was separately added thereto and stirred. The resulting diluted reaction solution was added dropwise to 8 L of water with high-speed stirring to disperse and precipitate a resin, and the resin was recovered, appropriately washed with water, dewatered and then vacuum-dried to obtain Resin (P4-3) at a yield of 66%. The weight average molecular weight by GPC of Resin (P4-3) synthesized was 5,800 in terms of polystyrene. FIG. 9 shows the NMR spectrum obtained by dissolving P4-3 in a deuterated dimethylsulfoxide solvent and measuring the solution by Model JNM-GSX 400 manufactured by JEOL Ltd.

Synthesis Example 38

Synthesis of Resin P4-4

A 1.0 L-volume separable flask with a Dean-Stark device was purged with nitrogen and thereafter, in the separable flask, 60.6 g (0.550 mol) of resorcin, 84.8 g (0.500 mol) of 2,6-bis(hydroxymethyl)-p-cresol, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

After the completion of reaction, the reaction vessel was cooled in the atmosphere, and 400 g of PGME was separately added thereto and stirred. The resulting diluted reaction solution was added dropwise to 8 L of water with high-speed stirring to disperse and precipitate a resin, and the resin was recovered, appropriately washed with water, dewatered and then vacuum-dried to obtain Resin (P4-4) at a yield of 71%. The weight average molecular weight by GPC of Resin (P4-4) synthesized was 38,600 in terms of polystyrene.

Synthesis Example 39

Synthesis of Resin P4-5

A 1.0 L-volume separable flask with a Dean-Stark device was purged with nitrogen and thereafter, in the separable flask, 59.0 g (0.536 mol) of resorcin, 3.81 g (0.02 mol) of p-toluenesulfonic acid, and 150 g of propylene glycol monomethyl ether (PGME) were mixed and stirred at 40° C. to dissolve solids.

Subsequently, 40.6 g (purity content: 0.50 mol) of a formaldehyde solution (37%) was added dropwise over 1 hour to the separable flask by using a dropping funnel. After the dropwise addition, the temperature was raised to 60° C., and the system was further stirred for 2 hours.

After the completion of reaction, the reaction vessel was cooled in the atmosphere, and 400 g of PGME was separately added thereto and stirred. The resulting diluted reaction solution was added dropwise to 8 L of water with high-speed stirring to disperse and precipitate a resin, and the resin was recovered, appropriately washed with water, dewatered and then vacuum-dried to obtain Resin (P4-5) at a yield of 82%. The weight average molecular weight by GPC of Resin (P4-5) synthesized was 27,900 in terms of polystyrene.

Synthesis Example 40

Synthesis of Resin P4-6

A 1.0 L-volume separable flask with a Dean-Stark device was purged with nitrogen and thereafter, in the separable flask, 84.1 g (0.667 mol) of pyrogallol, 121.2 g (0.500 mol) of BMMB, 3.81 g (0.02 mol) of p-toluenesulfonic acid, and 150 g of diglyme (DMDG) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

After the completion of reaction, the reaction vessel was cooled in the atmosphere, and 300 g of PGME was separately added thereto and stirred. The resulting diluted reaction solution was added dropwise to 8 L of water with high-speed stirring to disperse and precipitate a resin, and the resin was recovered, appropriately washed with water, dewatered and then vacuum-dried to obtain Resin (P4-6) at a yield of 79%. The weight average molecular weight by GPC of Resin (P4-6) synthesized was 12,800 in terms of polystyrene.

Synthesis Example 41

Synthesis of Resin P4-7

A 1.0 L-volume separable flask with a Dean-Stark device was purged with nitrogen and thereafter, in the separable flask, 67.3 g (0.533 mol) of pyrogallol, 84.1 g (0.500 mol) of 2,6-bis(hydroxymethyl)p-cresol, 3.81 g (0.02 mol) of p-toluenesulfonic acid, and 150 g of propylene glycol monomethyl ether (PGME) were mixed and stirred at 50° C. to dissolve solids.

The mixed solution dissolved was heated to 120° C. in an oil bath, and generation of methanol was confirmed by the reaction solution. After stirring the reaction solution for 3 hours while maintaining 120° C., the solution was cooled to room temperature.

After the completion of reaction, the reaction vessel was cooled in the atmosphere, and 400 g of PGME was separately added thereto and stirred. The resulting diluted reaction solution was added dropwise to 8 L of water with high-speed stirring to disperse and precipitate a resin, and the resin was recovered, appropriately washed with water, dewatered and then vacuum-dried to obtain Resin (P4-7) at a yield of 83%. The weight average molecular weight by GPC of Resin (P4-7) synthesized was 45,700 in terms of polystyrene.

Synthesis Example 42

Synthesis of Resin P4-8

A 1.0 L-volume separable flask with a Dean-Stark device was purged with nitrogen and thereafter, in the separable flask, 114.1 g (0.750 mol) of methyl 2-hydroxybenzoate, 121.2 g (0.500 mol) of BMMB, 3.81 g (0.02 mol) of p-toluenesulfonic acid, and 150 g of diglyme (DMDG) were mixed and stirred at 50° C. to dissolve solids.

The mixed solution dissolved was heated to 150° C. in an oil bath, and generation of methanol was confirmed by the reaction solution. After stirring the reaction solution for 3 hours while maintaining 150° C., the solution was cooled to room temperature.

After the completion of reaction, the reaction vessel was cooled in the atmosphere, and 300 g of PGME was separately added thereto and stirred. The resulting diluted reaction solution was added dropwise to 8 L of water with high-speed stirring to disperse and precipitate a resin, and the resin was recovered, appropriately washed with water, dewatered and then vacuum-dried to obtain Resin (P4-8) at a yield of 76%. The weight average molecular weight by GPC of Resin (P4-8) synthesized was 6,600 in terms of polystyrene.

Synthesis Example 43

Synthesis of Resin P4-9

A 1.0 L-volume separable flask with a Dean-Stark device was purged with nitrogen and thereafter, in the separable flask, 91.3 g (0.600 mol) of methyl 2-hydroxybenzoate, 84.1 g (0.500 mol) of 2,6-bis(hydroxymethyl)-p-cresol, 3.81 g (0.02 mol) of p-toluenesulfonic acid, and 150 g of diglyme (DMDG) were mixed and stirred at 50° C. to dissolve solids.

The mixed solution dissolved was heated to 130° C. in an oil bath, and generation of methanol was confirmed by the reaction solution. After stirring the reaction solution for 3 hours while maintaining 130° C., the solution was cooled to room temperature.

After the completion of reaction, the reaction vessel was cooled in the atmosphere, and 300 g of PGME was separately added thereto and stirred. The resulting diluted reaction solution was added dropwise to 8 L of water with high-speed stirring to disperse and precipitate a resin, and the resin was recovered, appropriately washed with water, dewatered and then vacuum-dried to obtain Resin (P4-9) at a yield of 76%. The weight average molecular weight by GPC of Resin (P4-9) synthesized was 12,100 in terms of polystyrene.

<Evaluation of Alkali Solubility>

Polymers P-1 to P-12 were prepared using Resins P4-1 to P4-9 obtained in Synthesis Examples 35 to 42, EP-4080G (P4-10), and/or MEH-7851-SS (P4-11) individually or as a resin mixture at the mixing ratio shown in Table 7 and evaluated for the alkali solubility by the above-described method. The results are shown in Table 7 below.

TABLE 7

| Polymer | P-1 | P-2 | P-3 | P-4 | P-5 | P-6 | P-7 | P-8 | P-9 | P-10 | P-11 | P-12 |
|---|---|---|---|---|---|---|---|---|---|---|---|---|
| P4-1 | 100 | | | | | | | | | | | |
| P4-2 | | 100 | | | | | | | | | | |
| P4-3 | | | 100 | 50 | | 80 | 60 | 40 | 60 | | | |
| P4-4 | | | | | 50 | 20 | 40 | 60 | | | | |
| P4-5 | | | | | | | | | 40 | | | |
| P4-6 | | | | | | | | | | 60 | | |
| P4-7 | | | | | | | | | | | 50 | |
| P4-8 | | | | | | | | | | | | 60 |
| P4-9 | | | | | | | | | | | | 40 |
| P4-10 | | | | | | | | | | 40 | | |
| P4-11 | | | | | | | | | | | 50 | |
| Alkali dissolution rate [*$10^{-2}$ um/sec] | 1.2 | 1.6 | 1.3 | 3.0 | 4.9 | 1.6 | 2.3 | 2.7 | 4.1 | 3.9 | 5.8 | 1.4 |
| Evaluation of alkali solubility | good | good | good | good | good | good | good | good | good | good | good | good |

Preparation and Evaluation of Photosensitive Resin Composition

Example 68

100 Parts by mass of Resin (P4-1) obtained in Synthesis Example 35, 5 parts by mass of Photoacid Generator (B-2) and 15 parts by mass of Crosslinking Agent (C-1) were dissolved in 114 parts by mass of γ-butyrolactone (GBL), and the solution was filtered through a 0.1 μm filter to prepare a negative-type photosensitive resin composition. The resin composition was evaluated for the residual film ration during heat curing, cured relief pattern profile and tensile elongation. The evaluation results are shown in Table 8.

Example 69

100 Parts by mass of Resin (P4-2) obtained in Synthesis Example 36, 11 parts by mass of Photoacid Generator (B-1) and 10 parts by mass of Crosslinking Agent (C-1) were dissolved in 114 parts by mass of γ-butyrolactone (GBL), and the solution was filtered through a 0.1 μm filter to prepare a positive-type photosensitive resin composition. The resin composition was evaluated for the residual film ration during heat curing, cured relief pattern profile and tensile elongation. The evaluation results are shown in Table 8.

Example 70

Preparation and evaluation were carried out in the same manner as in Example 68, except that 100 parts by mass of Resin (P4-1) was replaced by 100 parts by mass of Resin (P4-3) in Example 68. The evaluation results are shown in Table 8.

Examples 71 and 72

Negative-type photosensitive resin compositions were prepared by blending Resins P4-3, P4-4, P4-10 and P4-11, Photoacid Generator (B-2) and Crosslinking Agent (C-1) at the blending ratio shown in Table 8, dissolving these components in 114 parts by mass of GBL, and filtering the solution through a 0.1 μm filter and evaluated for the cured relief pattern profile and tensile elongation. The evaluation results are shown in Table 8.

Examples 73 to 79

Positive-type photosensitive resin compositions were prepared by blending Resins P4-3 to P4-11, Photoacid Generator (B-1) and Crosslinking Agent (C-1) at the blending ratio shown in Table 8, dissolving these components in 114 parts by mass of GBL, and filtering the solution through a 0.1 μm filter and evaluated for the cured relief pattern profile and tensile elongation. The evaluation results are shown in Table 8.

Comparative Example 14

Preparation and evaluation were carried out in the same manner as in Example 69, except that 100 parts by mass of Resin (P4-2) was replaced by 50 parts by mass of Resin (P4-10) and 50 parts by mass of Resin (P4-11) in Example 69. With respect to the cured relief pattern profile, the pattern was buried, and the evaluation was "bad". The evaluation results are shown in Table 8.

TABLE 8

| | Example | | | | | | | | | | | | Comparative |
|---|---|---|---|---|---|---|---|---|---|---|---|---|---|
| | 68 | 69 | 70 | 71 | 72 | 73 | 74 | 75 | 76 | 77 | 78 | 79 | Example 14 |
| P4-1 | 100 | | | | | | | | | | | | |
| P4-2 | | 100 | | | | | | | | | | | |
| P4-3 | | | 100 | 50 | | 80 | 60 | 40 | 60 | | | | |
| P4-4 | | | | | 50 | 20 | 40 | 60 | | | | | |
| P4-5 | | | | | | | | | 40 | | | | |
| P4-6 | | | | | | | | | | 60 | | | |
| P4-7 | | | | | | | | | | | 50 | | |
| P4-8 | | | | | | | | | | | | 60 | |
| P4-9 | | | | | | | | | | | | 40 | |
| P4-10 | | | | 50 | | | | | | 40 | | | 50 |
| P4-11 | | | | | 50 | | | | | | 50 | | 50 |
| Photoacid Generator B-1 | | 11 | | | | 11 | 11 | 11 | 11 | 11 | 11 | 11 | 11 |
| Photoacid Generator B-2 | 5 | | 5 | 5 | 5 | | | | | | | | |
| Crosslinking Agent C-1 | 15 | 10 | 15 | 15 | 15 | 10 | 10 | 10 | 10 | 10 | 10 | 10 | 10 |
| Cured relief pattern profile | good | good | good | good | good | good | good | good | good | good | good | good | bad |
| Elongation [%] | 11 | 19 | 26 | 15 | 13 | 31 | 24 | 17 | 21 | 25 | 19 | 14 | 13 |
| Curing temperature | 225 | 225 | 225 | 225 | 225 | 225 | 225 | 225 | 225 | 225 | 225 | 225 | 225 |

It is understood from Table 8 that the photosensitive resin composition of the present invention is excellent in tensile elongation of the cured film, enables pattern formation with a thick film, exhibits a high residual film ratio during curing, and gives a resin film ensuring a good cured relief pattern profile.

With respect to the photosensitive resin compositions of Examples 2, 26, 44, 45, 51 and 75 and Comparative Examples 1, 3, 4 and 14, the curing temperature was set to 200° C., and the tensile elongation measurement, glass transition temperature measurement, residual stress measurement and cross-sectional angle measurement were carried out by the above-described methods. The evaluation results are shown in Table 9.

TABLE 9

| | Example | | | | | | Comparative Example | | | |
|---|---|---|---|---|---|---|---|---|---|---|
| | 2 | 26 | 44 | 45 | 51 | 75 | 1 | 3 | 4 | 14 |
| Elongation [%] | 25 | 32 | 22 | 22 | 25 | 21 | 2 | 5 | 21 | 11 |
| Glass transition temperature [° C.] | 221 | 212 | 215 | 217 | 214 | 202 | 170 | 81 | 160 | 197 |
| Residual stress [MPa] | 17 | 12 | 14 | 15 | 14 | 14 | 10 | 4 | 22 | 18 |
| Cross-sectional angle [°] | 48 | 55 | 74 | 84 | 51 | 41 | 18 | could not be measured | 12 | 15 |
| Curing temperature [° C.] | 200 | 200 | 200 | 200 | 200 | 200 | 200 | 200 | 200 | 200 |

INDUSTRIAL APPLICABILITY

The photosensitive resin composition of the present invention can be suitably used as a surface protective film of a semiconductor device, a display device and a light-emitting device, an interlayer insulating film, an insulating film for rewiring, a protective film for a flip-chip device, a protective film of a device having a bump structure, an interlayer insulating film of a multilayer circuit, a cover coat of a flexible copper clad laminate, a solder resist film, a liquid crystal alignment film, etc.

The invention claimed is:
1. A photosensitive resin composition comprising:
(A-1) a resin containing a structure represented by following formula (1) and
(B) a photoacid generator:

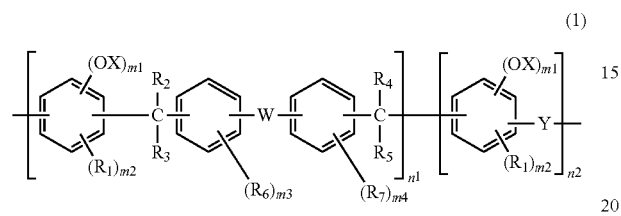

(1)

wherein in formula (1),
each X is independently a monovalent group selected from the group consisting of a hydrogen atom, an alkoxycarbonyl group having a carbon number of 2 to 20, an alkoxycarbonylmethyl group having a carbon number of 2 to 20, an alkoxyalkyl group having a carbon number of 2 to 20, a silyl group substituted with at least one alkyl group having a carbon number of 1 to 10, a tetrahydropyranyl group, and a tetrahydrofuranyl group;
each $m_1$ is independently an integer of 1 to 3,
each $m_2$ is independently an integer of 0 to 2, and $2 \leq (m_1+m_2) \leq 4$;
each of $m_3$ and $m_4$ is independently an integer of 0 to 4;
each of $n_1$ and $n_2$ is independently an integer of 1 to 500, and
$n_1/(n_1+n_2)$ is from 0.35 to 0.95;
each $R_1$ is independently a monovalent group selected from the group consisting of a hydrocarbon group having a carbon number of 1 to 10, an alkoxy group having a carbon number of 1 to 10, a nitro group, a cyano group, and a group represented by following formula (5) or (6);
when $m_2$ is 2, the plurality of $R_1$ may be the same as or different from each other;
each of $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom;
each of $R_6$ and $R_7$ is independently a halogen atom, a hydroxyl group or a monovalent organic group;
when $m_3$ is an integer of 2 to 4, the plurality of $R_6$ may be the same as or different from each other; when $m_4$ is an integer of 2 to 4, the plurality of $R_7$ may be the same as or different from each other;
Y is a divalent organic group represented by following formula (3) or (4);
W is a divalent group selected from the group consisting of a single bond, a chain aliphatic group having a carbon number of 1 to 10, a chain aliphatic group having a carbon number of 1 to 10, in which some hydrogen atoms or all hydrogen atoms are substituted with a fluorine atom, an alicyclic group having a carbon number of 3 to 20, an alicyclic group having a carbon number of 3 to 20, in which some hydrogen atoms or all hydrogen atoms are substituted with a fluorine atom, an alkylene oxide group having from 1 to 20 repeating units, and groups represented by following formula (2):

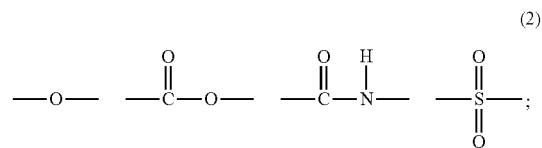

(2)

and the polymer structure may be a random structure or a block structure;

$$—CR_8R_9—$$ (3)

wherein in formula (3),
each of $R_8$ and $R_9$ is independently a hydrogen atom, a monovalent organic group having a carbon number of 1 to 11, or a group containing a carboxyl group, a sulfonic acid group or a phenolic hydroxyl group;

(4)

wherein in formula (4),
each of $R_{11}$ to $R_{14}$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom; $m_5$ is an integer of 1 to 4;
when $m_5$ is 1, $R_{10}$ is a hydroxyl group, a carboxyl group or a sulfonic acid group, and when $m_5$ is an integer of 2 to 4, at least one $R_{10}$ is a hydroxyl group and the remaining $R_{10}$ are a halogen atom, a hydroxyl group, a monovalent organic group, a carboxyl group or a sulfonic acid group; and all $R_{10}$ may be the same or different;

(5)

wherein in formula (5),
$R_{15}$ is a monovalent group selected from the group consisting of a hydroxyl group, an aliphatic group having a carbon number of 1 to 12, an alicyclic group having a carbon number of 3 to 12, an aromatic group having a carbon number of 6 to 18, —NH$_2$, and groups represented by —NH—R$_{19}$, —N(R$_{19}$)$_2$ and —O—R$_{19}$ wherein R$_{19}$ is a monovalent group selected from an aliphatic group having a carbon number of 1 to 12, an alicyclic group having a carbon number of 3 to 12, and an aromatic group having a carbon number of 6 to 18;

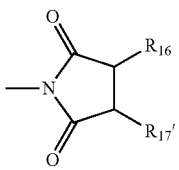

(6)

wherein in formula (6), each of $R_{16}$ and $R_{17}'$ is independently a monovalent group selected from the group consisting of a hydrogen atom, an aliphatic group having a carbon number of 1 to 12, an alicyclic group having a carbon number of 3 to 12, and an aromatic group having a carbon number of 6 to 18, and $R_{16}$ and $R_{17}'$ may form a ring.

2. The photosensitive resin composition according to claim 1, wherein in formula (1), all X are a hydrogen atom.

3. The photosensitive resin composition according to claim 1, wherein Y in formula (1) is a resin containing a structure represented by following formula (11) or (12):

 (11)

wherein $R_8$ is a hydrogen atom or a monovalent organic group having a carbon number of 1 to 11;

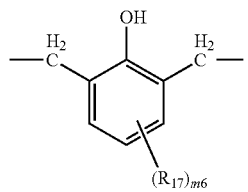

(12)

wherein in formula (12),
$R_{17}$ is a hydrocarbon group having a carbon number of 1 to 10 or an alkoxy group having a carbon number of 1 to 10,
$m_6$ is an integer of 0 to 3, and
when $m_6$ is 2 or 3, the plurality of $R_{17}$ may be the same or different.

4. The photosensitive resin composition according to claim 1, wherein
$R_1$ in formula (1) is at least one member selected from the group consisting of a hydrocarbon group having a carbon number of 1 to 10, an alkoxy group having a carbon number of 1 to 10, and a group represented by formula (5), W in formula (1) is a single bond, and $R_{15}$ in formula (5) is a monovalent group selected from the group consisting of a hydroxyl group, —$NH_2$, and groups represented by —NH—$R_{19}$, —N($R_{19}$)$_2$ and —O—$R_{19}$ wherein $R_{19}$ is a monovalent group selected from an aliphatic group having a carbon number of 1 to 12, an alicyclic group having a carbon number of 3 to 12, and an aromatic group having a carbon number of 6 to 18.

5. The photosensitive resin composition according to claim 1, wherein resin (A-1) is a resin containing a structure represented by following formula (13):

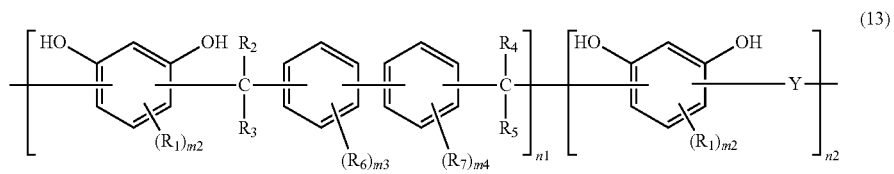

(13)

wherein in formula (13),
each $m_2$ is independently an integer of 0 to 2;
each of $m_3$ and $m_4$ is independently an integer of 0 to 4;
each of $n_1$ and $n_2$ is independently an integer of 1 to 500, and $n_1/(n_1+n_2)$ is from 0.35 to 0.8;
each $R_1$ is independently a monovalent group having a carbon number of 1 to 10 selected from a hydrocarbon group and an alkoxy group;
when $m_2$ is 2, the plurality of $R_1$ may be the same as or different from each other;
each of $R_2$ to $R_5$ is independently a hydrogen atom, a monovalent aliphatic group having a carbon number of 1 to 10, or a monovalent aliphatic group having a carbon number of 1 to 10, in which some hydrogen atoms or all hydrogen atoms are substituted with a fluorine atom;
each of $R_6$ and $R_7$ is independently a halogen atom, a hydroxyl group or a monovalent organic group;
when $m_3$ is 2 to 4, the plurality of $R_6$ may be the same as or different from each other; when $m_4$ is an integer of 2 to 4, the plurality of $R_7$ may be the same as or different from each other; Y is a methylene group or a structure represented by following formula (14); and the polymer structure may be a random structure or a block structure:

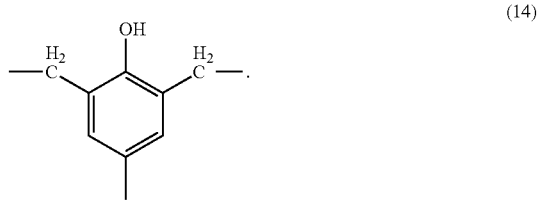

(14)

6. The photosensitive resin composition according to claim 1, wherein said photoacid generator (B) is a compound having a naphthoquinonediazide structure.

7. The photosensitive resin composition according to any one of claim 1, further comprising (C) a crosslinking agent.

8. The photosensitive resin composition according to any one of claim 1, further comprising (D) a thermal acid generator.

9. A method for producing a cured relief pattern, comprising:
- (1) forming, on a substrate, a photosensitive resin layer containing the photosensitive resin composition according to any one of claim 1,
- (2) exposing said photosensitive resin layer to light,
- (3) removing the exposed area or unexposed area with a developer to obtain a relief pattern, and
- (4) heat-treating said relief pattern.

10. A cured relief pattern produced by the method according to claim 9.

11. A semiconductor device comprising a semiconductor element and a cured film provided on the top of said semiconductor element, wherein said cured film is the cured relief pattern according to claim 10.

12. A display device comprising a display element and a cured film provided on the top of said display element, wherein said cured film is the cured relief pattern according to claim 10.

* * * * *